US012700461B2

(12) United States Patent
Hatakeyama et al.

(10) Patent No.: US 12,700,461 B2
(45) Date of Patent: Aug. 4, 2026

(54) SEMICONDUCTOR MEMORY DEVICE

(71) Applicant: Kioxia Corporation, Tokyo (JP)

(72) Inventors: Mina Hatakeyama, Yokohama
Kanagawa (JP); Yuki Inuzuka,
Yokohama Kanagawa (JP)

(73) Assignee: Kioxia Corporation, Tokyo (JP)

( * ) Notice: Subject to any disclaimer, the term of this
patent is extended or adjusted under 35
U.S.C. 154(b) by 48 days.

(21) Appl. No.: 18/829,534

(22) Filed: Sep. 10, 2024

(65) Prior Publication Data

US 2025/0273273 A1 Aug. 28, 2025

(30) Foreign Application Priority Data

Feb. 28, 2024 (JP) ................................ 2024-028620

(51) Int. Cl.
*G11C 16/26* (2006.01)
*G11C 5/06* (2006.01)
*G11C 16/04* (2006.01)
*G11C 16/10* (2006.01)
*G11C 16/34* (2006.01)

(52) U.S. Cl.
CPC .............. *G11C 16/26* (2013.01); *G11C 5/063*
(2013.01); *G11C 16/0483* (2013.01); *G11C*
*16/10* (2013.01); *G11C 16/3436* (2013.01)

(58) Field of Classification Search
CPC ..... G11C 16/26; G11C 5/063; G11C 16/0483;
G11C 16/10; G11C 16/3436
USPC ........................................... 365/185.01, 205
See application file for complete search history.

(56) References Cited

U.S. PATENT DOCUMENTS

| | | | | |
|---|---|---|---|---|
| 5,321,660 A * | 6/1994 | Sani | ................... | G11C 16/0491 |
| | | | | 365/189.11 |
| 6,134,141 A * | 10/2000 | Wong | ................... | G11C 7/1039 |
| | | | | 365/185.25 |
| 6,259,627 B1 * | 7/2001 | Wong | ..................... | G11C 16/26 |
| | | | | 365/185.21 |
| 9,595,311 B2 * | 3/2017 | Takizawa | ........... | G11C 13/0064 |
| 10,515,697 B1 * | 12/2019 | Jain | ..................... | G11C 13/0069 |

(Continued)

FOREIGN PATENT DOCUMENTS

JP 2022-095248 A 6/2022

OTHER PUBLICATIONS

B. Kim et al., "28.2 A High-Performance 1Tb 3b/Cell 3DNAND
Flash with a 194MB/s Write Throughput on over 300 Layers", 2023
IEEE International Solid-State Circuits Conference (ISSCC), 2023,
3 pages.

*Primary Examiner* — Michael T Tran
(74) *Attorney, Agent, or Firm* — Kim & Stewart LLP

(57) ABSTRACT

A semiconductor memory device capable of reducing the
number of executions of sensing is provided. The semicon-
ductor memory device includes memory cells, word lines
that are connected to the memory cells, bit lines that are
connectable to the memory cells, and sense amplifiers con-
nectable to the bit lines. A writing operation on the memory
cell includes a program operation and a verifying operation.
In the verifying operation, the sense amplifier executes a first
sensing operation against a first voltage level and executes,
based on a result of the first sensing operation, either a
second sensing operation against a second voltage level that
is higher than the first voltage level or a third sensing
operation against a third voltage level that is lower than the
first voltage level.

11 Claims, 42 Drawing Sheets

(56)　　　　　References Cited

U.S. PATENT DOCUMENTS

| | | | | |
|---|---|---|---|---|
| 2008/0089134 A1* | 4/2008 | Ito | G11C 16/3468 | |
| | | | | 365/185.29 |
| 2008/0101116 A1 | 5/2008 | Seong | | |
| 2008/0239789 A1* | 10/2008 | Shino | H10B 12/01 | |
| | | | | 365/174 |
| 2008/0239805 A1* | 10/2008 | Shiga | G11C 11/5628 | |
| | | | | 365/185.03 |
| 2009/0219756 A1* | 9/2009 | Schroegmeier | G11C 13/0061 | |
| | | | | 365/163 |
| 2011/0305098 A1* | 12/2011 | Choi | G11C 7/12 | |
| | | | | 365/207 |
| 2013/0058164 A1* | 3/2013 | Moschiano | G11C 11/5642 | |
| | | | | 365/185.09 |
| 2015/0221391 A1* | 8/2015 | Tseng | G11C 16/10 | |
| | | | | 365/185.22 |
| 2017/0154677 A1* | 6/2017 | Lim | G11C 16/3459 | |
| 2020/0090709 A1* | 3/2020 | El-Mansouri | G11C 7/067 | |
| 2021/0090642 A1* | 3/2021 | Nagao | G11C 16/3459 | |
| 2021/0335433 A1* | 10/2021 | Harada | G11C 16/08 | |
| 2022/0180943 A1* | 6/2022 | Cernea | G11C 16/08 | |
| 2022/0189569 A1 | 6/2022 | Kato | | |
| 2022/0301626 A1* | 9/2022 | Liang | G11C 16/0483 | |

* cited by examiner

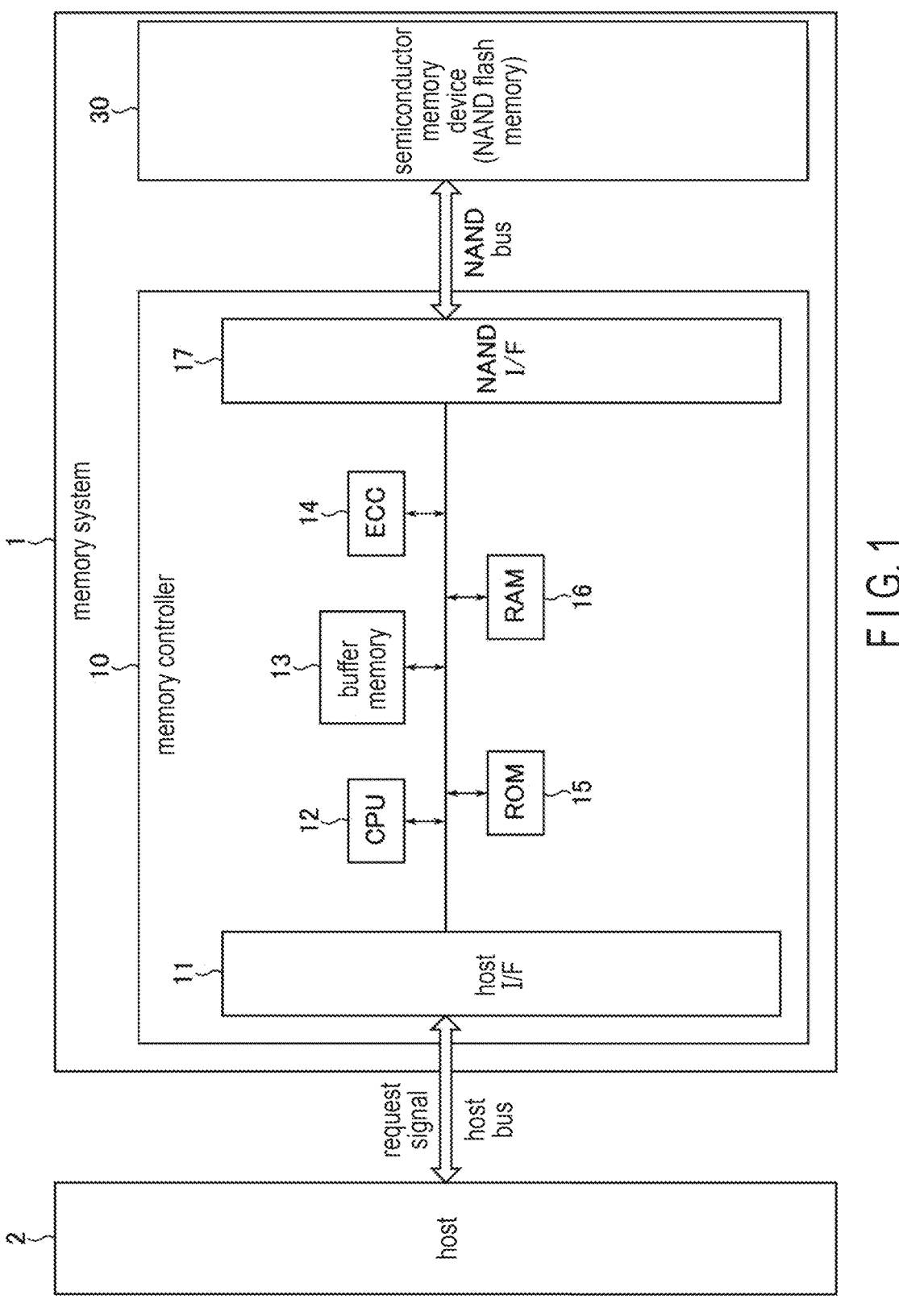
F I G. 1

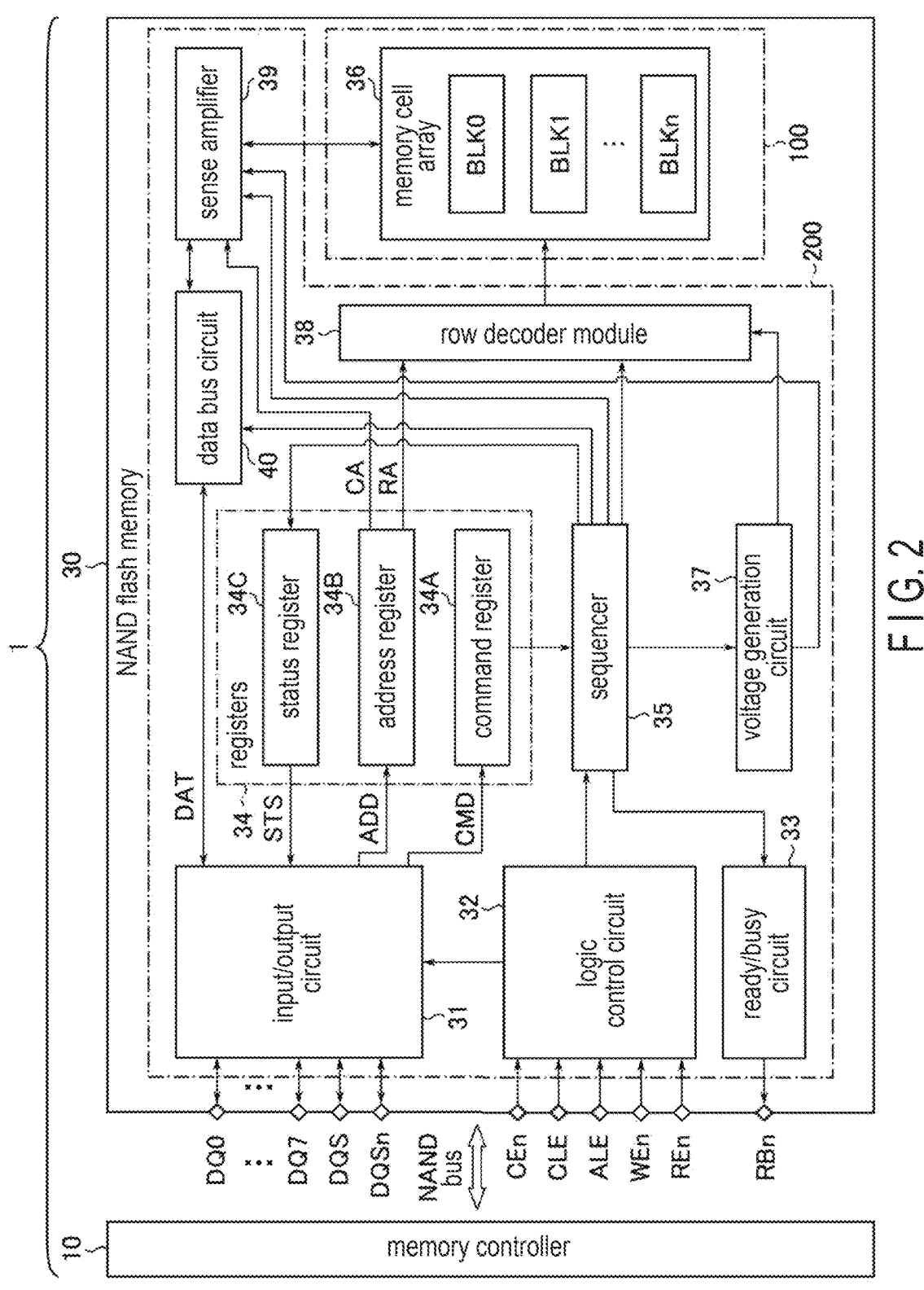
F I G. 2

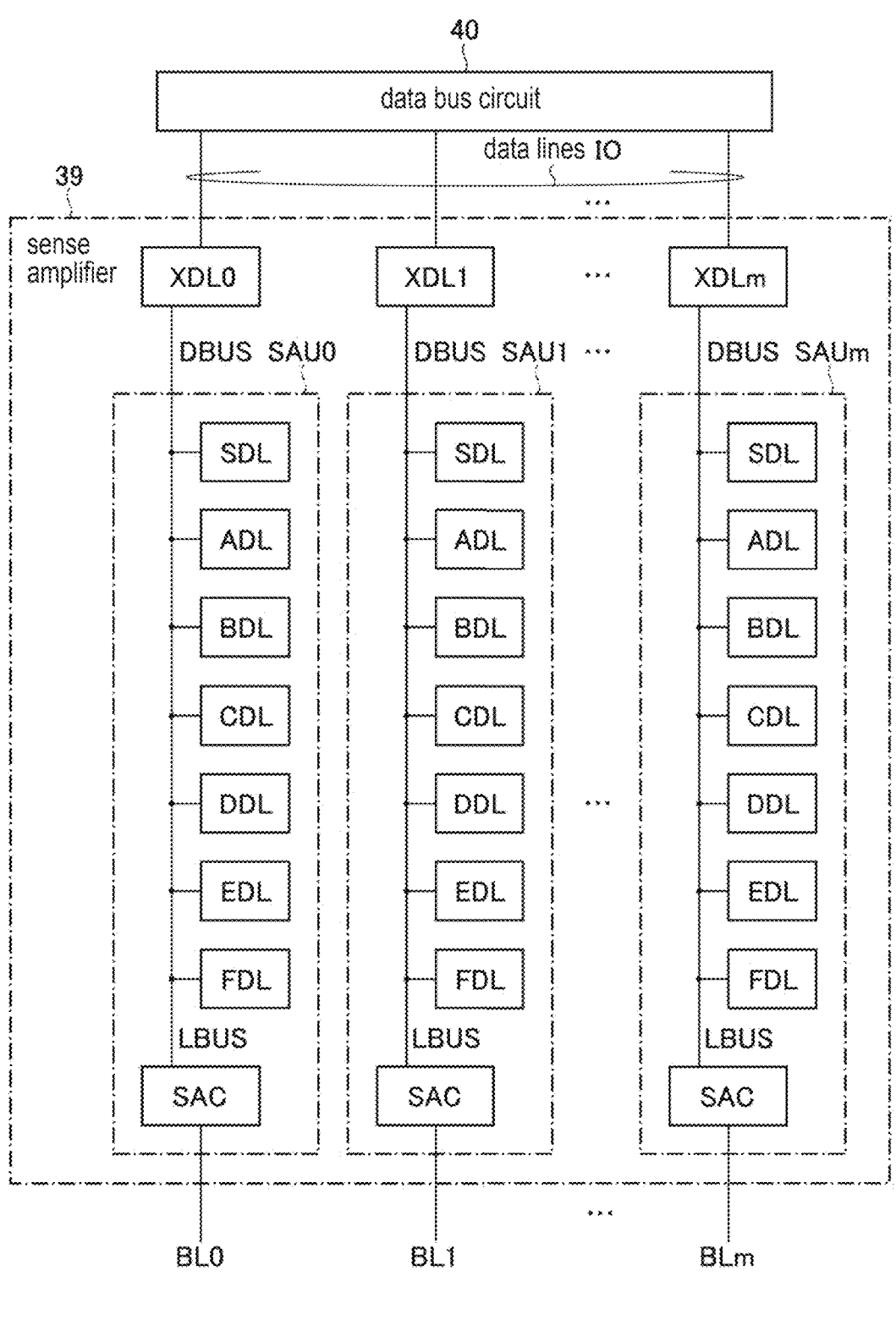
F I G. 10

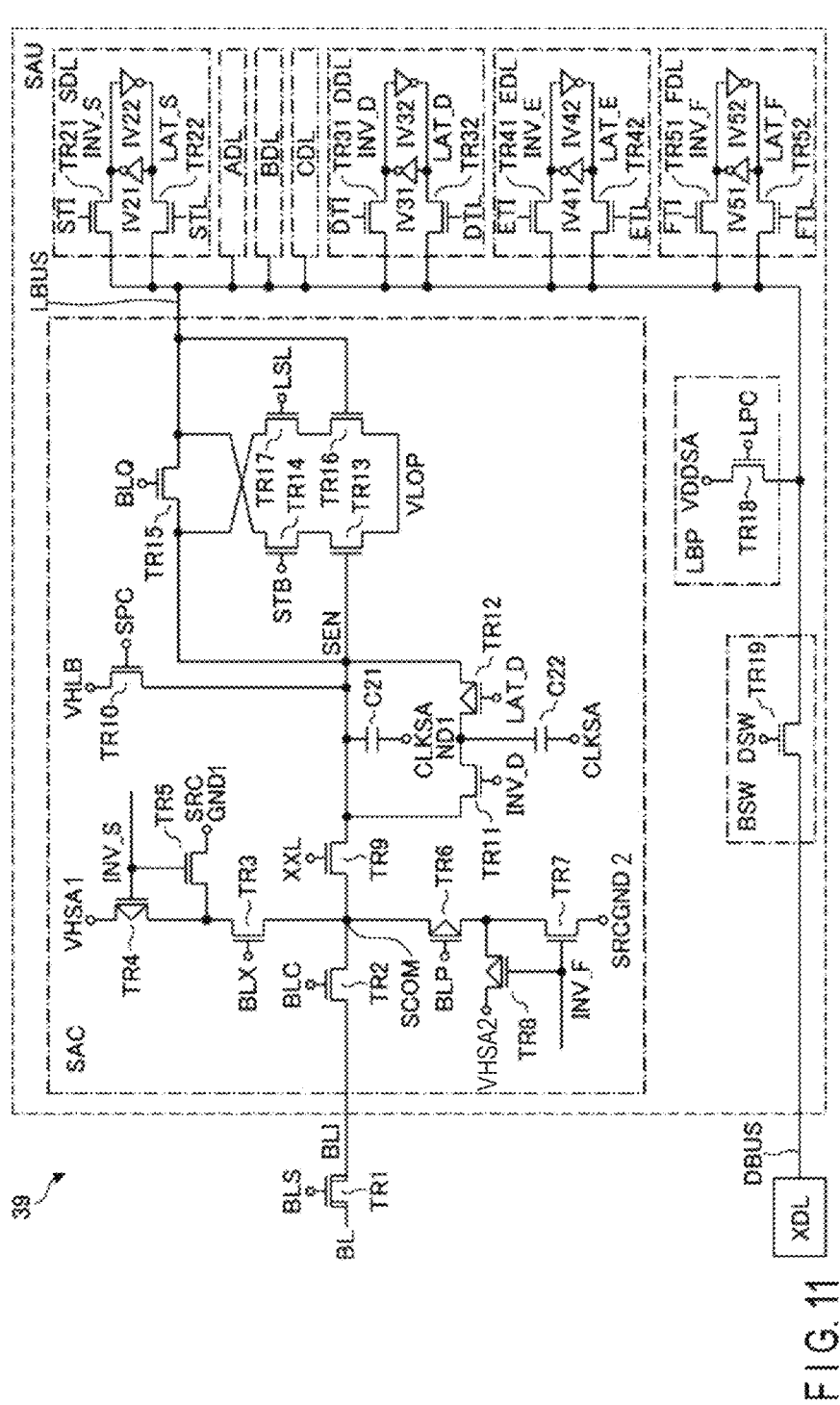
F I G. 11

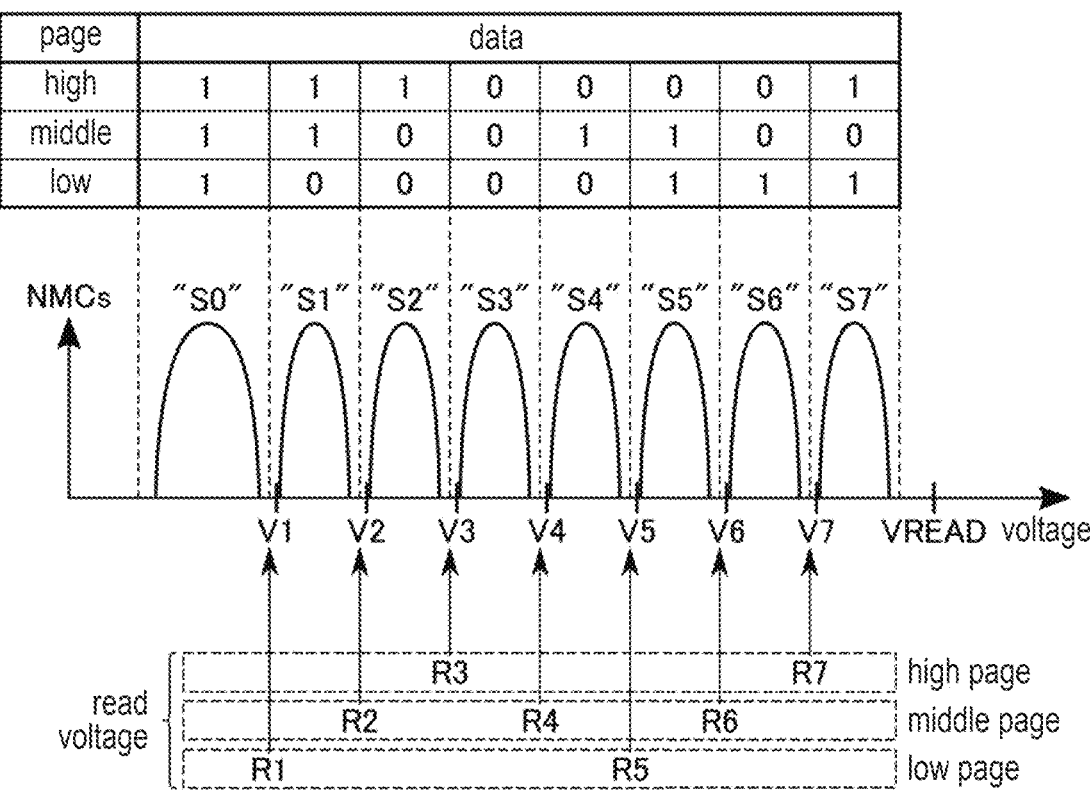
| page | data | | | | | | | |
|---|---|---|---|---|---|---|---|---|
| high | 1 | 1 | 1 | 0 | 0 | 0 | 0 | 1 |
| middle | 1 | 1 | 0 | 0 | 1 | 1 | 0 | 0 |
| low | 1 | 0 | 0 | 0 | 0 | 1 | 1 | 1 |
F I G. 12

| verifying target | loop count | | | | | | | | | | | | | | | | | | |
|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 | 19 |
| state "S1" | O | O | O | O | O | O | | | | | | | | | | | | | |
| state "S2" | | O | O | O | O | O | O | O | | | | | | | | | | | |
| state "S3" | | | | O | O | O | O | O | O | O | | | | | | | | | |
| state "S4" | | | | | | O | O | O | O | O | O | O | | | | | | | |
| state "S5" | | | | | | | | O | O | O | O | O | O | O | | | | | |
| state "S6" | | | | | | | | | | O | O | O | O | O | O | O | | | |
| state "S7" | | | | | | | | | | | | O | O | O | O | O | O | O | O |

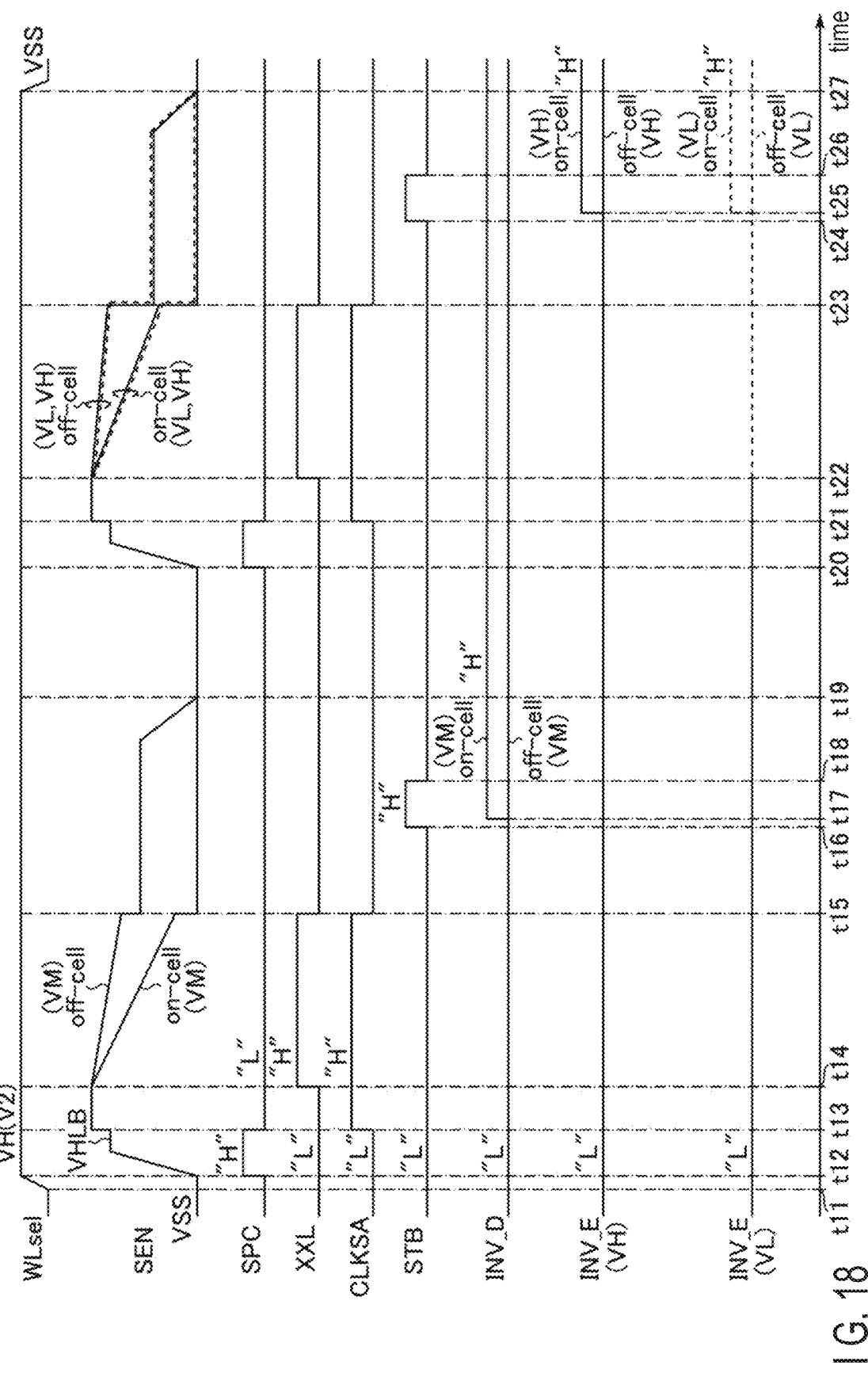
F I G. 18

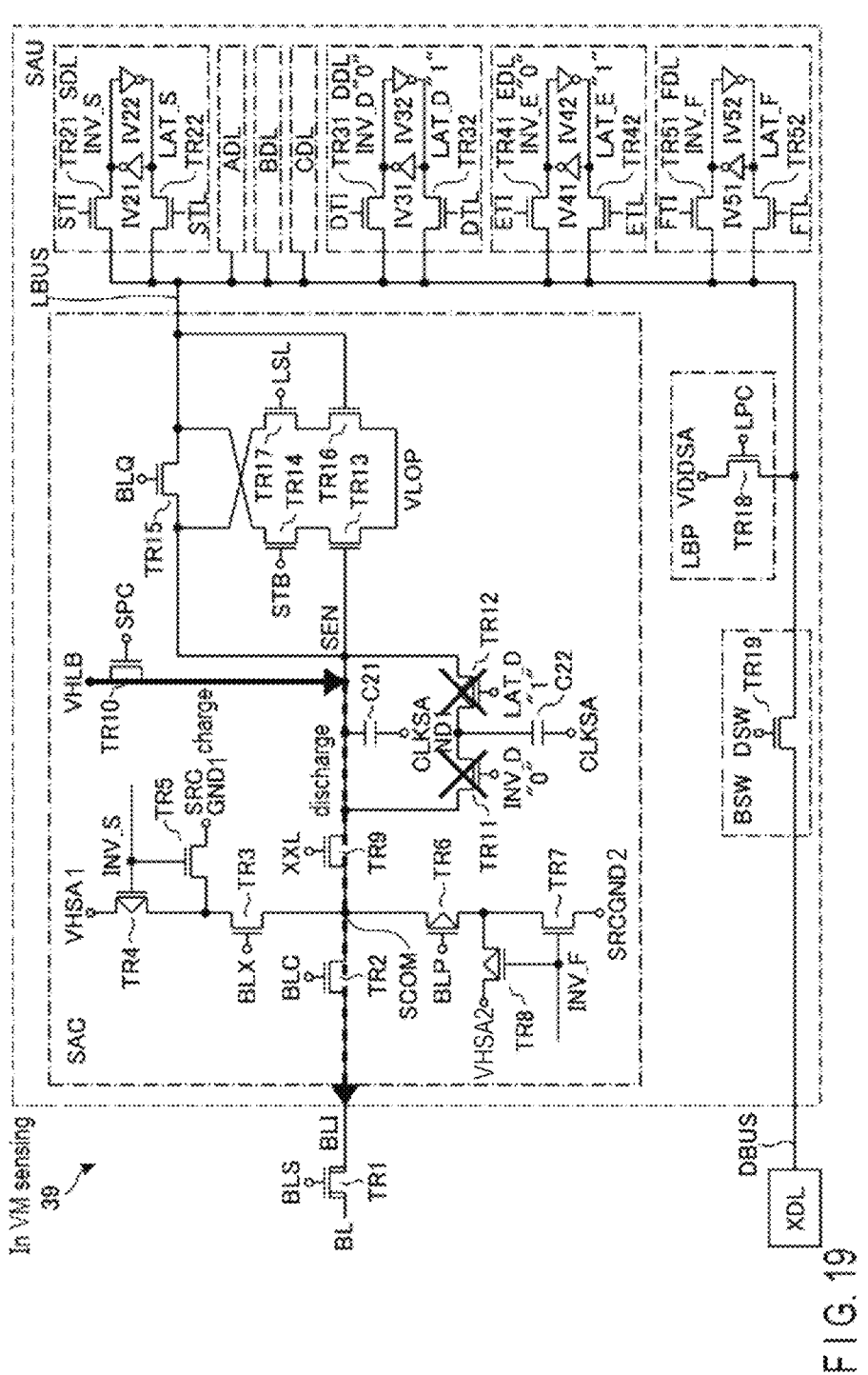
F I G. 19

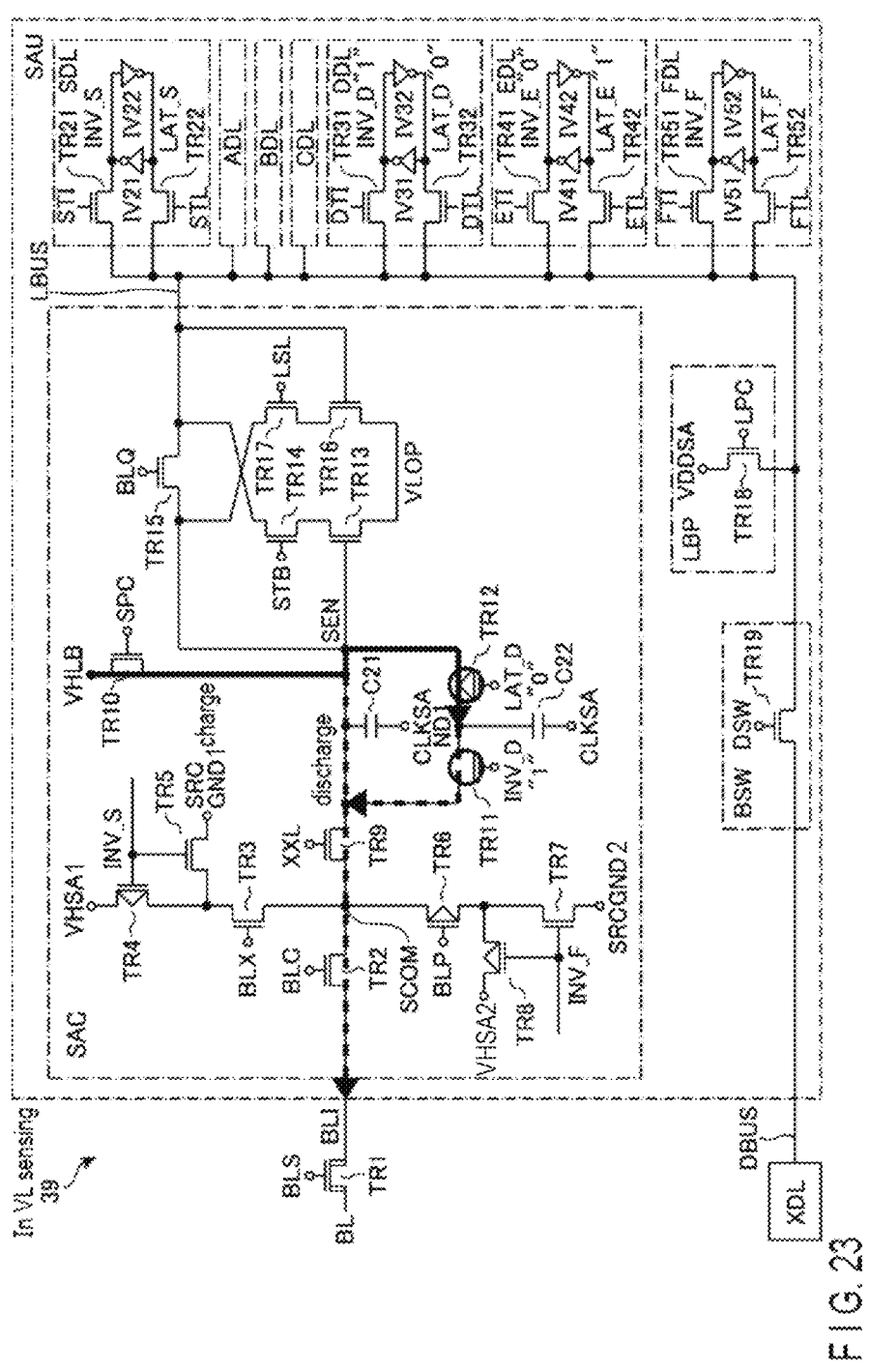
F I G. 23

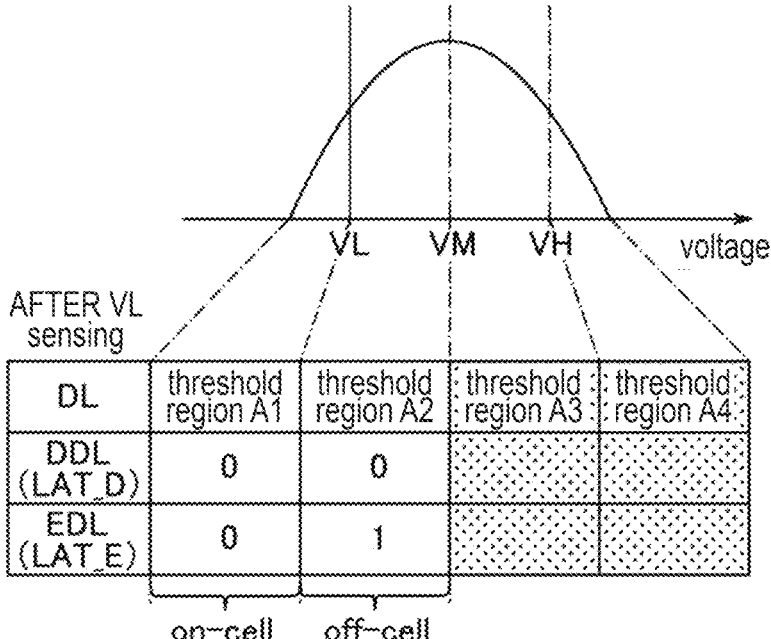
F I G. 24

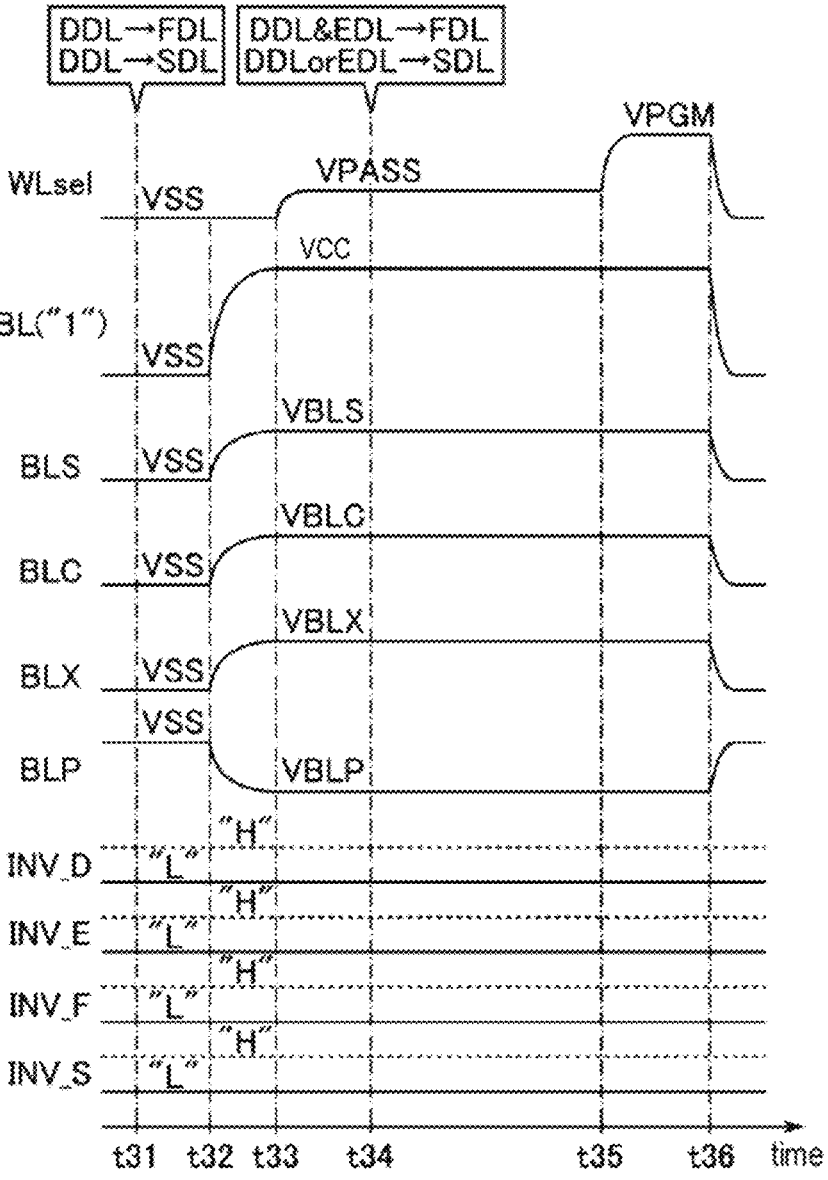
F I G. 25

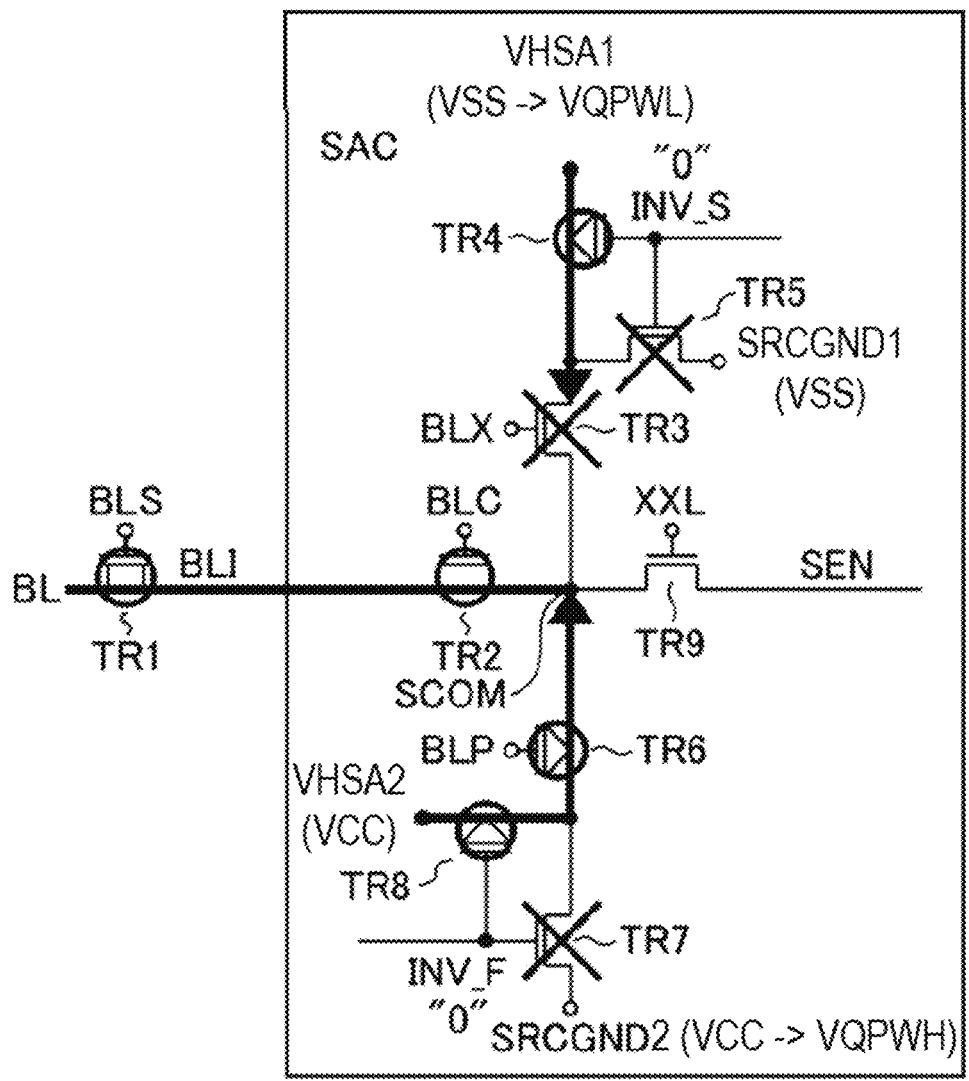
F I G. 26

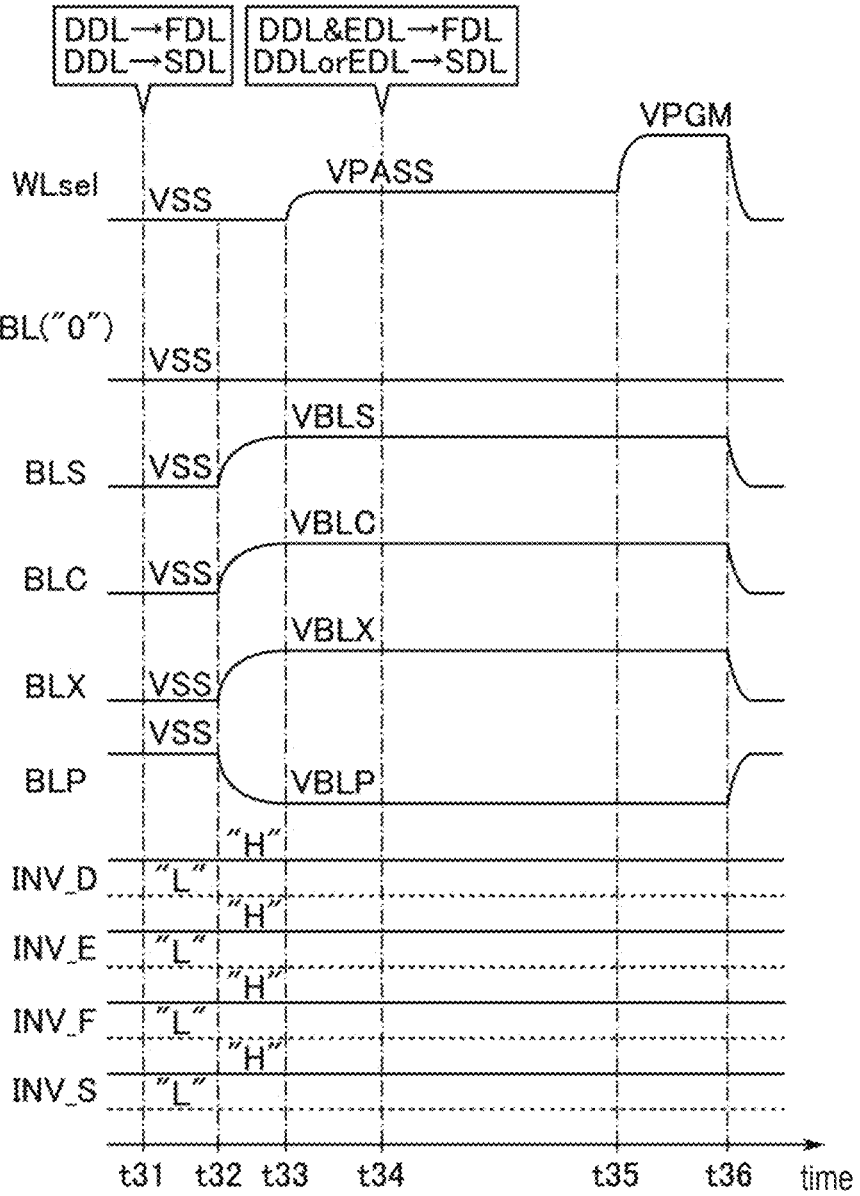
F I G. 27

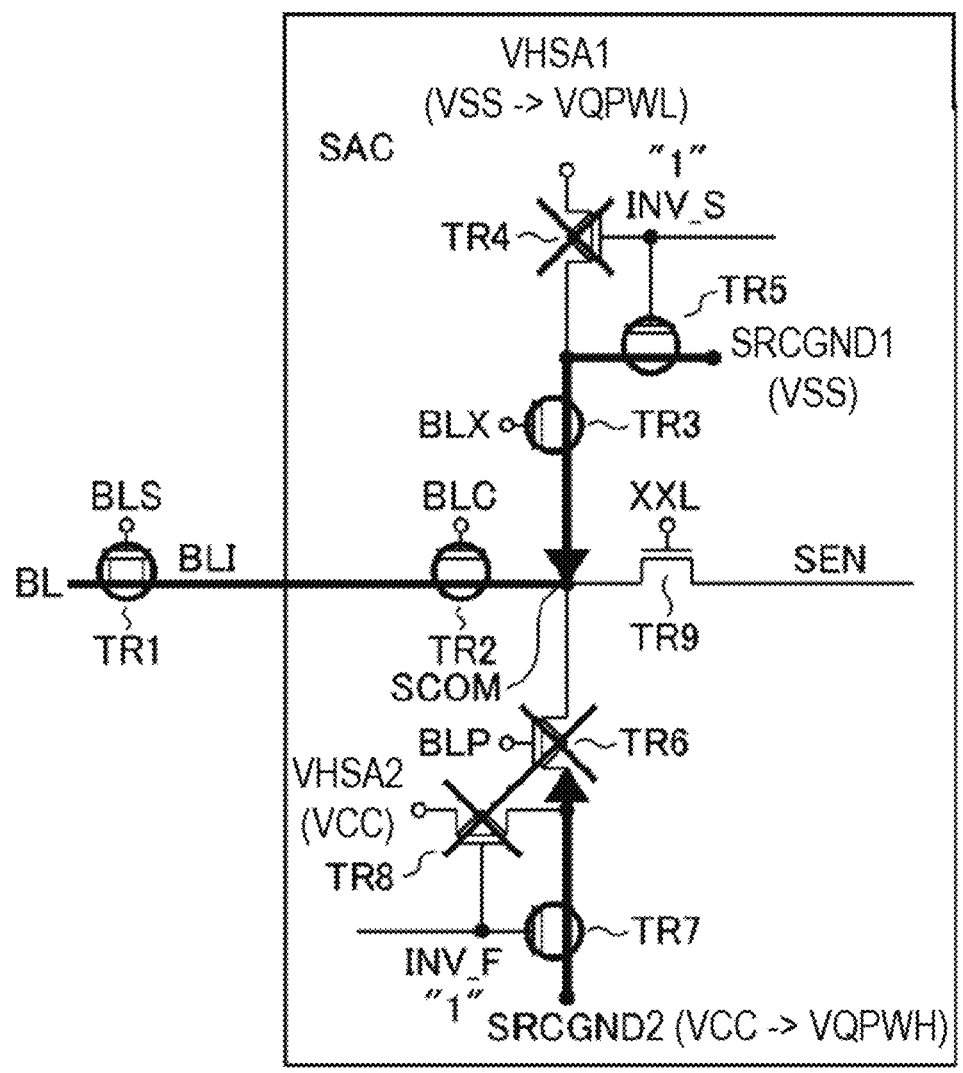
F I G. 28

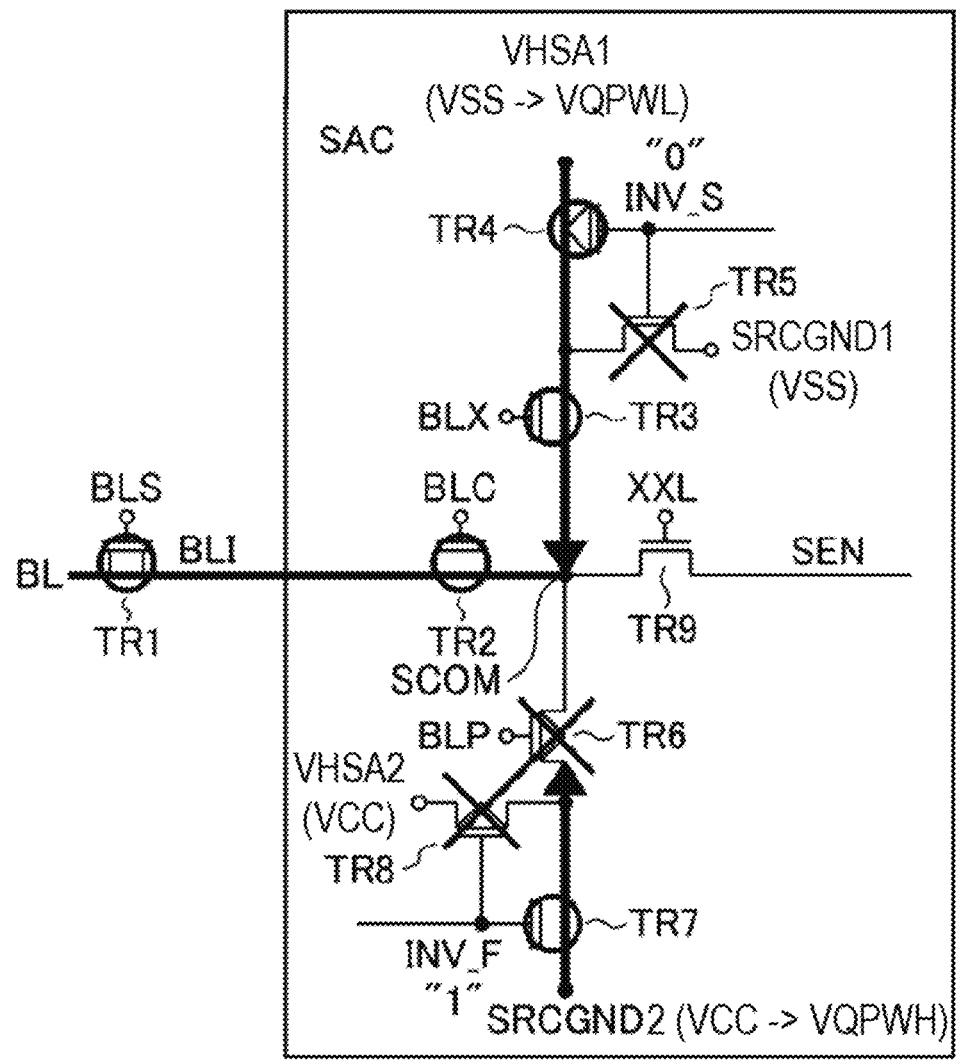
F I G. 30

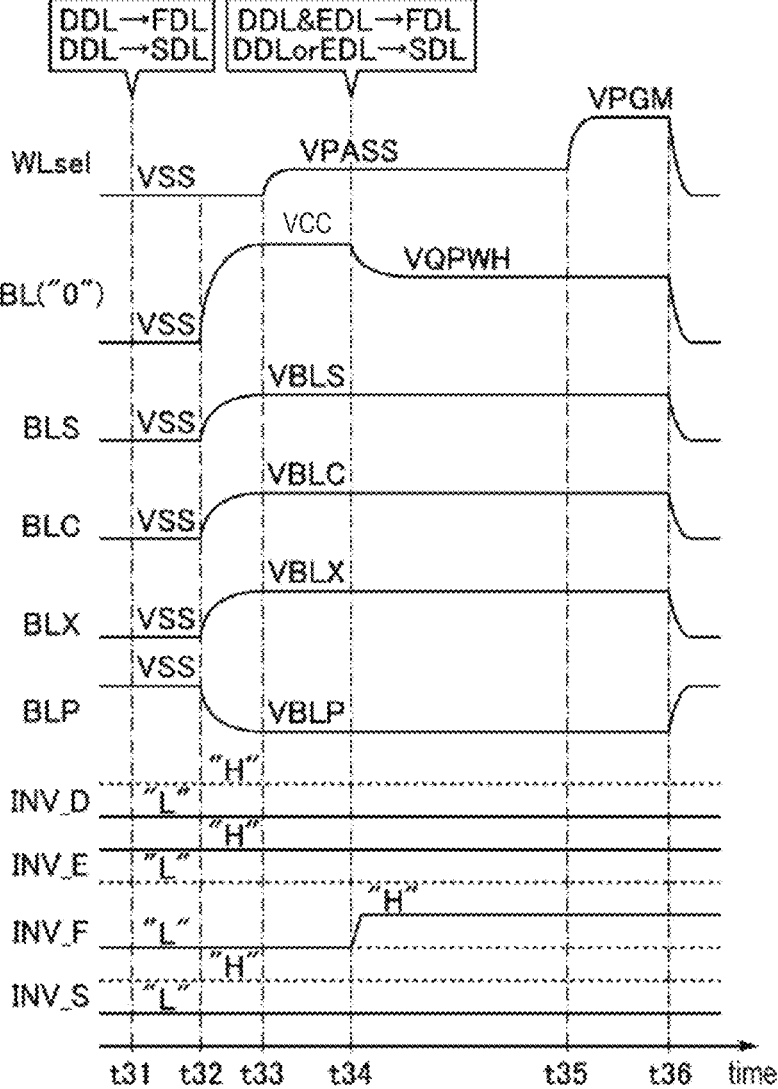
F I G. 31

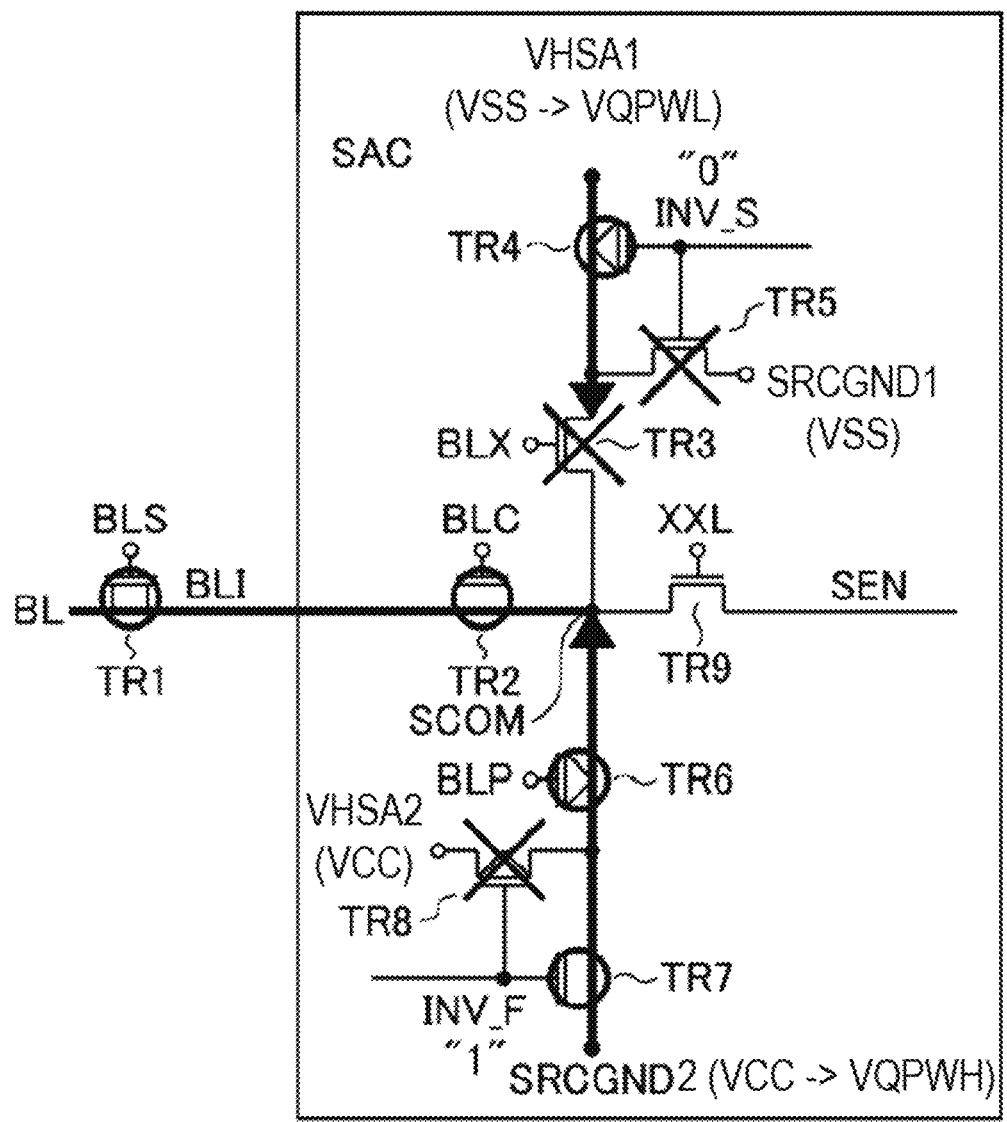
F I G. 32

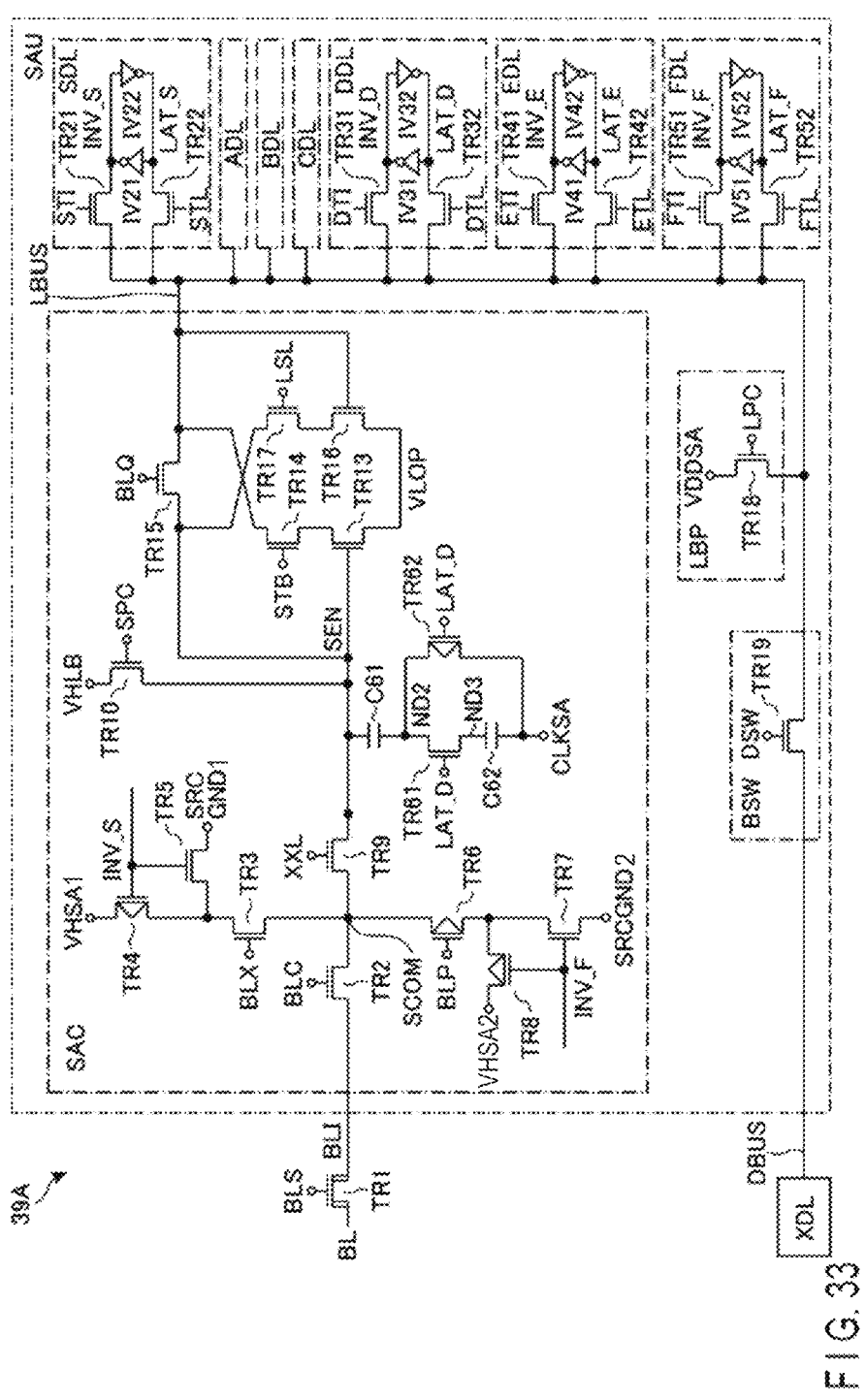
F I G. 33

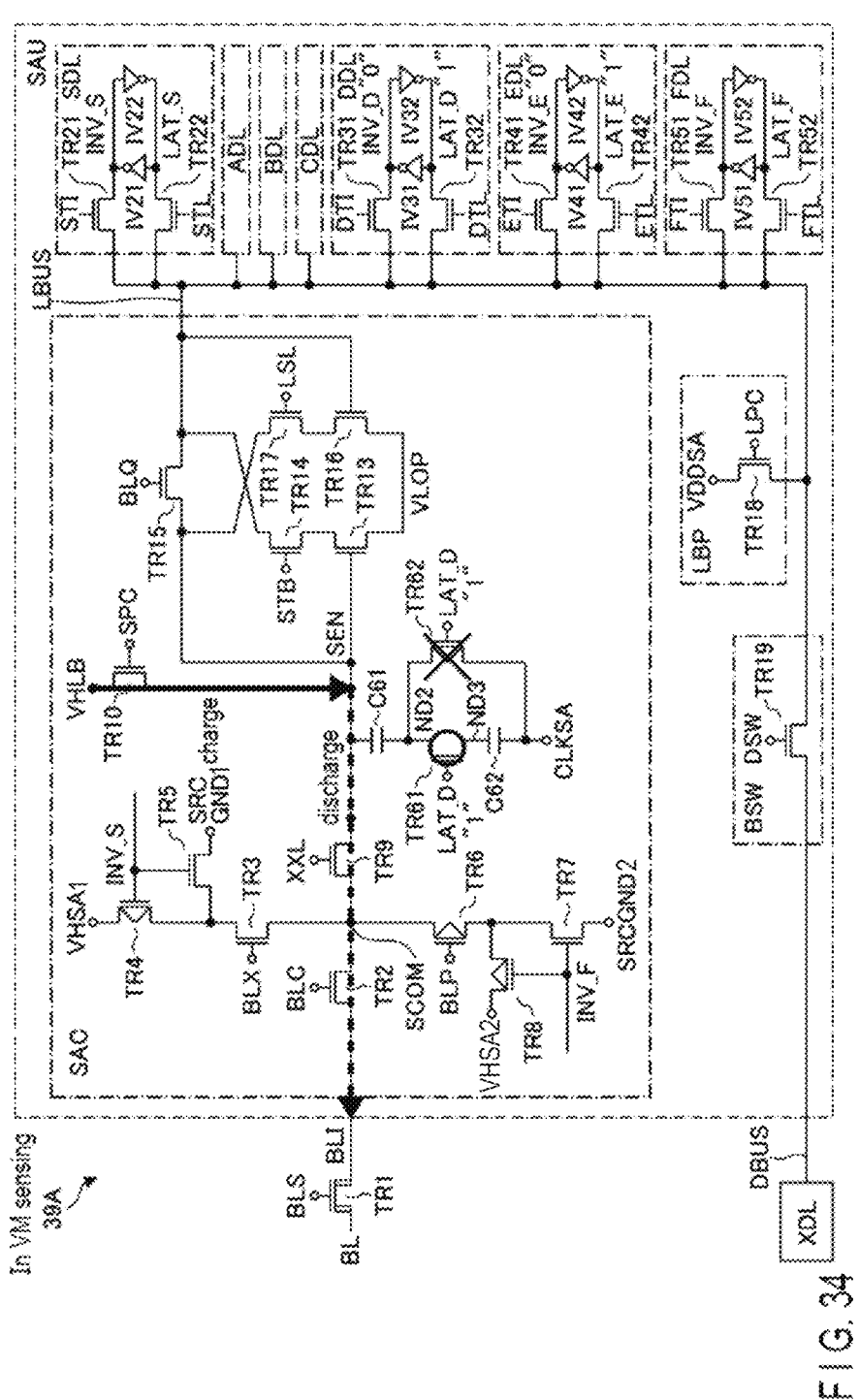
F I G. 34

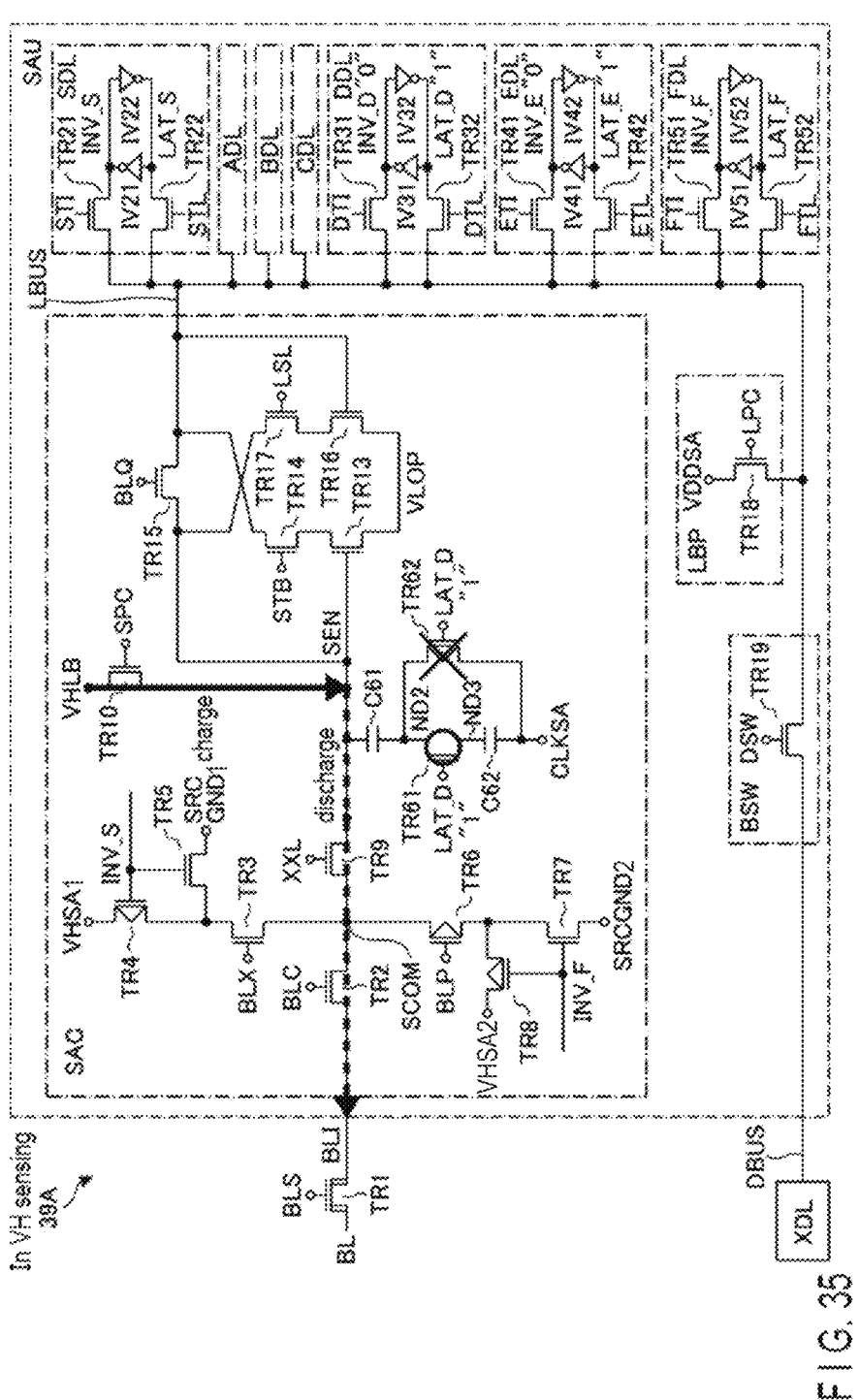
F I G. 35

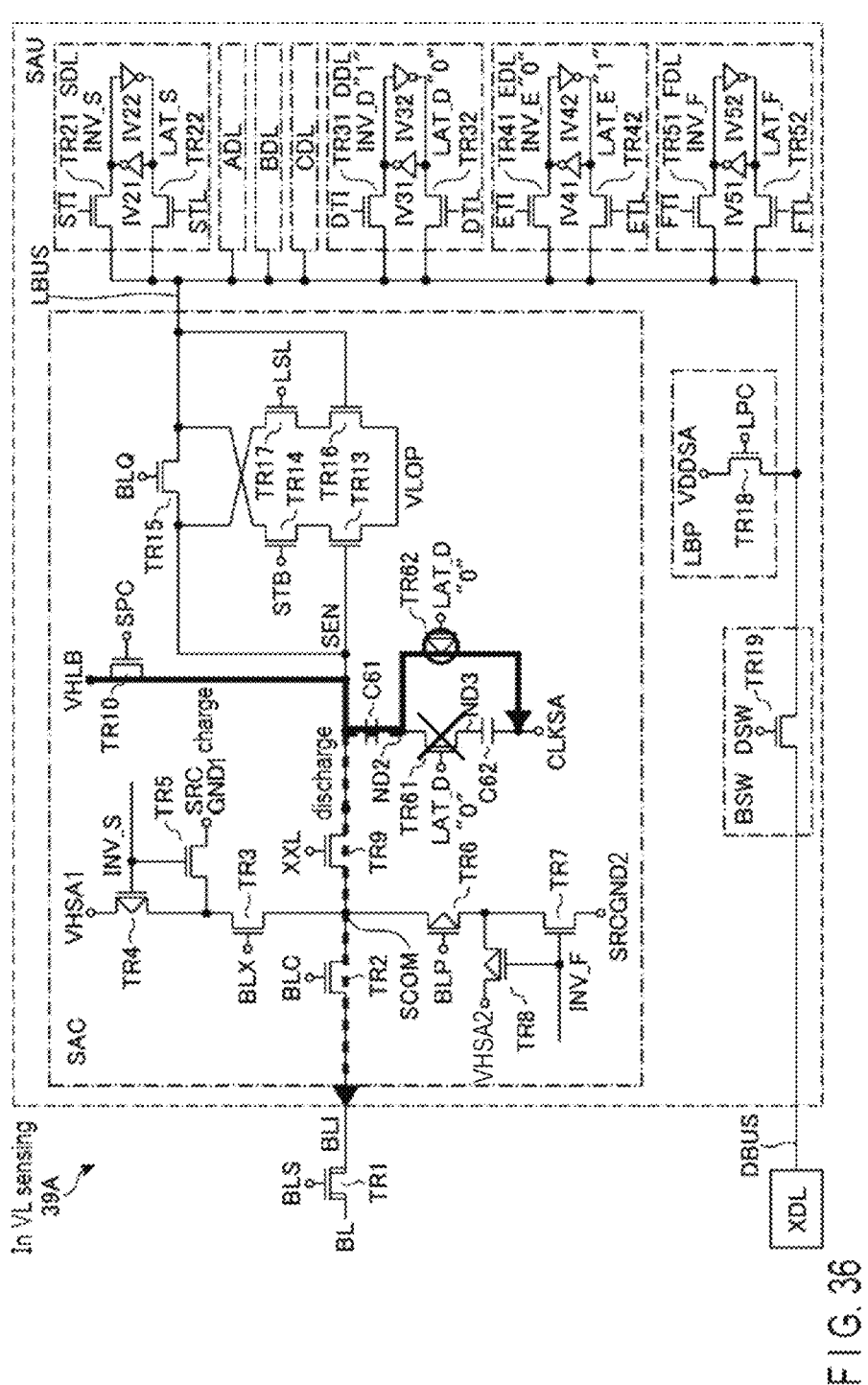
F I G. 36

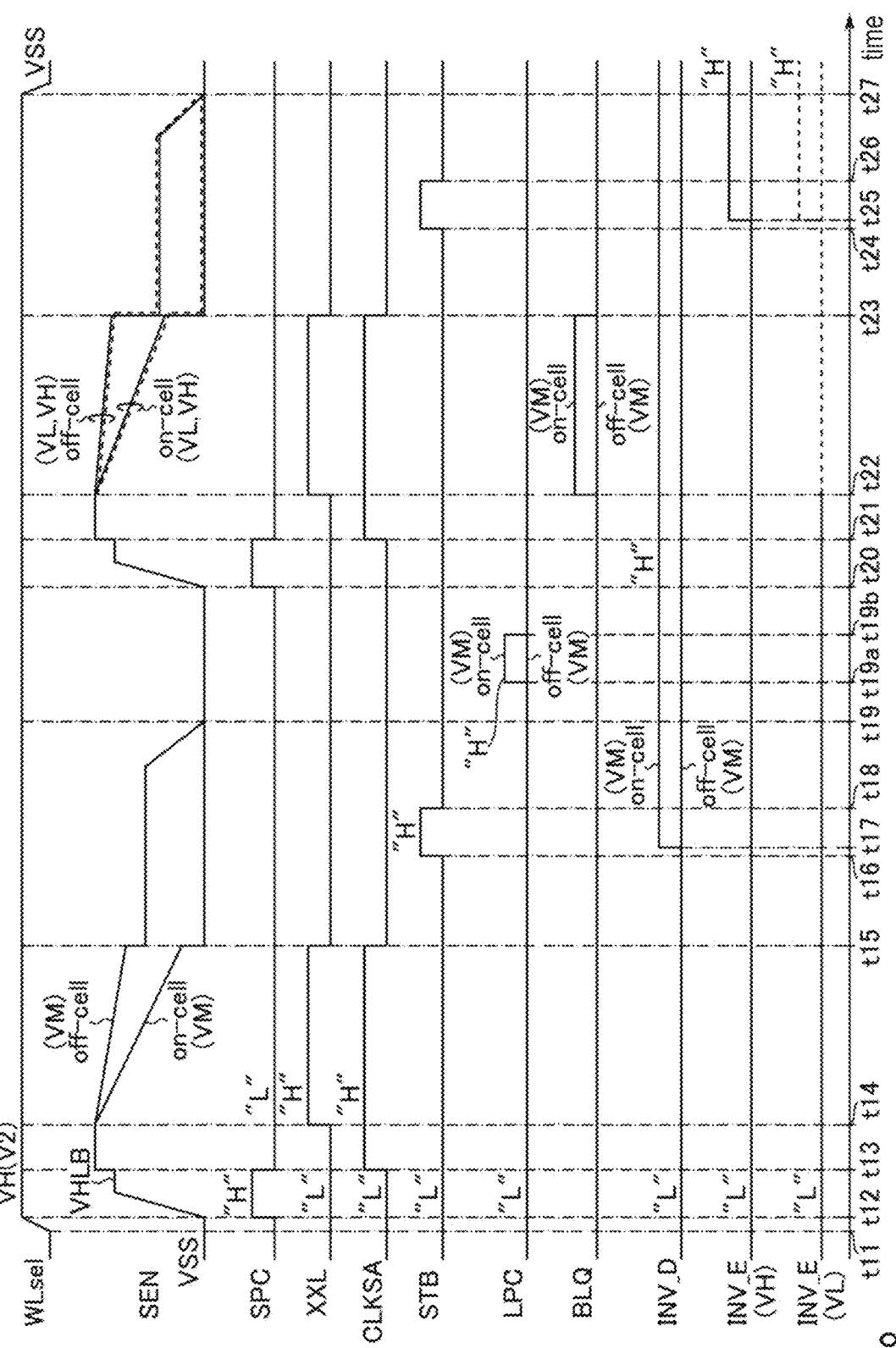
F I G. 38

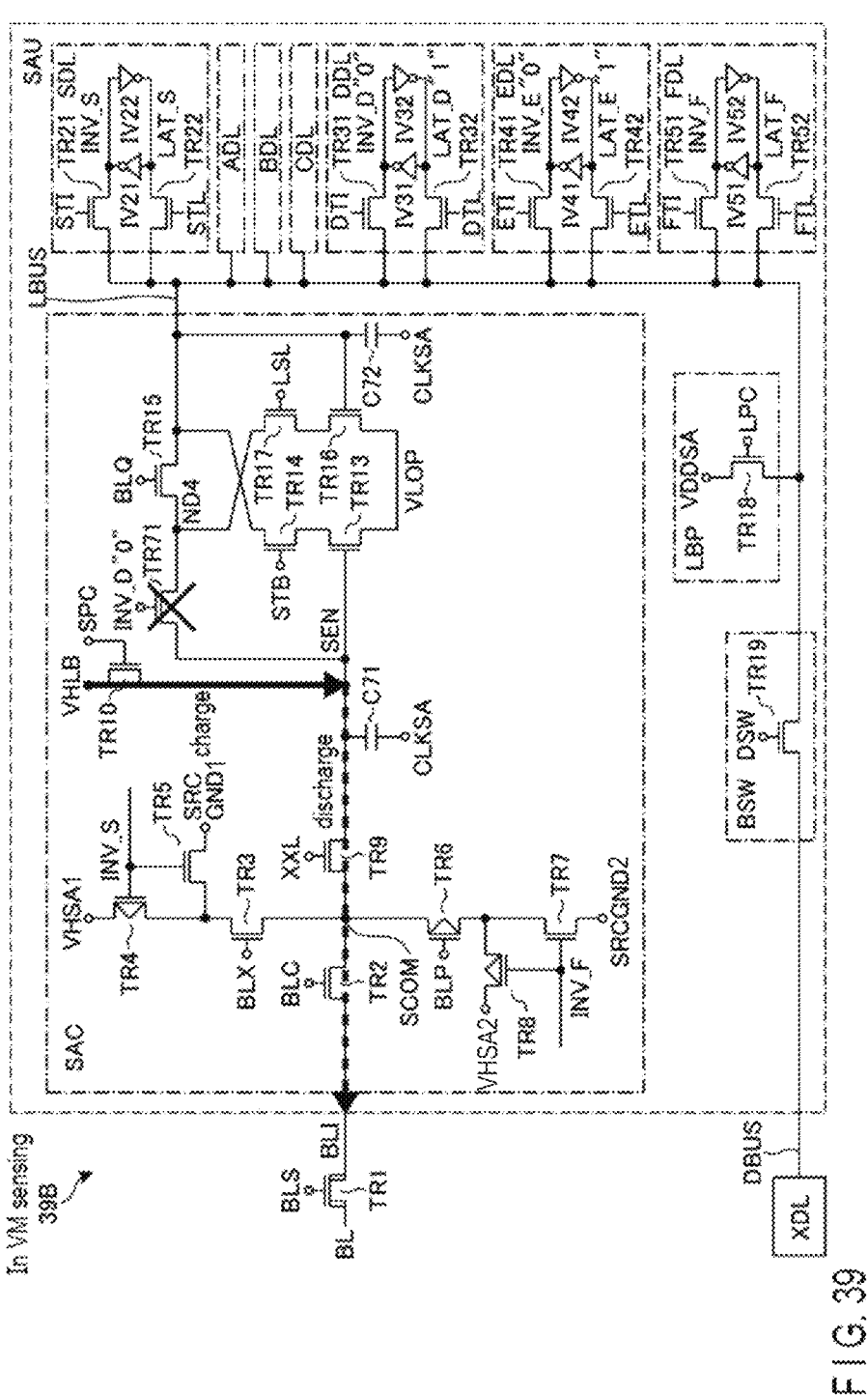
F I G. 39

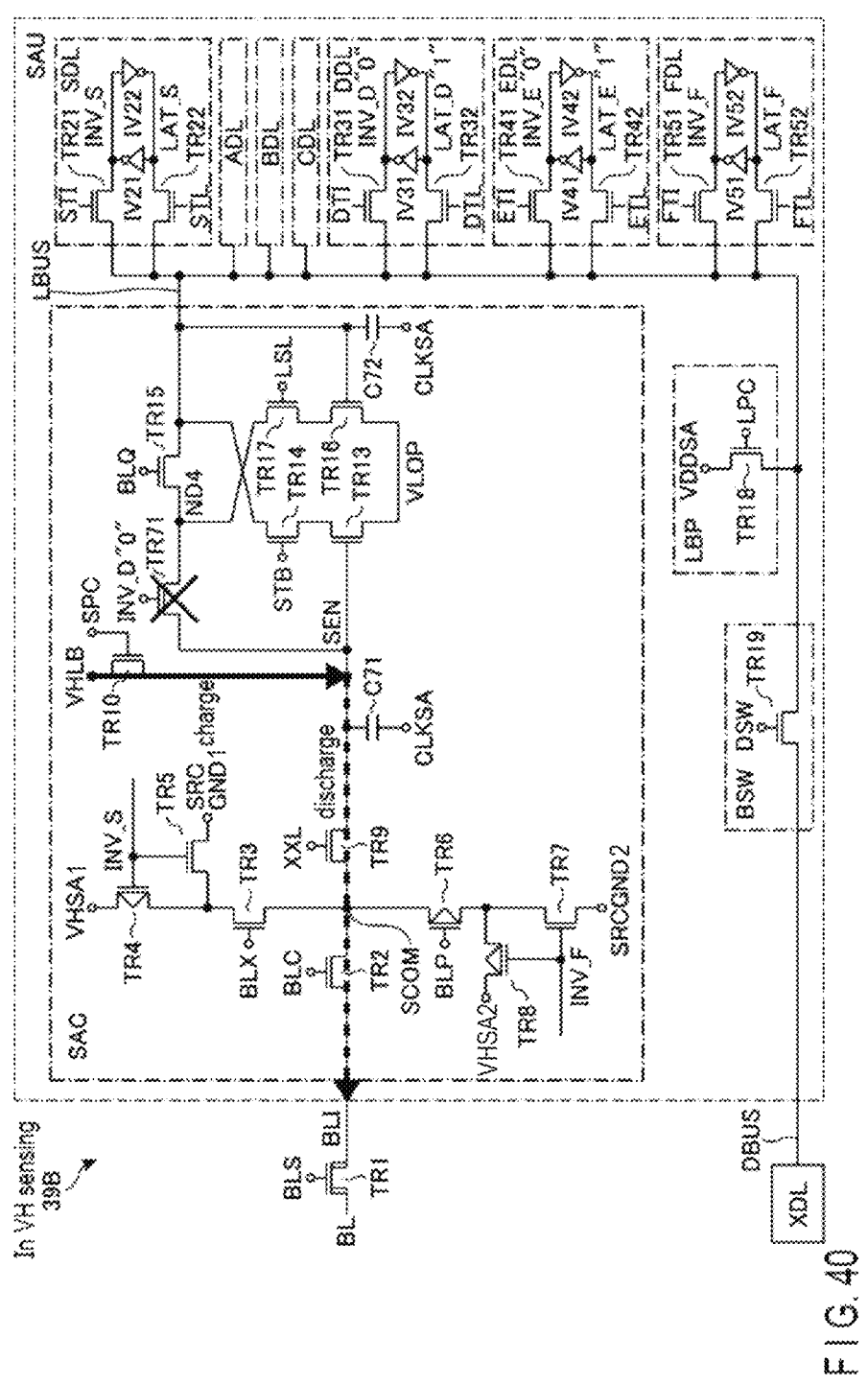
F I G. 40

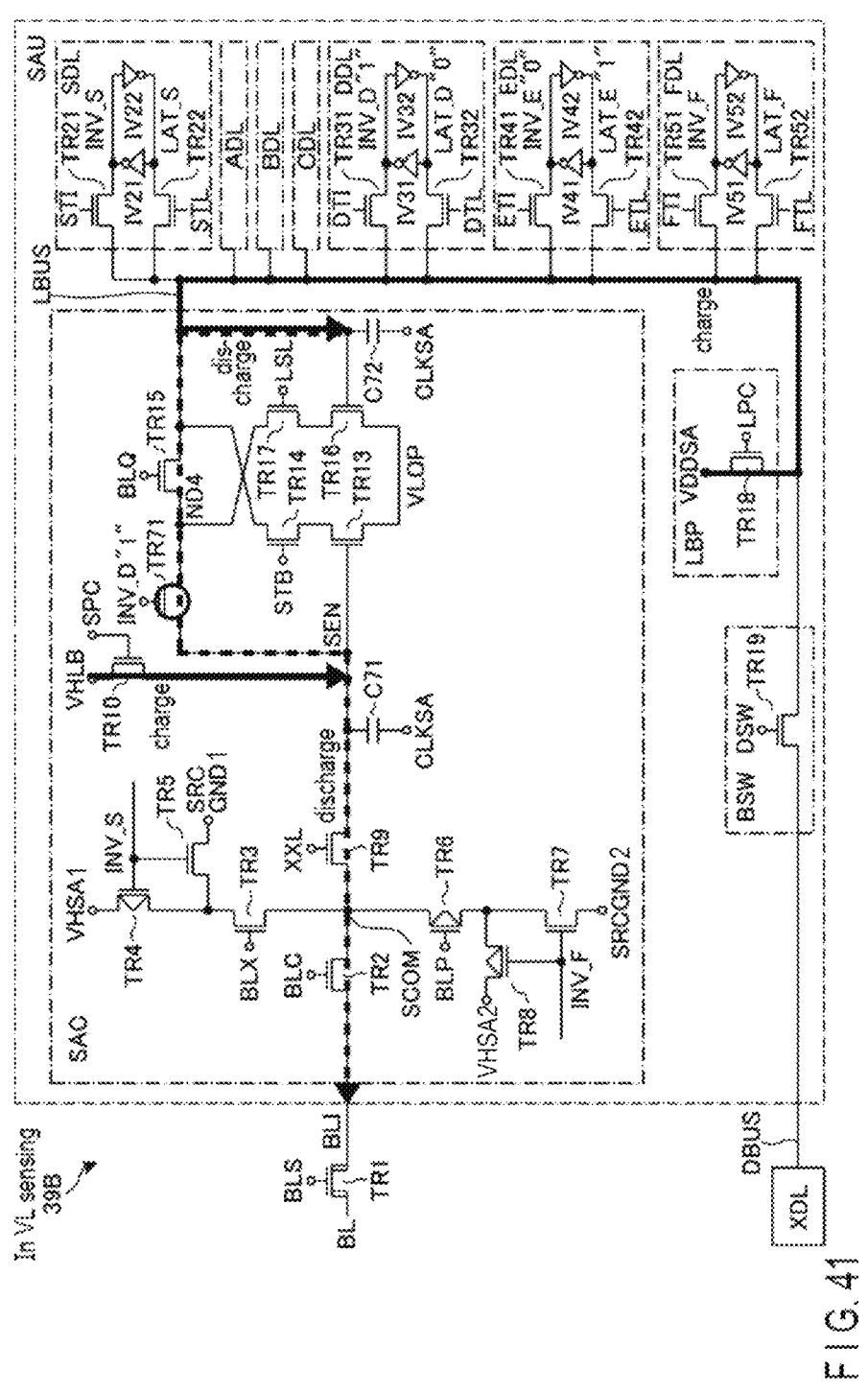
F I G. 41

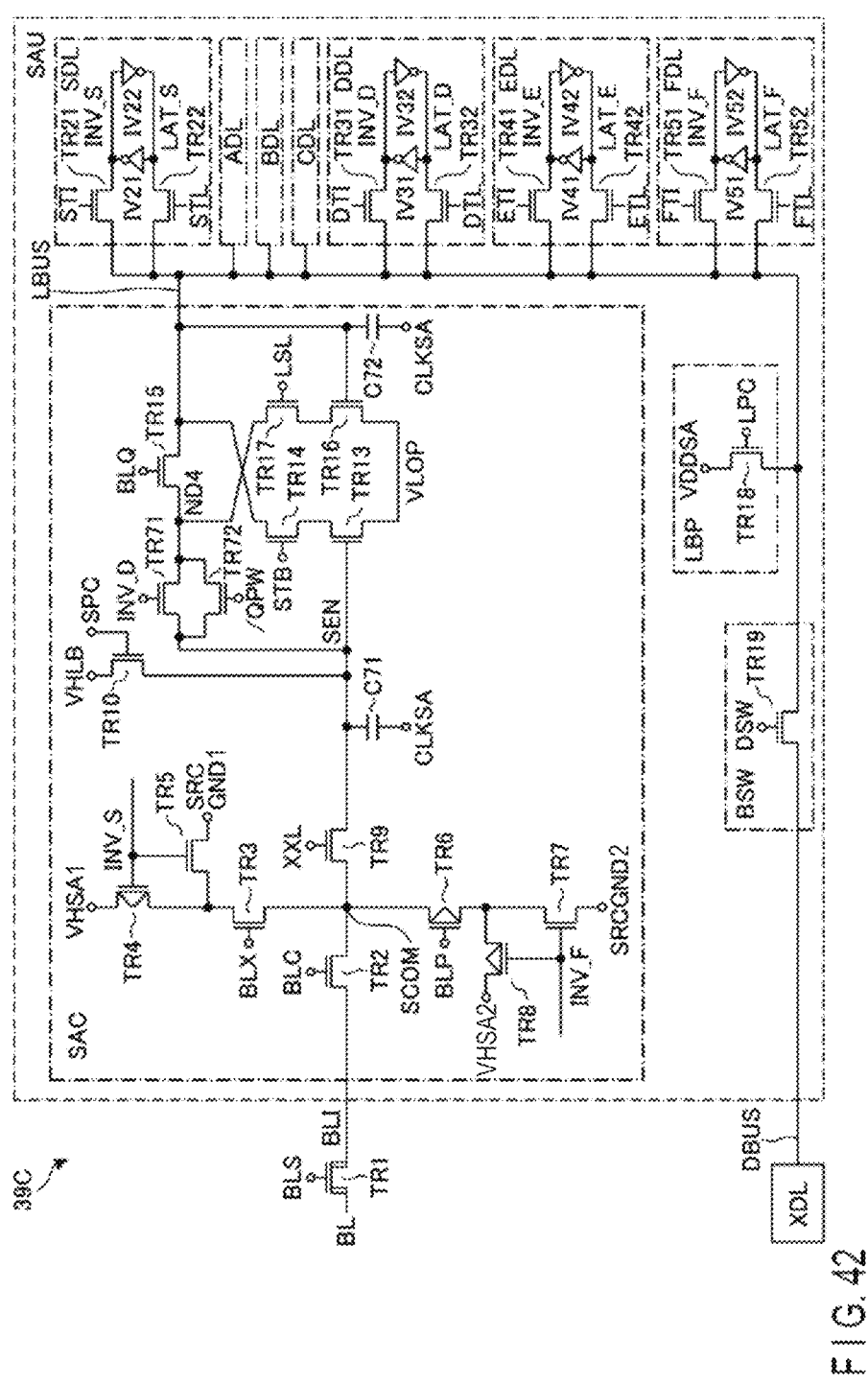
F I G. 42

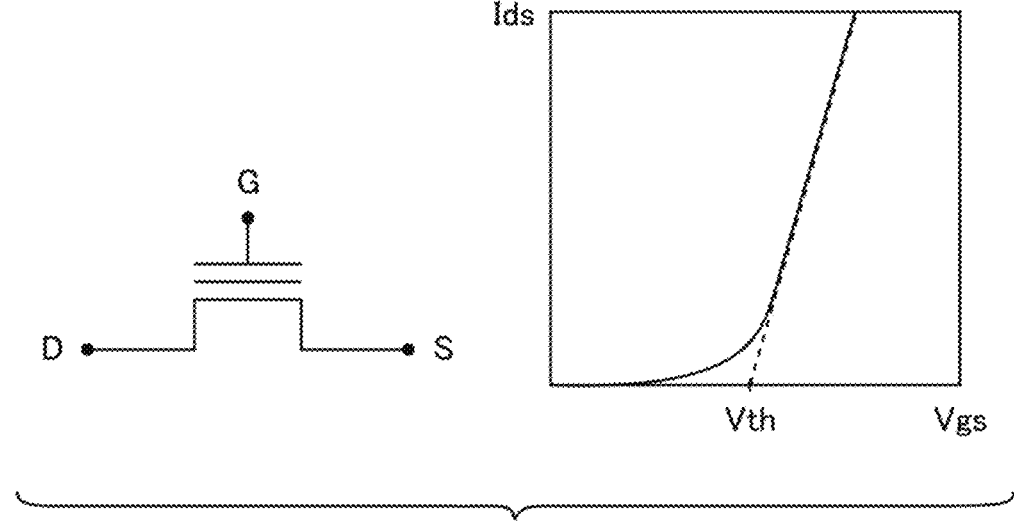
F I G. 43

SEMICONDUCTOR MEMORY DEVICE

CROSS-REFERENCE TO RELATED APPLICATION(S)

This application is based upon and claims the benefit of priority from Japanese Patent Application No. 2024-028620, filed Feb. 28, 2024, the entire contents of which are incorporated herein by reference.

FIELD

Embodiments described herein relate generally to a semiconductor memory device.

BACKGROUND

NAND flash memories are known as one type of semiconductor memory device. In a NAND flash memory, a program operation of raising a threshold voltage when data is written into a memory cell transistor and a verifying operation of checking the threshold voltage are executed.

DESCRIPTION OF THE DRAWINGS

FIG. 1 is a block diagram illustrating an example of a configuration of a memory system that includes a semiconductor memory device according to a first embodiment.

FIG. 2 is a block diagram illustrating an example of a configuration of the semiconductor memory device according to the first embodiment.

FIG. 10 is a block diagram illustrating an example of a configuration of a sense amplifier included in the semiconductor memory device according to the first embodiment.

FIG. 11 is a circuit diagram illustrating an example of a circuit configuration of the sense amplifier included in the semiconductor memory device according to the first embodiment.

FIG. 12 is a conceptual diagram illustrating an example of a data storage system of the semiconductor memory device according to the first embodiment.

FIG. 18 is a timing chart illustrating an example of voltages at various lines and voltages of various signals in the verifying operation by the semiconductor memory device according to the first embodiment.

FIG. 19 is a diagram for describing a middle voltage sensing operation of the sense amplifier of the semiconductor memory device according to the first embodiment.

FIG. 23 is a diagram for describing a low voltage sensing operation of the sense amplifier of the semiconductor memory device according to the first embodiment.

FIG. 24 is a diagram for describing a result of performing the low voltage sensing operation as the second execution of sensing by the semiconductor memory device according to the first embodiment.

FIG. 25 is a timing chart illustrating an example of voltages at various lines and voltages of various signals in a fourth program operation by the semiconductor memory device according to the first embodiment.

FIG. 26 is a diagram for describing an operation of the sense amplifier in the fourth program operation by the semiconductor memory device according to the first embodiment.

FIG. 27 is a timing chart illustrating an example of voltages at various lines and voltages of various signals in a first program operation by the semiconductor memory device according to the first embodiment.

FIG. 28 is a diagram for describing an operation of the sense amplifier in the first program operation by the semiconductor memory device according to the first embodiment.

FIG. 30 is a diagram for describing an operation of the sense amplifier in the second program operation by the semiconductor memory device according to the first embodiment.

FIG. 31 is a timing chart illustrating an example of voltages at various lines and voltages of various signals in a third program operation by the semiconductor memory device according to the first embodiment.

FIG. 32 is a diagram for describing an operation of the sense amplifier in the third program operation by the semiconductor memory device according to the first embodiment.

FIG. 33 is a circuit diagram illustrating an example of a circuit configuration of a sense amplifier included in a semiconductor memory device according to a second embodiment.

FIG. 34 is a diagram for describing a middle voltage sensing operation of the sense amplifier of the semiconductor memory device according to the second embodiment.

FIG. 35 is a diagram for describing a high voltage sensing operation of the sense amplifier of the semiconductor memory device according to the second embodiment.

FIG. 36 is a diagram for describing a low voltage sensing operation of the sense amplifier of the semiconductor memory device according to the second embodiment.

FIG. 38 is a timing chart illustrating an example of voltages at various lines and voltages of various signals in a verifying operation by the semiconductor memory device according to the third embodiment.

FIG. 39 is a diagram for describing a middle voltage sensing operation of the sense amplifier of the semiconductor memory device according to the third embodiment.

FIG. 40 is a diagram for describing a high voltage sensing operation of the sense amplifier of the semiconductor memory device according to the third embodiment.

FIG. 41 is a diagram for describing a low voltage sensing operation of the sense amplifier of the semiconductor memory device according to the third embodiment.

FIG. 42 is a circuit diagram illustrating an example of a circuit configuration of a sense amplifier included in a semiconductor memory device according to a modification of the third embodiment.

FIG. 43 is a diagram illustrating a memory cell transistor included in the semiconductor memory device according to the embodiments and its typical electric properties.

DETAILED DESCRIPTION

Figure 3:
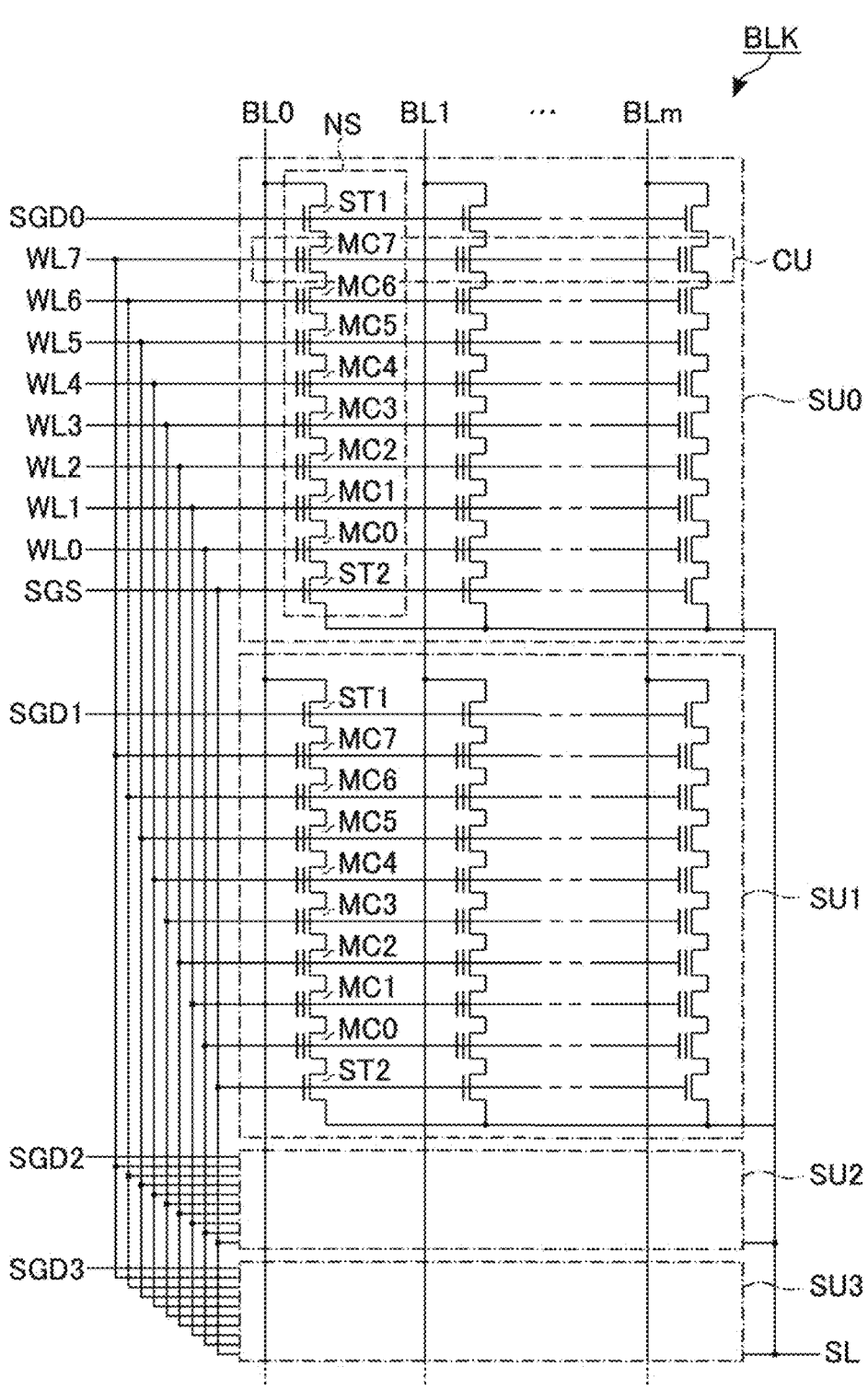
FIG. 3 is a circuit diagram illustrating an example of a circuit configuration of a memory cell array included in the semiconductor memory device according to the first embodiment.

Embodiments provide a semiconductor memory device capable of reducing the number of executions of sensing.

In general, according to one embodiment, a semiconductor memory device includes memory cells that store data, word lines that are connected to the memory cells, bit lines that are connectable to the memory cells, and sense amplifiers connectable to the bit lines. A writing operation on the memory cell includes a program operation and a verifying operation. In the verifying operation, the sense amplifier executes a first sensing operation against a first voltage level and executes, based on the result of the first sensing operation, either a second sensing operation against a second voltage level, which is higher than the first voltage level, or a third sensing operation against a third voltage level, which is lower than the first voltage level.

Embodiments will be described below with reference to the drawings. Dimensions and ratios in the drawings are not necessarily the same as actual ones. In the following description, constituent elements having substantially the same function and configuration will be assigned the same reference numeral or symbol. When elements having similar configurations are particularly distinguished from one another, different characters or numerals may be appended to the same reference numeral or symbol.

1. First Embodiment

A semiconductor memory device according to a first embodiment will be described.

1.1 Configuration 1.1.1 Configuration of Memory System

With reference to FIG. 1, a configuration of a memory system that includes the semiconductor memory device according to the first embodiment will be described. FIG. 1 is a block diagram illustrating an example of the configuration of the memory system that includes the semiconductor memory device according to the first embodiment.

The memory system 1 is a device that stores data. The memory system 1 is, for example, a solid state drive (SSD), a universal flash storage (UFS) device, a universal serial bus (USB) memory, a multi-media card (MMC), or an SD™ card. The memory system 1 is connectable to a host 2 through a host bus. The memory system 1 performs a process based on a request signal received from the host 2 or a voluntary processing request. The request signal is one of request signals for various operations. Examples of the various operations include a writing operation, a reading operation, and an erasing operation.

The host 2 is a device that controls the memory system 1. The host 2 is, for example, a personal computer, a server system, a mobile device, an in-vehicle device, or a digital camera.

Next, an internal configuration of the memory system 1 will be described. As illustrated in FIG. 1, the memory system 1 includes a memory controller 10 and a semiconductor memory device 30. The semiconductor memory device 30 is, for example, a nonvolatile memory such as a NAND flash memory. Hereinafter, the semiconductor memory device 30 will be referred to as a NAND flash memory 30.

The memory controller 10 is a device that controls the NAND flash memory 30. The memory controller 10 is, for example, a system-on-a-chip (SoC). The memory controller 10 is connected to the host 2 through the host bus. The memory controller 10 receives a request signal from the host 2 through the host bus. The memory controller 10 also transmits information to the host 2 through the host bus.

A type of the host bus depends on an application applied to the memory system 1. In a case where the memory system 1 is an SSD, an interface based on a standard such as Serial Attached SCSI (SAS), Serial ATA (SATA), or Peripheral Component Interconnect Express (PCI™) is used as the host bus. In a case where the memory system 1 is a UFS device, an interface based on M-PHY standard is used as the host bus. In a case where the memory system 1 is a USB memory, an interface based on USB standard is used as the host bus. In a case where the memory system 1 is an MMC, an interface based on embedded Multi Media Card (eMMC) standard is used as the host bus. In a case where the memory system 1 is an SD™ card, an interface based on SD™ standard is used as the host bus.

The memory controller 10 controls the NAND flash memory 30 through a NAND bus based on a request signal received from the host 2 or a voluntary processing request. For example, the memory controller 10 transmits and receives data to and from the NAND flash memory 30 and transmits a command and an address to the NAND flash memory 30. The NAND bus transmits and receives signals according to a NAND interface.

The NAND flash memory 30 is a device that stores data. The NAND flash memory 30 includes a plurality of memory cell transistors. The plurality of memory cell transistors each store data in a nonvolatile manner. The NAND flash memory 30 performs the writing operation, the reading operation, and the erasing operation based on the command, the address, and the like received from the memory controller 10. In the writing operation, the NAND flash memory 30 stores the data received from the memory controller 10 in the plurality of memory cell transistors in a nonvolatile manner. In the reading operation, the NAND flash memory 30 outputs data read from the plurality of memory cell transistors to the memory controller 10.

Next, an internal configuration of the memory controller 10 will be described. The memory controller 10 includes a host interface (I/F) circuit 11, a processor (central processing unit: CPU) 12, a buffer memory 13, an error checking and correcting (ECC) circuit 14, a read only memory (ROM) 15, a random access memory (RAM) 16, and a NAND interface (I/F) circuit 17.

The host interface circuit 11 is a circuit that carries out communication between the memory controller 10 and the host 2. The host interface circuit 11 is connected to the host 2 through the host bus.

The processor 12 is a control circuit of the memory controller 10. The processor 12 controls operation of the entire memory controller 10 by executing a program (firmware) stored in the ROM 15. For example, when receiving a write request from the host 2, the processor 12 controls the writing operation based on the write request. The same holds true for the reading operation and the erasing operation.

The buffer memory 13 is a memory that temporarily stores data. The buffer memory 13 is, for example, a static random access memory (SRAM). The buffer memory 13 temporarily stores data to be written, read data, and the like. The data to be written is data to be written into the NAND flash memory 30. The read data is data that is read from the NAND flash memory 30.

The ECC circuit 14 is a circuit that performs an error correcting process on data. Specifically, in a data writing operation, the ECC circuit 14 generates an error correction code based on data to be written. In data reading operation, the ECC circuit 14 generates a syndrome based on an error correction code on a predetermined block basis, checks for an error, and corrects any detected error.

The ROM 15 is a nonvolatile memory. The ROM 15 is, for example, an electrically erasable programmable read-only memory (EEPROM™). The ROM 15 stores a program such as firmware.

The RAM 16 is a volatile memory. The RAM 16 is, for example, an SRAM. The RAM 16 is used as a working area for the processor 12. The RAM 16 stores firmware for managing the NAND flash memory 30 and various types of management information.

The NAND interface circuit 17 is a circuit that carries out communication between the memory controller 10 and the NAND flash memory 30. The NAND interface circuit 17 is connected to the NAND flash memory 30 through the NAND bus. For example, the NAND interface circuit 17 controls transfer of data, a command, an address, and the like between the memory controller 10 and the NAND flash memory 30.

1.1.2 Configuration of NAND Flash Memory

With reference to FIG. 2, a configuration of the NAND flash memory 30 will be described. FIG. 2 is a block diagram illustrating an example of the configuration of the NAND flash memory 30. FIG. 2 also illustrates the memory controller 10.

As illustrated in FIG. 2, the NAND flash memory 30 includes an input/output circuit 31, a logic control circuit 32, a ready/busy circuit 33, registers 34, a sequencer 35, a memory cell array 36, a voltage generation circuit 37, a row decoder module 38, a sense amplifier 39, and a data bus circuit 40.

The input/output circuit 31 is a circuit that transmits and receives signals and information to and from the memory controller 10. The input/output circuit 31 transmits and receives, to and from the memory controller 10, an input/output signal DQ (e.g., an 8-bit signal DQ0 to DQ7), and a data strobe signal DQS and a data strobe signal DQSn (an inverse signal of the signal DQS). The signal DQ contains data that is transmitted and received between the NAND flash memory 30 and the memory controller 10. The signal DQ includes, for example, a command CMD, an address ADD, status information STS, and data DAT. The signals DQS and DQSn are signals for controlling timings for transmitting and receiving the signal DQ.

For example, when data is written, the signals DQS and DQSn as well as a signal DQ including the data to be written are transmitted from the memory controller 10 to the NAND flash memory 30. The NAND flash memory 30 receives the signal DQ including the data to be written in synchronization with the signals DQS and DQSn. In data reading, the signals DQS and DQSn as well as a signal DQ including the read data are transmitted from the NAND flash memory 30 to the memory controller 10. The memory controller 10 receives the signal DQ including the read data in synchronization with the signals DQS and DQSn.

Alternatively, the input/output circuit 31 may receive the signals DQS and DQSn from the memory controller 10 via the logic control circuit 32.

The input/output circuit 31 also transmits a command CMD in a signal DQ to a command register 34A. The input/output circuit 31 transmits an address ADD in a signal DQ to an address register 34B. The input/output circuit 31 receives status information STS from a status register 34C. The input/output circuit 31 transmits and receives data DAT in signals DQ to and from the data bus circuit 40.

The logic control circuit 32 is a circuit that controls the input/output circuit 31 and the sequencer 35 based on control signals. The logic control circuit 32 receives from the memory controller 10, a chip enable signal CEn, a command latch enable signal CLE, an address latch enable signal ALE, a write enable signal WEn, and a read enable signal REn. The signal CEn is a signal to enable the NAND flash memory 30. The signal CLE is a signal indicating that a signal DQ received by the NAND flash memory 30 is a command CMD. The signal ALE is a signal indicating that a signal DQ received by the NAND flash memory 30 is an address ADD. The signal WEn is a signal that commands the NAND flash memory 30 to take in a signal DQ as an input. The signal REn is a signal that commands the NAND flash memory 30 to output a signal DQ. Based on the signal REn, the NAND flash memory 30 generates signals DQS and DQSn. Based on the generated signals DQS and DQSn, the NAND flash memory 30 outputs the signal DQ to the memory controller 10. The logic control circuit 32 controls the input/output circuit 31 and the sequencer 35 based on the received control signals.

The ready/busy circuit 33 is a circuit that notifies the memory controller 10 of an operation state of the sequencer 35. The ready/busy circuit 33 transmits a ready/busy signal RBn to the memory controller 10 based on the operation state of the sequencer 35. The signal RBn is a signal indicating that the NAND flash memory 30 is in either a ready state or a busy state. For example, the signal RBn is brought to a "Low" level when the NAND flash memory 30 is in the busy state. The ready state is a state in which the NAND flash memory 30 is ready to accept a command from the memory controller 10. The busy state is a state in which the NAND flash memory 30 is not ready to accept a command from the memory controller 10.

The registers 34 are circuits that temporarily store information. The registers 34 include the command register 34A, the address register 34B, and the status register 34C.

The command register 34A is a circuit that stores a command CMD. The command CMD includes, for example, a command that causes the sequencer 35 to execute the reading operation, the writing operation, and the erasing operation.

The address register 34B is a circuit that stores an address ADD. The address ADD includes, for example, a row address RA (including a block address and a page address) and a column address CA. The block address, the page address, and the column address CA are used to select a block BLK, a word line, and a bit line, for example. For example, the address register 34B transfers the row address RA to the row decoder module 38. The address register 34B transfers the column address CA to the sense amplifier 39.

The status register 34C is a circuit that temporarily stores the status information STS in, for example, the reading operation, the writing operation, and the erasing operation. The status information STS is used to notify the memory controller 10 whether an operation has finished normally.

The sequencer 35 is a circuit that controls an operation of other circuits under a predetermined program. The sequencer 35 controls the operation of the entire NAND flash memory 30. For example, the sequencer 35 controls the ready/busy circuit 33, the voltage generation circuit 37, the row decoder module 38, the sense amplifier 39, and the data bus circuit 40 based on commands CMD stored in the command register 34A. For example, the sequencer 35 executes the reading operation, the writing operation, and the erasing operation.

The memory cell array 36 includes a plurality of blocks BLK0 to BLKn (n is an integer equal to or greater than one). Hereinafter, when the blocks BLK0 to BLKn are not distinguished from one another, the blocks BLK0 to BLKn will be simply referred to as blocks BLK. The blocks BLK are each, for example, a set of a plurality of memory cell transistors in which items of data are collectively erased. For example, the blocks BLK are each used as a unit for the erasing operation. The memory cell array 36 is also provided with a plurality of bit lines and a plurality of word lines. For example, the memory cell transistors are each associated with one of the bit lines and one of the word lines. The memory cell array 36 will be described later in detail.

The voltage generation circuit 37 is a circuit that generates a voltage to be used in the various operations. The voltage generation circuit 37 supplies the generated voltage to, for example, the row decoder module 38 and the sense amplifier 39.

The row decoder module 38 is a circuit that selects one of the blocks BLK in the memory cell array 36 based on the row address RA. The row decoder module 38 transfers a voltage applied to a signal line corresponding to a selected word line to a selected word line in the selected block BLK.

The sense amplifier 39 is a circuit that makes determination on data stored in a memory cell transistor. In the reading operation, the sense amplifier 39 makes determination on data stored in the memory cell transistor based on a voltage at a bit line. The sense amplifier 39 transfers a result of the determination as read data DAT to the data bus circuit 40. In the writing operation, the sense amplifier 39 applies, to a selected bit line, a voltage based on data DAT to be written that is received from the input/output circuit 31 via the data bus circuit 40.

The data bus circuit 40 is a circuit that transfers data between the input/output circuit 31 and the sense amplifier 39.

As illustrated in FIG. 2, the NAND flash memory 30 also includes an array chip 100 and a circuit chip 200. In the present embodiment, the NAND flash memory 30 has a structure in which the array chip 100 and the circuit chip 200 are bonded together (hereinafter, will be referred to as a "bonded structure").

The array chip 100 is a chip that is provided with the memory cell array 36. The circuit chip 200 is a chip that is provided with the input/output circuit 31, the logic control circuit 32, the ready/busy circuit 33, the registers 34, the sequencer 35, the voltage generation circuit 37, the row decoder module 38, the sense amplifier 39, and the data bus circuit 40. Note that a plurality of array chips 100 may be provided. In this case, the plurality of array chips 100 may be bonded together in such a manner as to be stacked on the circuit chip 200.

1.1.3 Circuit Configuration of Memory Cell Array

With reference to FIG. 3, a circuit configuration of the memory cell array 36 will be described. FIG. 3 is a circuit diagram illustrating an example of the circuit configuration of the memory cell array 36. FIG. 3 illustrates a circuit configuration of a block BLK included in the memory cell array 36 as an example of the circuit configuration of the memory cell array 36. The other blocks BLK also have a configuration similar to that in FIG. 3.

As illustrated in FIG. 3, the block BLK includes, for example, four string units SU0 to SU3. Hereinafter, when the string units SU0 to SU3 are not distinguished from one another, the string units SU0 to SU3 will be simply referred to as string units SU. The string units SU are each, for example, a set of a plurality of NAND strings NS that are collectively selected in the writing operation or the reading operation. The string units SU each include the plurality of NAND strings NS that are associated with respective bit lines BL0 to BLm (m is an integer equal to or greater than one). Hereinafter, when the bit lines BL0 to BLm are not distinguished from one another, the bit lines BL0 to BLm will be simply referred to as bit lines BL. The NAND strings NS are each a set of a plurality of memory cell transistors that are connected together in series. The NAND strings NS each include, for example, memory cell transistors MC0 to MC7 and selection transistors ST1 and ST2. Hereinafter, when the memory cell transistors MC0 to MC7 are not distinguished from one another, the memory cell transistors MC0 to MC7 will be simply referred to as memory cell transistors MC. The memory cell transistors MC each store data in a nonvolatile manner. The memory cell transistors MC each include a control gate and a charge accumulation layer. The selection transistors ST1 and ST2 are switching elements. The selection transistors ST1 and ST2 are each used for selecting a string unit SU in the various operations.

In each of the NAND strings NS, the memory cell transistors MC0 to MC7 are connected together in series. A drain of the selection transistor ST1 is connected to an associated bit line BL. A source of the selection transistor ST1 is connected to one end of the memory cell transistors MC0 to MC7 connected in series. A drain of the selection transistor ST2 is connected to the other end of the memory cell transistors MC0 to MC7 connected in series. A source of the selection transistor ST2 is connected to a source line SL.

In the same block BLK, control gates of memory cell transistors MC0 to MC7 in different NAND strings NS are connected to respective word lines WL0 to WL7 in common. Hereinafter, when the word lines WL0 to WL7 are not distinguished from one another, the word lines WL0 to WL7 will be simply referred to as word lines WL. In the string units SU0 to SU3, gates of the respective sets of selection transistors ST1 are connected to respective selection gate lines SGD0 to SGD3 in common. Hereinafter, when the selection gate lines SGD0 to SGD3 are not distinguished from one another, the selection gate lines SGD0 to SGD3 will be simply referred to as selection gate lines SGD. Gates of selection transistors ST2 included in the same block BLK are connected to a selection gate line SGS in common.

In the circuit configuration of the memory cell array 36 described above, for example, each bit line BL is shared by a plurality of NAND strings NS in the plurality of string units SU to which the same column address CA is assigned. The source line SL is shared among, for example, the plurality of blocks BLK.

In each string unit SU, a set of a plurality of memory cell transistors MC connected to a common word line WL is referred to as, for example, a cell unit CU. Each block BLK includes a plurality of cell units CU. Data stored in a cell unit CU including a plurality of memory cell transistors MC each storing data of one bit based on a threshold voltage is equivalent to data of one page. Each cell unit CU can store data of two or more pages based on the number of bits of data stored in the memory cell transistors MC of the cell unit CU. Below will be described a case where the memory cell transistors MC are triple level cells (TLC), each of which stores 3-bit data.

The circuit configuration of the memory cell array 36 is not limited to the configuration described above. For example, the number of the string units SU included in each block BLK and the number of the memory cell transistors MC and the selection transistors ST1 and ST2 included in each NAND string NS may be each any number. Hereinafter, the memory cell transistors MC will be also referred to as memory cells MC.

1.1.4 Bonded Structure of NAND Flash Memory

Figure 4:
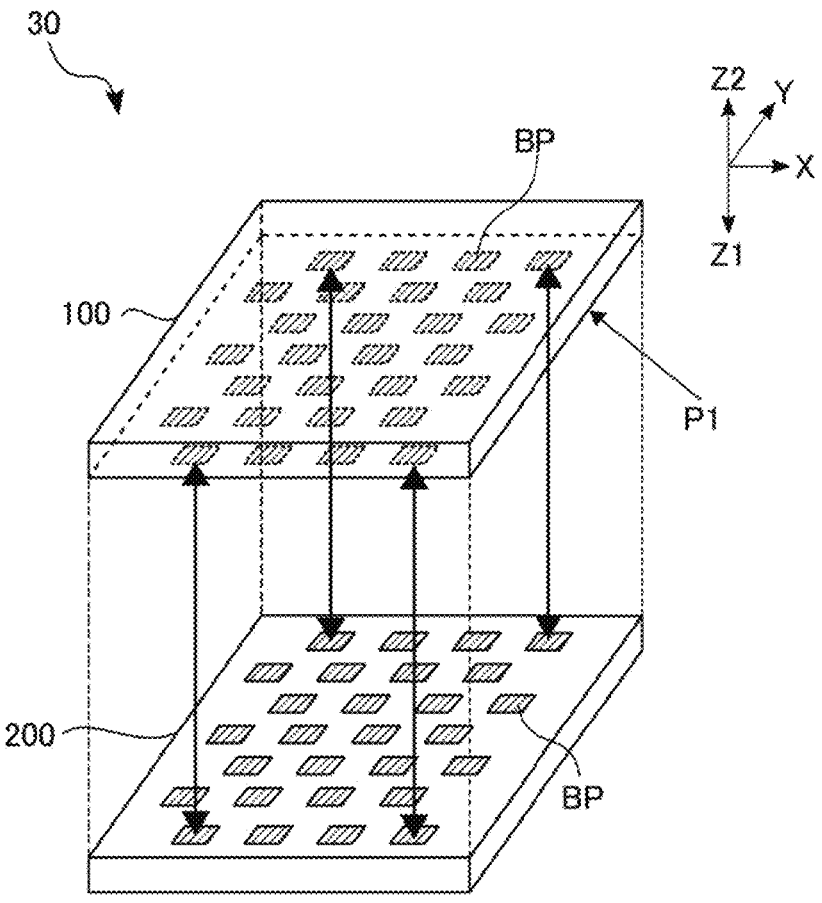
FIG. 4 is a perspective view illustrating an overview of a bonded structure of the semiconductor memory device according to the first embodiment.

With reference to FIG. 4, an overview of the bonded structure of the NAND flash memory 30 will be described. FIG. 4 is a perspective view illustrating the overview of the bonded structure of the NAND flash memory 30.

As illustrated in FIG. 4, the array chip 100 is bonded with the circuit chip 200 at, for example, a first surface P1 of the array chip 100. The array chip 100 and the circuit chip 200 each include pluralities of bonding pads BP that are provided on surfaces facing each other. In the bonded structure, a bonding pad BP of the array chip 100 and a bonding pad BP of the circuit chip 200 are bonded together to form one bonding pad BP. In other words, an electrode (a conductive body) forming a bonding pad BP provided on the array chip 100 and an electrode (conductive body) forming a bonding pad BP provided on the circuit chip 200 are bonded together to form a bonding pad BP.

Hereinafter, the surface at which the array chip 100 and the circuit chip 200 are bonded together (hereinafter, will be referred to as a "bonding surface") is assumed to be an XY-plane. The bonding surface is, for example, the first surface P1 of the array chip 100. Directions that are perpendicular to each other on an XY-plane are assumed to be an X direction and a Y direction. A direction that is substantially perpendicular to the XY-plane and is from the array chip 100 toward the circuit chip 200 is assumed to be a Z1 direction. A direction that is substantially perpendicular to the XY-plane and is from the circuit chip 200 toward the array chip 100 is assumed to be a Z2 direction. When a direction substantially perpendicular to the XY-plane is not limited to one of the Z1 direction and the Z2 direction, the direction will be referred to as a Z direction.

1.1.5 Layout of Array Chip

Figure 5:
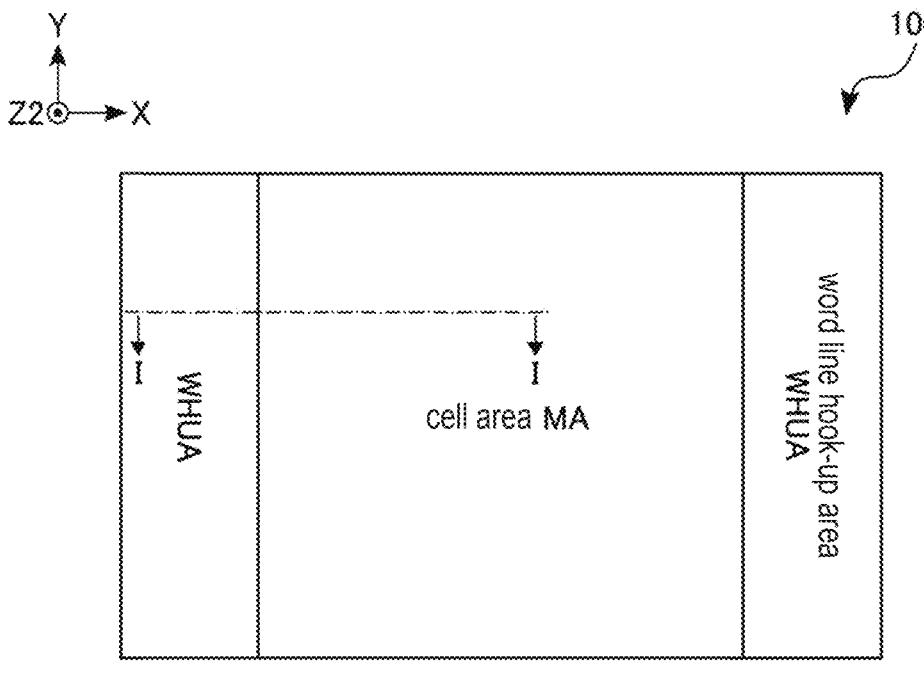
FIG. 5 is a plan view illustrating an example of a planar layout of an array chip in the semiconductor memory device according to the first embodiment.

With reference to FIG. 5, a planar layout of the array chip 100 will be described. FIG. 5 is a plan view illustrating an example of the planar layout of the array chip 100.

As illustrated in FIG. 5, the array chip 100 includes a cell area MA and two word line hook-up areas WHUA. The cell area MA is an area where the memory cell array 36 is provided. The word line hook-up areas WHUA are areas used to connect the word lines WL and the row decoder module 38. The two word line hook-up areas WHUA are disposed being arranged, for example, in the X direction. The cell area MA is disposed, for example, between the two word line hook-up areas WHUA.

1.1.6 Layout of Circuit Chip

Figure 6:
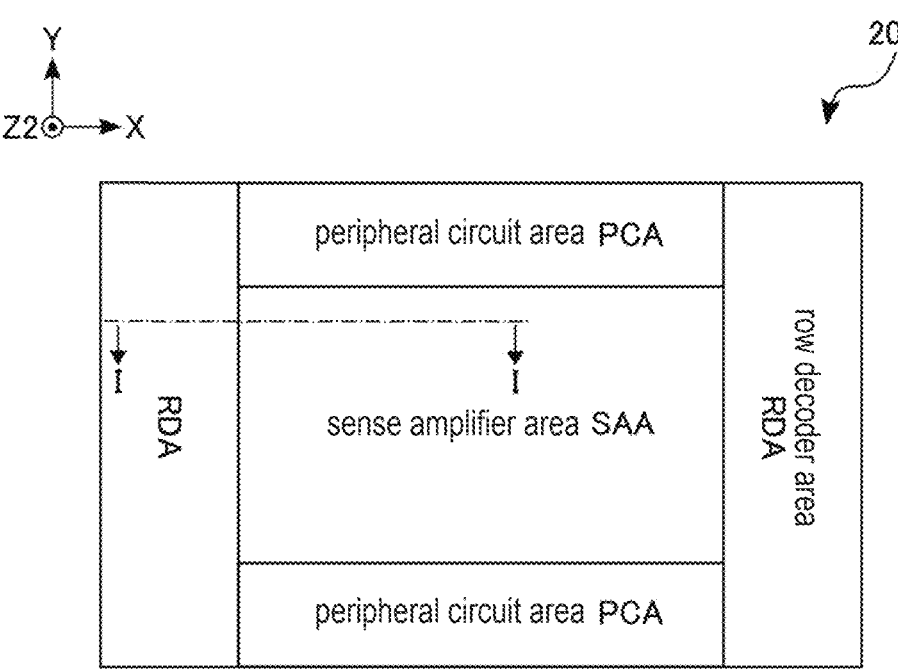
FIG. 6 is a plan view illustrating an example of a planar layout of a circuit chip in the semiconductor memory device according to the first embodiment.

With reference to FIG. 6, a planar layout of the circuit chip 200 will be described. FIG. 6 is a plan view illustrating an example of the planar layout of the circuit chip 200.

As illustrated in FIG. 6, the circuit chip 200 includes a sense amplifier area SAA, two peripheral circuit areas PCA, and two row decoder areas RDA. The sense amplifier area SAA is an area where the sense amplifier 39 is provided. The peripheral circuit areas PCA are areas where peripheral circuits such as the voltage generation circuit 37 and data bus circuit 40 are provided. The two peripheral circuit areas PCA are disposed being arranged, for example, in the Y direction. The sense amplifier area SAA is disposed, for example, between the two peripheral circuit areas PCA. The sense amplifier area SAA and the two peripheral circuit areas PCA overlap with the cell area MA of the array chip 100 in the Z direction. The row decoder areas RDA are areas where the row decoder module 38 is provided. The two row decoder areas RDA are disposed being arranged, for example, in the X direction. The sense amplifier area SAA and the two peripheral circuit areas PCA are disposed, for example, between the two row decoder areas RDA. The row decoder areas RDA overlap with the word line hook-up areas WHUA of the array chip 100 in the Z direction.

1.1.7 Sectional Structure of NAND Flash Memory

A sectional structure of the NAND flash memory 30 will be described.

Figure 7:
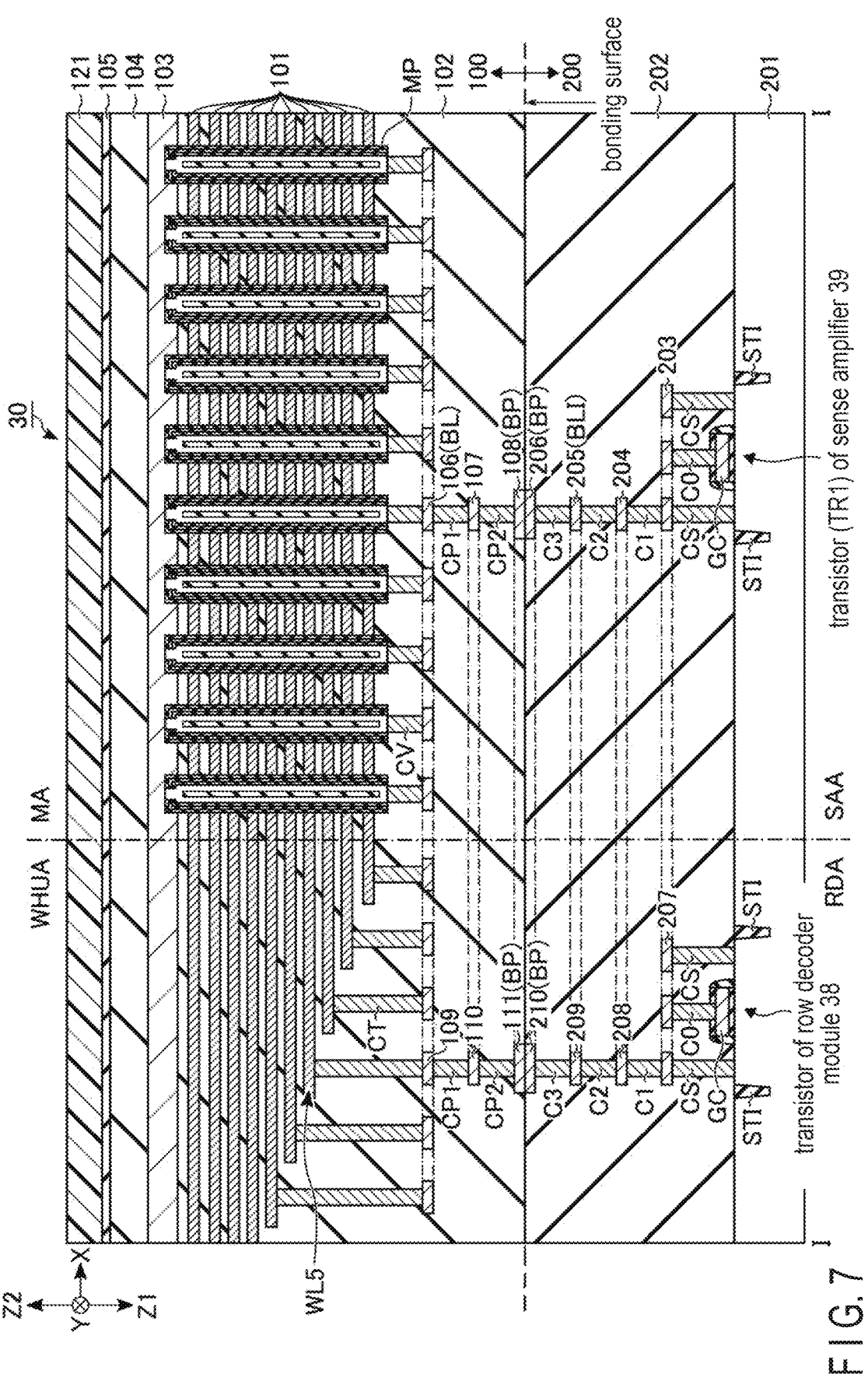
FIG. 7 is a sectional view illustrating an example of a sectional structure of the semiconductor memory device according to the first embodiment.

FIG. 7 is a sectional view illustrating an example of the sectional structure of the NAND flash memory 30, taken along line I-I in FIG. 5 and FIG. 6. FIG. 7 illustrates a structure of the array chip 100 and the circuit chip 200 bonded together.

First, the array chip 100 will be described.

As illustrated in FIG. 7, the array chip 100 includes a plurality of wiring layers 101, insulating layers 102, a wiring layer 103, insulating layers 104 and 105, a passivation layer 121, a plurality of contact plugs CV, CT, CP1, and CP2, wiring layers 106, 107, 109, and 110, bonding pads 108 and 111, and a plurality of memory pillars MP.

In the cell area MA, which is shown inverted in FIG. 7, the plurality of (in this example, ten) wiring layers 101 are stacked in the Z direction being separated from one another. The wiring layers 101 function as the word lines WL and the selection gate lines SGD and SGS. Between the wiring layers 101, insulating layers 102 are provided. Over an uppermost wiring layer 101, an insulating layer 103 is provided. Under a lowermost wiring layer 101, an insulating layer 102 is provided. The wiring layers 101 are made of a conductive material. The conductive material may be, for example, a metallic material, a p-type semiconductor, or an n-type semiconductor. The insulating layers 102 are made of an insulating material and contain, for example, silicon oxide (SiO).

Over an uppermost insulating layer 102, the wiring layer 103 is provided. The wiring layer 103 is formed in, for example, a plate shape extending in an XY-plane and functions as the source line SL. The wiring layer 103 is made of a conductive material and contains, for example, phosphorus-doped silicon, tungsten silicide, or titanium nitride.

Over the wiring layer 103, the insulating layer 104 is provided. The insulating layer 104 is made of an insulating material and contains, for example, silicon oxide.

Over the insulating layer 104, the insulating layer 105 is provided. The insulating layer 105 is made of an insulating material and contains, for example, silicon oxide.

Over the insulating layer 105, the passivation layer 121 is provided. The passivation layer 121 contains, for example, polyimide.

The plurality of memory pillars MP extends in the Z direction, penetrating the plurality of wiring layers 101 and the insulating layers 102. End portions of the memory pillars MP in the Z2 direction are in contact with the wiring layer 103. The plurality of memory pillars MP each include, for example, a semiconductor film and an insulating film. The semiconductor film is in contact with the wiring layer 103. One memory pillar MP corresponds to one NAND string NS. The memory pillars MP will be described later in detail. End portions of the memory pillars MP in the Z1 direction are connected to the wiring layers 106 via the contact plugs CV. The wiring layers 106 electrically connected to the plurality of memory pillars MP function as the bit lines BL. The contact plugs CV are made of a conductive material. The conductive material may be, for example, a metallic material, a p-type semiconductor, or an n-type semiconductor. The wiring layers 106 are made of a conductive material. The conductive material may be, for example, a metallic material, a p-type semiconductor, or an n-type semiconductor.

For example, the wiring layers 106 are electrically connected to the bonding pads 108 via the contact plugs CP1, the wiring layers 107, and the contact plugs CP2. The bonding pads 108 are used for connection to the circuit chip 200. The contact plugs CP1 and CP2 are made of a conductive material. The conductive material may be, for example, a metallic material, a p-type semiconductor, or an n-type semiconductor. The wiring layers 107 are made of a conductive material. The conductive material may be, for example, a metallic material, a p-type semiconductor, or an n-type semiconductor. The bonding pads 108 are made of a conductive material. The conductive material may be, for example, a metallic material. The bonding pads 108 contain, for example, copper (Cu).

In the word line hook-up areas WHUA, terrace portions of the plurality of wiring layers 101 are provided in a staircase pattern. In the Z1 direction, the contact plugs CT are provided on the respective terrace portions of the plurality of wiring layers 101. In the Z1 direction, the contact plugs CT are connected to the wiring layers 109. For example, the wiring layers 109 are electrically connected to the bonding pads 111 via the contact plugs CP1, the wiring layers 110, and the contact plugs CP2. The bonding pads 111 are used for connection to the circuit chip 200. The contact plugs CT are made of a conductive material. The conductive material may be, for example, a metallic material, a p-type semiconductor, or an n-type semiconductor. The wiring layers 109 and 110 are made of a conductive material. The conductive material may be, for example, a metallic material, a p-type semiconductor, or an n-type semiconductor. The bonding pads 111 are made of a conductive material. The conductive material may be, for example, a metallic material. The bonding pads 111 contain, for example, copper.

Figure 8:
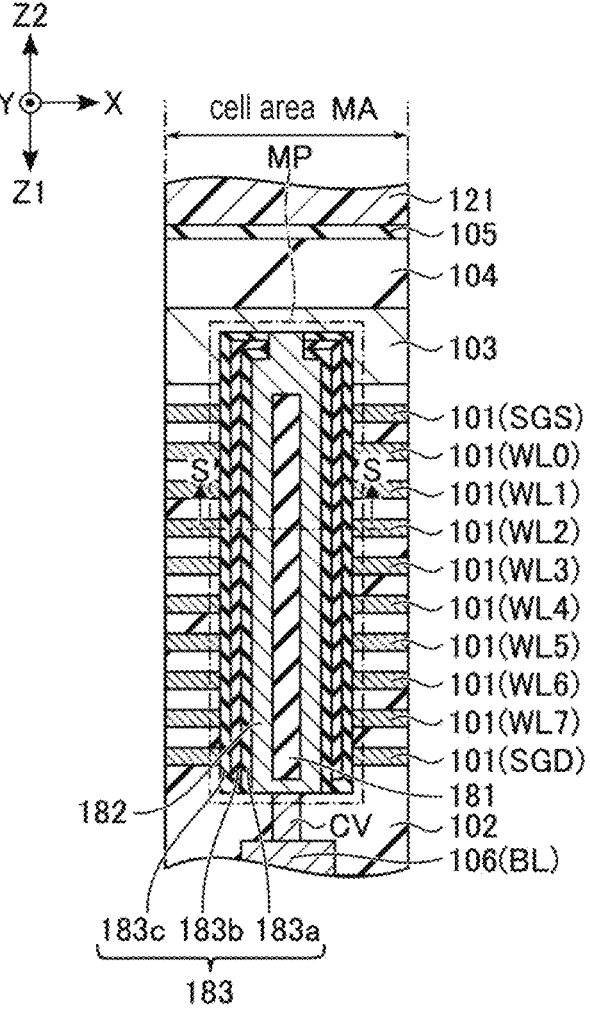
FIG. 8 is a sectional view of a memory pillar and its vicinity in a cell area of the array chip in the semiconductor memory device according to the first embodiment.

FIG. 8 is a sectional view of a memory pillar MP and its vicinity in the cell area MA of the array chip 100. Note that FIG. 8 omits the contact plugs CP1 and CP2, the wiring layers 107, and the bonding pads 108.

A portion where the memory pillar MP and a wiring layer 101 that is the selection gate line SGS, intersect each other functions as a selection transistor ST2. A portion where the memory pillar MP and one of a plurality of wiring layers 101 that is a corresponding one of the word lines WL0 to WL7, intersect each other functions as one memory cell transistor MC. A portion where the memory pillar MP and a wiring layer 101 that is the selection gate line SGD, intersect each other functions as a selection transistor ST1.

The memory pillar MP includes, for example, a core film 181, a semiconductor film 182, and a layered film 183.

The core film 181 extends along the Z direction. For example, in the Z2 direction, a lower end of the core film 181 is located lower than the lowermost wiring layer 101, and an upper end of the core film 181 is located lower than the wiring layer 103. The core film 181 is made of an insulating material and contains, for example, silicon oxide.

The semiconductor film 182 surrounds the core film 181. At an upper end of the memory pillar MP in the Z2 direction, the semiconductor film 182 is in partial contact with the wiring layer 103. The semiconductor film 182 functions as a channel of each of the memory cell transistors MC and the selection transistors ST1 and ST2. The semiconductor film 182 contains, for example, silicon.

The layered film 183 covers a lateral surface and bottom surface of the semiconductor film 182 except at a portion where the semiconductor film 182 and the wiring layer 103 are in contact with each other. The layered film 183 is, for example, a layered film in which a first insulating layer 183a, a second insulating layer 183b, and a third insulating layer 183c are stacked in this order.

Figure 9:
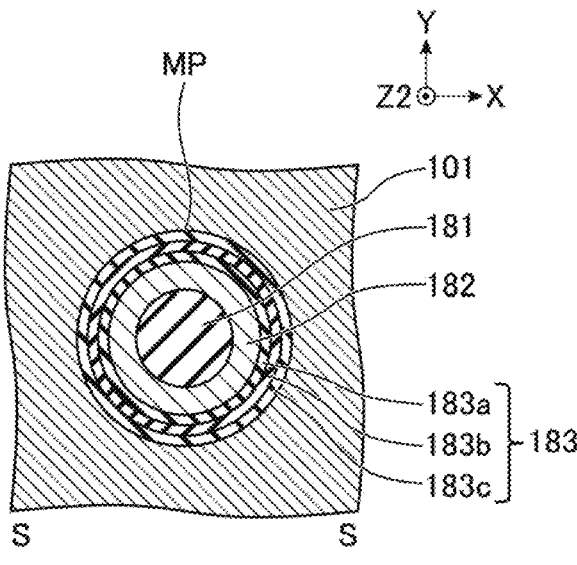
FIG. 9 is a sectional view illustrating an example of a sectional structure of a memory pillar included in the semiconductor memory device according to the first embodiment.

FIG. 9 is a sectional view taken along line S-S in FIG. 8, illustrating an example of a sectional structure of the memory pillar MP. Specifically, FIG. 9 illustrates a sectional structure of the memory pillar MP in a layer that is parallel to an XY-plane and includes a wiring layer 101.

The first insulating layer 183a surrounds the semiconductor film 182. The first insulating layer 183a functions as tunnel insulating films of the memory cell transistors MC. The first insulating layer 183a is made of an insulating material and contains, for example, silicon oxide or silicon oxynitride. The second insulating layer 183b surrounds the first insulating layer 183a. The second insulating layer 183b functions as charge accumulation layers of the memory cell transistors MC. The second insulating layer 183b is made of an insulating material and contains, for example, silicon nitride. The third insulating layer 183c surrounds the second insulating layer 183b. The third insulating layer 183c functions as block insulating films of the memory cell transistors MC. The third insulating layer 183c is made of an insulating material and contains, for example, silicon oxide or aluminum oxide. The wiring layer 101 surrounds the third insulating layer 183c.

Next, the circuit chip 200 will be described.

As illustrated in FIG. 7, the circuit chip 200 includes a semiconductor substrate 201, an insulating layer 202, wiring layers GC, 203 to 205, and 207 to 209, contact plugs CS and C0 to C3, and bonding pads 206 and 210. FIG. 7 also illustrates one of a plurality of transistors of the sense amplifier 39 provided in the sense amplifier area SAA and one of a plurality of transistors of the row decoder module 38 provided in the row decoder areas RDA.

The semiconductor substrate 201 is used to form the circuit chip 200 and contains, for example, a P-type impurity. The semiconductor substrate 201 also includes a plurality of well areas not illustrated. In the plurality of well areas, for example, transistors are formed. The plurality of well areas are isolated from one another by, for example, shallow trench isolation (ST1). Over the semiconductor substrate 201, the insulating layer 202 is provided. The insulating layer 202 is made of an insulating material and contains, for example, silicon oxide.

In the sense amplifier area SAA, on the semiconductor substrate 201, the wiring layers GC are provided via gate insulating films. The wiring layers GC in the sense amplifier area SAA are used as, for example, gate electrodes of transistors TR1 described later included in the sense amplifier 39. A contact plug C0 is provided for a gate of each transistor TR1 on a wiring layer GC, and two contact plugs CS are provided for a source and a drain of each transistor on the semiconductor substrate 201. For example, upper surfaces of the contact plugs CS and an upper surface of the contact plug C0 are flush with one another.

In the sense amplifier area SAA, one wiring layer 203 is provided on each of the contact plugs CS and the contact plugs C0. On each wiring layer 203, a contact plug C1 is provided. On the contact plug C1, a wiring layer 204 is provided. On the wiring layer 204, a contact plug C2 is provided. On the contact plug C2, a wiring layer 205 is provided. The wiring layer 205 functions as a line BLI (described later) that is included in the sense amplifier 39. On the wiring layer 205, a contact plug C3 is provided. On the contact plug C3, a bonding pad 206 is provided. The bonding pad 206 is used for connection to the array chip 100. The bonding pad 206 is bonded together with a bonding pad 108 of the array chip 100. The sense amplifier area SAA includes a plurality of transistors (not shown) having the same structure as the transistor TR1 of the sense amplifier 39 illustrated in FIG. 7. The wiring layers 203 to 205 are made of a conductive material. The conductive material may be, for example, a metallic material, a p-type semiconductor, or an n-type semiconductor. The contact plugs CS and C0 to C3 are made of a conductive material. The conductive material may be, for example, a metallic material, a p-type semiconductor, or an n-type semiconductor. The bonding pad 206 is made of a conductive material. The conductive material may be, for example, a metallic material. The bonding pad 206 contains, for example, copper.

In the row decoder areas RDA, on the semiconductor substrate 201, the wiring layers GC are provided via gate insulating films. The wiring layers GC in the row decoder areas RDA are used as, for example, gate electrodes of transistors included in the row decoder module 38. A contact plug C0 is provided on a wiring layer GC for a gate of the transistor TR, and two contact plugs CS are provided on the semiconductor substrate 201 for a source and a drain of the transistor TR.

In the row decoder areas RDA, one wiring layer 207 is provided on each of the contact plugs CS and the contact plugs C0. On each wiring layer 207, a contact plug C1 is provided. On the contact plug C1, a wiring layer 208 is provided. On the wiring layer 208, a contact plug C2 is provided. On the contact plug C2, a wiring layer 209 is provided. On the wiring layer 209, a contact plug C3 is provided. On the contact plug C3, a bonding pad 210 is provided. The bonding pad 210 is used for connection to the array chip 100. The bonding pad 210 is bonded together with a bonding pad 111 of the array chip 100. The row decoder areas RDA includes a plurality of transistors (not shown) having the same structure as the transistor of the row decoder module 38 illustrated in FIG. 7. The wiring layers 207 to 209 are made of a conductive material. The conductive material may be, for example, a metallic material, a p-type semiconductor, or an n-type semiconductor. The bonding pad 210 is made of a conductive material. The conductive material may be, for example, a metallic material. The bonding pad 210 contains, for example, copper.

1.1.8 Configuration of Sense Amplifier

With reference to FIG. 10, a configuration of the sense amplifier 39 will be described. FIG. 10 is a block diagram illustrating an example of the configuration of the sense amplifier 39. FIG. 10 also illustrates the data bus circuit 40.

As illustrated in FIG. 10, the sense amplifier 39 includes sense amplifier units SAU0 to SAUm and latch circuits XDL0 to XDLm. The sense amplifier units SAU0 to SAUm and the latch circuits XDL0 to XDLm are associated with the bit lines BL0 to BLm, respectively. Hereinafter, when the sense amplifier units SAU0 to SAUm are not distinguished from one another, the sense amplifier units SAU0 to SAUm will be simply referred to as sense amplifier units SAU. When the latch circuits XDL0 to XDLm are not distinguished from one another, the latch circuits XDL0 to XDLm will be simply referred to as latch circuits XDL.

The sense amplifier units SAU are, for example, sense amplifier units of a current sense type that sense currents flowing through the bit lines BL.

The latch circuits XDL are circuits that temporarily store read data and data to be written. The latch circuits XDL are used for inputting/outputting data between the sense amplifier units SAU and the input/output circuit 31. The latch circuits XDL are connected to the respective sense amplifier units SAU through buses DBUS. Note that a plurality of sense amplifier units SAU may be connected to one latch circuit XDL. The latch circuits XDL are also connected to the data bus circuit 40 through respective data lines IO.

Next, an internal configuration of a sense amplifier unit SAU will be described. The sense amplifier unit SAU includes, for example, a sensing circuit SAC and latch circuits SDL, ADL, BDL, CDL, DDL, EDL, and FDL. The sensing circuit SAC and the latch circuits SDL, ADL, BDL, CDL, DDL, EDL, and FDL are connected to a bus LBUS in common.

In the reading operation, the sensing circuit SAC senses data stored in a memory connected to the corresponding bit line BL and determines whether the stored data is data "0" or data "1" (hereinafter referred to as "read data"). In the writing operation, the sensing circuit SAC applies a voltage to the bit line BL connected to a memory cell to be written based on data stored in the latch circuits DDL, EDL, FDL, and SDL.

The latch circuits SDL, ADL, BDL, and CDL are circuits that temporarily store read data and data to be written. For example, in the reading operation, data can be transferred from the sensing circuit SAC to any one of the latch circuits SDL, ADL, BDL, and CDL. In the writing operation, data can be transferred from a latch circuit XDL to any one of the latch circuits SDL, ADL, BDL, and CDL.

The latch circuit DDL is a circuit that temporarily stores a result of a first execution of the sensing described later. The latch circuit EDL is a circuit that temporarily stores a result of a second execution of the sensing described later. The latch circuit FDL is a circuit that temporarily stores a result of calculation between a value stored in the latch circuit DDL and a value stored in the latch circuit EDL. The latch circuit SDL is also used as a circuit that temporarily stores the result of calculation between the value stored in the latch circuit DDL and the value stored in the latch circuit EDL.

Note that the configuration of the sense amplifier unit SAU is not limited to this and can be subjected to various modifications. For example, the number of latch circuits included in the sense amplifier unit SAU can be modified based on the number of bits of data stored in one memory cell MC.

Next, with reference to FIG. 11, a circuit configuration of the sense amplifier 39 will be described. FIG. 11 is a circuit diagram illustrating an example of the circuit configuration of the sense amplifier 39. FIG. 11 illustrates one sense amplifier unit SAU included in the sense amplifier 39. The other sense amplifier units have the same configuration as in FIG. 11. In the following description, in a case where a source and a drain of a transistor do not need to be distinguished, any one of the source and the drain of the transistor will be referred to as "one end of the transistor," and the other of the source and the drain of the transistor will be referred to as the "other end of the transistor."

As illustrated in FIG. 11, the sense amplifier 39 includes a high-voltage n-channel MOS transistor TR1 corresponding to a sense amplifier unit SAU in addition to the configuration illustrated in FIG. 10. In other words, in the sense amplifier 39, the transistor TR1 is provided for each sense amplifier unit SAU.

One end of the transistor TR1 is connected to a corresponding bit line BL. The other end of the transistor TR1 is connected to a line BLI. To a gate of the transistor TR1, a control signal BLS is input. The control signal BLS is generated by, for example, the sequencer 35. For example, the transistor TR1 is used so that the sense amplifier unit SAU is not supplied with a high voltage.

The sense amplifier unit SAU includes the sensing circuit SAC, a precharge circuit LBP, a bus switch BSW, and the seven latch circuits SDL, ADL, BDL, CDL, DDL, EDL, and FDL.

First, a circuit configuration of the sensing circuit SAC will be described. The sensing circuit SAC includes n-channel MOS transistors TR2, TR3, TR5, TR7, TR9 to TR11, and TR13 to TR17, p-channel MOS transistors TR4, TR6, TR8, and TR12, and capacitive elements C21 and C22.

One end of the transistor TR2 is connected to the line BLI. The other end of the transistor TR2 is connected to a node SCOM. To a gate of the transistor TR2, a control signal BLC is input. The control signal BLC is generated by, for example, the sequencer 35. For example, the transistor TR2 is used to clamp the corresponding bit line BL at a voltage based on the control signal BLC.

One end of the transistor TR3 is connected to the node SCOM. The other end of the transistor TR3 is connected to one end of the transistor TR4. To a gate of the transistor TR3, a control signal BLX is input. The control signal BLX is generated by, for example, the sequencer 35.

The other end of the transistor TR4 is connected to a voltage supply line VHSA1. To the voltage supply line VHSA1, for example, a power voltage VCC is supplied, but the voltage supplied thereto is adjustable by a voltage driver (not shown). A gate of the transistor TR4 is connected to a node INV_S described later.

One end of the transistor TR5 is connected to the one end of the transistor TR4. The other end of the transistor TR5 is connected to a voltage supply line SRCGND1. To the voltage supply line SRCGND1, for example, a ground voltage VSS is supplied, but the voltage supplied thereto is adjustable by a voltage driver (not shown). A gate of the transistor TR5 is connected to the node INV_S.

One end of the transistor TR6 is connected to the node SCOM. The other end of the transistor TR6 is connected to one end of the transistor TR7. To a gate of the transistor TR6, a control signal BLP is input. The control signal BLP is generated by, for example, the sequencer 35.

The other end of the transistor TR7 is connected to a voltage supply line SRCGND2. To the voltage supply line SRCGND2, for example, the ground voltage VSS is supplied, but the voltage supplied thereto is adjustable by a voltage driver (not shown). A gate of the transistor TR7 is connected to a node INV_F described later.

One end of the transistor TR8 is connected to the one end of the transistor TR7. The other end of the transistor TR8 is connected to a voltage supply line VHSA2. To the voltage supply line VHSA2, for example, the power voltage VCC is supplied, but the voltage supplied thereto is adjustable by a voltage driver (not shown). A gate of the transistor TR8 is connected to the node INV_F.

One end of the transistor TR9 is connected to the node SCOM. The other end of the transistor TR9 is connected to a node SEN. To a gate of the transistor TR9, a control signal XXL is input. The control signal XXL is generated by, for example, the sequencer 35. The transistor TR9 is used to control a period during which data in a memory cell MC is sensed. The node SEN functions, in a data reading operation, as a sense node for sensing data in a memory cell MC as a target. More specifically, in the reading operation, electric charges stored in the node SEN included in the sense amplifier 39 is discharged to the bit line BL in accordance with an on-state or an off-state of the memory cell MC as a target. The sense amplifier 39 senses a voltage VSEN at the node SEN at this time to perform data reading.

One electrode of the capacitive element C21 is connected to the node SEN. To the other electrode of the capacitive element C21, a clock signal CLKSA is input.

One end of the transistor TR10 is connected to the node SEN. To the other end of the transistor TR10, a voltage VHLB is applied. The voltage VHLB is, for example, the power voltage VCC. To a gate of the transistor TR10, a control signal SPC is input. The control signal SPC is generated by, for example, the sequencer 35.

One end of the transistor TR11 is connected to the node SEN. The other end of the transistor TR11 is connected to a node ND1. A gate of the transistor TR11 is connected to a node INV_D described later.

One end of the transistor TR12 is connected to the node ND1. The other end of the transistor TR12 is connected to the node SEN. A gate of the transistor TR12 is connected to a node LAT_D described later.

One electrode of the capacitive element C22 is connected to the node ND1. To the other electrode of the capacitive element C22, the clock signal CLKSA is input.

The transistors TR11 and TR12 can connect the capacitive element C21 and the capacitive element C22 in parallel and function as a circuit that switches the connection/disconnection state of the capacitive element C21 and the capacitive element C22.

To one end of the transistor TR13, a voltage VLOP is applied. The voltage VLOP is, for example, the ground voltage VSS. The other end of the transistor TR13 is connected to one end of the transistor TR14. A gate of the transistor TR13 is connected to the node SEN.

The other end of the transistor TR14 is connected to the bus LBUS. To a gate of the transistor TR14, a control signal STB is input. The control signal STB is generated by, for example, the sequencer 35.

One end of the transistor TR15 is connected to the node SEN. The other end of the transistor TR15 is connected to the bus LBUS. To a gate of the transistor TR15, a control signal BLQ is input. The control signal BLQ is generated by, for example, the sequencer 35.

To one end of the transistor TR16, the voltage VLOP is applied. The other end of the transistor TR16 is connected to one end of the transistor TR17. A gate of the transistor TR16 is connected to the bus LBUS.

The other end of the transistor TR17 is connected to the node SEN. To a gate of the transistor TR17, a control signal LSL is input. The control signal LSL is generated by, for example, the sequencer 35.

Next, a circuit configuration of the precharge circuit LBP will be described. The precharge circuit LBP is a circuit that precharges the bus LBUS. The precharge circuit LBP includes an n-channel MOS transistor TR18.

One end of the transistor TR18 is connected to the bus LBUS. To the other end of the transistor TR18, a voltage VDDSA is applied. The voltage VDDSA is, for example, the power voltage VCC. To a gate of the transistor TR18, a control signal LPC is input. The control signal LPC is generated by, for example, the sequencer 35. When the transistor TR18 is in the on-state, the voltage VDDSA is applied to the bus LBUS. Thus, the bus LBUS is charged.

Next, a circuit configuration of the bus switch BSW will be described. The bus switch BSW is a switch that connects the bus LBUS and a bus DBUS. The bus switch BSW includes an n-channel MOS transistor TR19.

One end of the transistor TR19 is connected to the bus LBUS. The other end of the transistor TR19 is connected to the bus DBUS. To a gate of the transistor TR19, a control signal DSW is input. The control signal DSW is generated by, for example, the sequencer 35.

Next, circuit configurations of the latch circuits SDL, ADL, BDL, CDL, DDL, EDL, and FDL will be described.

The latch circuit SDL includes n-channel MOS transistors TR21 and TR22 and inverter circuits IV21 and IV22.

One end of the transistor TR21 is connected to the bus LBUS. The other end of the transistor TR21 is connected to the node INV_S. To a gate of the transistor TR21, a control signal ST1 is input. The control signal ST1 is generated by, for example, the sequencer 35.

One end of the transistor TR22 is connected to the bus LBUS. The other end of the transistor TR22 is connected to a node LAT_S. To a gate of the transistor TR22, a control signal STL is input. The control signal STL is generated by, for example, the sequencer 35.

An input terminal of the inverter circuit IV21 is connected to the node LAT_S. An output terminal of the inverter circuit IV21 is connected to the node INV_S.

An input terminal of the inverter circuit IV22 is connected to the node INV_S. An output terminal of the inverter circuit IV22 is connected to the node LAT_S.

The latch circuits ADL, BDL, and CDL have the same configuration as the latch circuit SDL.

The latch circuit DDL includes n-channel MOS transistors TR31 and TR32 and inverter circuits IV31 and IV32.

One end of the transistor TR31 is connected to the bus LBUS. The other end of the transistor TR31 is connected to the node INV_D. To a gate of the transistor TR31, a control signal DTI is input. The control signal DTI is generated by, for example, the sequencer 35.

One end of the transistor TR32 is connected to the bus LBUS. The other end of the transistor TR32 is connected to the node LAT_D. To a gate of the transistor TR32, a control signal DTL is input. The control signal DTL is generated by, for example, the sequencer 35.

An input terminal of the inverter circuit IV31 is connected to the node LAT_D. An output terminal of the inverter circuit IV31 is connected to the node INV_D.

An input terminal of the inverter circuit IV32 is connected to the node INV_D. An output terminal of the inverter circuit IV32 is connected to the node LAT_D.

The latch circuit EDL includes n-channel MOS transistors TR41 and TR42 and inverter circuits IV41 and IV42.

One end of the transistor TR41 is connected to the bus LBUS. The other end of the transistor TR41 is connected to a node INV_E. To a gate of the transistor TR41, a control signal ETI is input. The control signal ETI is generated by, for example, the sequencer 35.

One end of the transistor TR42 is connected to the bus LBUS. The other end of the transistor TR42 is connected to a node LAT_E. To a gate of the transistor TR42, a control signal ETL is input. The control signal ETL is generated by, for example, the sequencer 35.

An input terminal of the inverter circuit IV41 is connected to the node LAT_E. An output terminal of the inverter circuit IV41 is connected to the node INV_E.

An input terminal of the inverter circuit IV42 is connected to the node INV_E. An output terminal of the inverter circuit IV42 is connected to the node LAT_E.

The latch circuit FDL includes n-channel MOS transistors TR51 and TR52 and inverter circuits IV51 and IV52.

One end of the transistor TR51 is connected to the bus LBUS. The other end of the transistor TR51 is connected to the node INV_F. To a gate of the transistor TR51, a control signal FTI is input. The control signal FTI is generated by, for example, the sequencer 35.

One end of the transistor TR52 is connected to the bus LBUS. The other end of the transistor TR52 is connected to a node LAT_F. To a gate of the transistor TR52, a control signal FTL is input. The control signal FTL is generated by, for example, the sequencer 35.

An input terminal of the inverter circuit IV51 is connected to the node LAT_F. An output terminal of the inverter circuit IV51 is connected to the node INV_F.

An input terminal of the inverter circuit IV52 is connected to the node INV_F. An output terminal of the inverter circuit IV52 is connected to the node LAT_F.

As seen from the above, in the sense amplifier unit SAU, the sensing circuit SAC and the latch circuits SDL, ADL, BDL, CDL, DDL, EDL, and FDL are connected to the bus LBUS such that they can transmit and receive data to and from one another.

The latch circuit XDL has the same configuration as the latch circuit SDL.

Note that the circuit configuration of the sense amplifier 39 is not limited to this and can be subjected to various modifications. For example, the number of the transistors and connections thereof may be changed to perform the same operation.

1.2 Data Storage System

With reference to FIG. 12, an example of a data storage system will be described. FIG. 12 is a conceptual diagram illustrating an example of the data storage system. FIG. 12 illustrates an example of a threshold voltage distribution of memory cell transistors MC, assignment of data, and voltages used in the data reading operation. In a threshold voltage distribution chart to be referred to below, "NMCs" at its vertical axis represents the number of the memory cell transistors MC, and voltage at its horizontal axis represents voltages applied to gates of the memory cell transistors MC.

As illustrated in FIG. 12, in a case of TLC, in which one memory cell transistor MC stores data of three bits, a threshold voltage distribution that is formed by a plurality of memory cell transistors MC included in a cell unit CU can include eight states. Hereinafter, these eight states will be referred to as a state "S0," a state "S1," a state "S2," a state "S3," a state "S4," a state "S5," a state "S6," and a state "S7" in ascending order of threshold voltage.

In a state where the memory cell transistors MC are in an erased state, threshold voltages of the memory cell transistors MC are included in the state "S0." In a state where data is written into memory cell transistors MC, the threshold voltages of the memory cell transistors MC are included in any one of the states "S0" to "S7." To the states "S0" to "S7," mutually different data items of three bits are assigned. It is preferable that the assignment of items of data to two adjacent states be set such that the items of data differ in only one bit. An example of the assignment of the items of data to the eight states is listed below.

State "S0": data "111 (high bit/middle bit/low bit)"
State "S1": data "110"
State "S2": data "100"
State "S3": data "000"
State "S4": data "010"
State "S5": data "011"
State "S6": data "001"
State "S7": data "101"

Between each pair of adjacent states, a verify voltage used to check the data writing operation and a read voltage used in the data reading operation are set. Specifically, between the states "S0" and "S1," a verify voltage V1 and a read voltage R1 are set. Between the states "S1" and "S2," a verify voltage V2 and a read voltage R2 are set. Between the states "S2" and "S3," a verify voltage V3 and a read voltage R3 are set. Between the states "S3" and "S4," a verify voltage V4 and a read voltage R4 are set. Between the states "S4" and "S5," a verify voltage V5 and a read voltage R5 are set. Between the states "S5" and "S6," a verify voltage V6 and a read voltage R6 are set. Between the states "S6" and "S7," a verify voltage V7 and a read voltage R7 are set. The verify voltages V1 to V7 are preferably set to be higher than the respective read voltages R1 to R7.

The verify voltages V1 to V7 are associated with the respective states "S1" to "S7." In the writing operation, the NAND flash memory 30 performs the reading operation using a verify voltage (hereinafter, will be referred to as a "verifying operation") to check whether a threshold voltage of a memory cell transistor MC in which certain data is to be stored exceeds a verify voltage associated with the data. Then, when the sequencer 35 detects that the threshold voltage of the memory cell transistor MC exceeds the verify voltage associated with the data, the sequencer 35 completes the data writing operation on the memory cell transistor MC.

The read voltage R1 is used to distinguish between the state "S0" and the state "S1" or the states higher than the state "S1." The read voltage R2 is used to distinguish between the state "S1" or the state lower than the state "S1" and the state "S2" or the states higher than the state "S2." The read voltage R3 is used to distinguish between the state "S2" or the states lower than the state "S2" and the state "S3" or the states higher than the state "S3." The read voltage R4 is used to distinguish between the state "S3" or the states lower than the state "S3" and the state "S4" or the states higher than the state "S4." The read voltage R5 is used to distinguish between the state "S4" or the states lower than the state "S4" and the state "S5" or the states higher than the state "S5." The read voltage R6 is used to distinguish between the state "S5" or the states lower than the state "S5" and the state "S6" or the states higher than the state "S6." The read voltage R7 is used to distinguish between the state "S6" or the states lower than the state "S6" and the state "S7" or the states higher than the state "S7." In addition, a read pass voltage VREAD is set to be a voltage higher than the highest state. A memory cell transistor MC having a gate to which the read pass voltage VREAD is applied is brought to the on-state irrespective of data stored in the memory cell transistor MC.

In the reading operation, the NAND flash memory 30 uses at least one read voltage to determine to which of the states the threshold voltage of the memory cell transistor MC belongs. For example, low page data, which is a set of items of low bit data, is determined by reading operations using the read voltages R1 and R5. Middle page data, which is a set of items of middle bit data, is determined by reading operations using the read voltages R2, R4, and R6. High page data, which is a set of items of high bit data, is determined by reading operations using the read voltages R3 and R7. In a page reading operation using a plurality of read voltages, a computational process is executed as appropriate.

Note that, in a case where the memory cell transistors MC are TLC (hereinafter, will be referred to as a "TLC system"), another assignment of data may be used for the NAND flash memory 30. Furthermore, a storage system other than the TLC system may be used for the NAND flash memory 30. Other assignment of data can be used. For example, one memory cell transistor MC may store data of two bits or data of four or more bits. The operations described in the present specification can be executed irrespective of the data storage system or types of the assignment of data.

1.3 Writing Operation

Next, the writing operation will be described. In the following description, a word line WL that is selected in the writing operation will be referred to as a "word line WLsel." Memory cell transistors MC that are connected to the word line WLsel will be referred to as "memory cell transistors MCsel."

1.3.1 Overview of Writing Operation

Figures 13, 14:
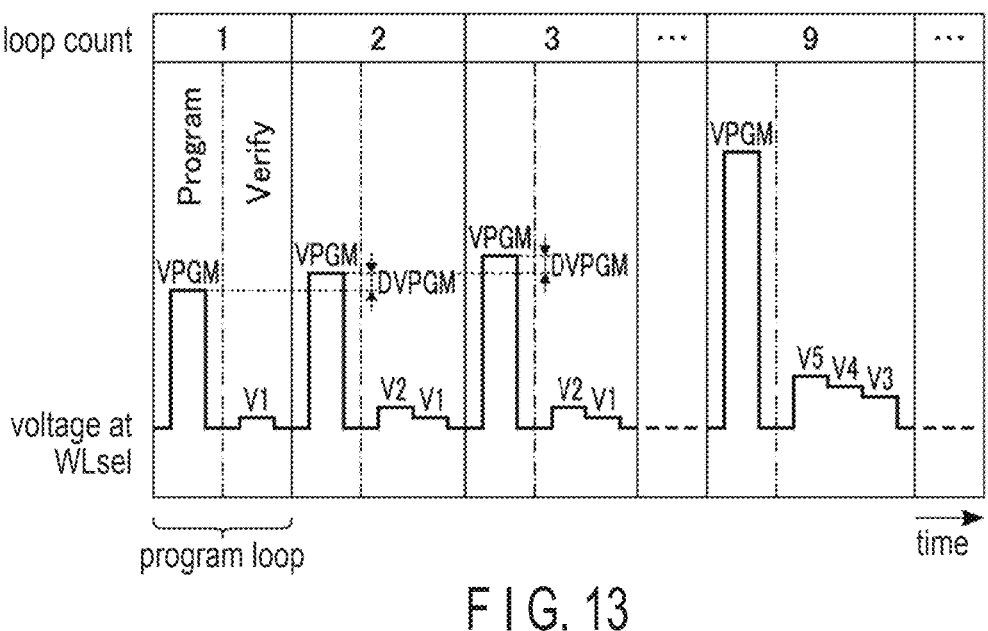
FIG. 13 is a timing chart illustrating an overview of a writing operation by the semiconductor memory device according to the first embodiment.
FIG. 14 is a table illustrating an example of program loops in the writing operation by the semiconductor memory device according to the first embodiment.

First, with reference to FIG. 13, an overview of the writing operation will be described. FIG. 13 is a timing chart illustrating the overview of the writing operation. As illustrated in FIG. 13, the NAND flash memory 30 repeatedly executes a program loop in the writing operation. FIG. 13 illustrates the number of executions of the program loop in the writing operation (hereinafter, will be referred to as "loop counts") and changes in a voltage at the word line WLsel (a voltage at WLsel). The program loop in each execution includes a program operation (Program) and a verifying operation (Verify). That is, in the writing operation, the program loop including the program operation and the verifying operation is repeatedly performed i times (i is an integer equal to or greater than two).

The program operation can raise threshold voltages of the memory cell transistors MC. In the program operation, a plurality of memory cell transistors MCsel connected to the word line WLsel are each set as a program target cell (program-target) or a program inhibited cell (program-inhibit) based on data to be written stored in sense amplifier units SAU associated with the plurality of memory cell transistors MCsel. Specifically, a memory cell transistor MCsel of which a threshold voltage has not reached a threshold voltage of a state of a writing target (hereinafter, will be referred to as a "write state") is set as a program target cell. On the other hand, a memory cell transistor MCsel of which a threshold voltage has reached the threshold voltage of the write state is set as a program inhibited cell.

In the program operation, a program voltage VPGM is applied to the word line WLsel. The program voltage VPGM is such a high voltage as to be capable of raising the threshold voltages of the memory cell transistors MCsel. For example, the program voltage VPGM is stepped up as the program loop is repeated. That is, the program voltage VPGM can increase in accordance with the number of executions of the program loop. A step-up width DVPGM of the program voltage VPGM can be set to any value. When the program voltage VPGM is applied to the word line WLsel, a threshold voltage of a memory cell transistor MCsel that is connected to the word line WLsel and connected to a program-target bit line BL is raised. For example, the program-target bit line BL is supplied with a low voltage. In response to application of the low voltage to the bit line BL (one end of the select transistor ST1) while a moderate voltage is supplied to the select gate line SGD (a gate of the select transistor ST1), the select transistor ST1 maintains an on-state, and the bit line BL is electrically connected with a channel of the NAND string NS. As a result, the memory cell transistor MCsel receives the program voltage VPGM while the low voltage is applied to the channel thereof, and the threshold voltage Vth of the memory cell transistor MCsel is increased. On the other hand, a threshold voltage of a memory cell transistor MCsel that is connected to the word line WLsel and connected to a program-inhibited bit line BL is prevented from being raised by self boosting technique or the like. For example, the program-inhibited bit line BL is supplied with a high voltage. In response to application of the high voltage to the bit line BL (the one end of the select transistor ST1) while the moderate voltage is supplied to the select gate line SGD (the gate of the select transistor ST1), the select transistor ST1 is turned into an off-state, and the bit line BL is electrically disconnected from the channel of the NAND string NS. As a result, even when the memory cell transistor MCsel receives the program voltage VPGM, as the voltage of the channel thereof being in a floating state is boosted, the threshold voltage Vth of the memory cell transistor MCsel is not increased. Hereinafter, in the program operation, an operation of raising a threshold voltage will be referred to as "writing of '0'" or simply referred to as "writing." On the other hand, an operation of maintaining a threshold voltage will be referred to as "writing of '1'" or "non-writing." A bit line corresponding to writing of "0" will be denoted as BL ("0"), and a bit line corresponding to writing of "1" will be denoted as BL ("1"). That is, a bit line BL ("0") is a bit line BL that is connected to a memory cell transistor MC being a writing target. A bit line BL ("1") is a bit line BL that is connected to a memory cell transistor MC being a non-writing target. When finishing the program operation, the sequencer 35 executes the verifying operation.

The verifying operation is a reading operation to check whether a threshold voltage of a memory cell transistor MCsel has reached a threshold voltage of a write state. The sequencer 35 executes, in the same program loop, the verifying operation on a memory cell transistor MCsel that is set as a program target cell, and of which a state is identical to a write state being a verifying target.

In the verifying operation, a sense amplifier unit SAU determines, based on a voltage at a bit line BL, whether a threshold voltage of a memory cell transistor MCsel has exceeded a verify voltage applied to a word line WLsel. As the verify voltage, for example, verify voltages associated with states being verifying targets in a program loop are applied in descending order of threshold voltages of the states. Each sense amplifier unit SAU determines a memory cell transistor MCsel of which a threshold voltage has exceeded the verify voltage, that is, the memory cell transistor MCsel that can be regarded as having reached the threshold voltage of the write state, as "verify pass." On the other hand, each sense amplifier unit SAU determines a memory cell transistor MCsel of which a threshold voltage is equal to or lower than the verify voltage, that is, the memory cell transistor MCsel that can be regarded as not having reached the threshold voltage of the write state, as "verify fail." Each sense amplifier unit SAU stores a result of the verification of the write state described above in any one of its latch circuits. When the verifying operation is completed, the sequencer 35 sets the memory cell transistors MCsel as program target cells or program inhibited cells based on a result of verification in a current program loop and starts a process of a next program loop.

Note that the NAND flash memory 30 can execute a detecting operation ("Detection") as appropriate after each program loop. In the detecting operation, the number of memory cell transistors MCsel that pass in the verifying operation is counted for each write state. The sequencer 35 then determines, for each write state, whether writing in the write state is completed, based on a value of the count. In the repetition of the program loop, for example, when detecting that the number of memory cell transistors MCsel that do not pass in verifying operations of the states "S1" to "S7" falls below a predetermined number, the sequencer 35 finishes the writing operation.

1.3.2 Specific Example of Program Loop

Next, with reference to FIG. 14, a specific example of the program loop will be described. FIG. 14 is a table illustrating an example of a setting of the program loop in the writing operation. The table illustrated in FIG. 14 shows a relation between loop counts and write states being verifying targets assigned to the loop counts, where cells with open circles denote that the verifying operation is set.

As illustrated in FIG. 14, types and the number of the write states being verifying targets can be changed in accordance with progress of the repetition of the program loop. In the present example, the sequencer 35 executes the program loop up to 19 times. In each of the 19 executions of the program loop, the sequencer 35 executes the verifying operation on at least one type of a state.

Specifically, the state "S1" is set as the verifying target in first to sixth executions of the program loop. The state "S2" is set as the verifying target in second to eighth executions of the program loop. The state "S3" is set as the verifying target in fourth to tenth executions of the program loop. The state "S4" is set as the verifying target in sixth to twelfth executions of the program loop. The state "S5" is set as the verifying target in eighth to fourteenth executions of the program loop. The state "S6" is set as the verifying target in tenth to sixteenth executions of the program loop. The state "S7" is set as the verifying target in twelfth to nineteenth executions of the program loop.

In the first execution of the program loop, the verify voltage V1 associated with the state "S1" is applied. In the second to third executions of the program loop, the verify voltage V2 associated with the state "S2" and the verify voltage V1 associated with the state "S1" are applied in this order. Similarly, in the fourth to fifth executions of the program loop, the verify voltage V3, the verify voltage V2, and the verify voltage V1 are applied in this order. In the sixth execution of the program loop, the verify voltage V4, the verify voltage V3, the verify voltage V2, and the verify voltage V1 are applied in this order. In the seventh execution of the program loop, the verify voltage V4, the verify voltage V3, and the verify voltage V2 are applied in this order. In the eighth execution of the program loop, the verify voltage V5, the verify voltage V4, the verify voltage V3, and the verify voltage V2 are applied in this order. In the ninth execution of the program loop, the verify voltage V5, the verify voltage V4, and the verify voltage V3 are applied in this order. In the tenth execution of the program loop, the verify voltage V6, the verify voltage V5, the verify voltage V4, and the verify voltage V3 are applied in this order. In the eleventh execution of the program loop, the verify voltage V6, the verify voltage V5, and the verify voltage V4 are applied in this order. In the twelfth execution of the program loop, the verify voltage V7, the verify voltage V6, the verify voltage V5, and the verify voltage V4 are applied in this order. In the thirteenth to fourteenth executions of the program loop, the verify voltage V7, the verify voltage V6, and the verify voltage V5 are applied in this order. In the fifteenth to sixteenth executions of the program loop, the verify voltage V7 and the verify voltage V6 are applied in this order. In the seventeenth to nineteenth executions of the program loop, the verify voltage V7 is applied.

Note that the number of times the NAND flash memory 30 can execute the program loop in one writing operation may be a different number. The sequencer 35 can finish the writing operation with a predetermined number of executions of the program loop even when the writing is not completed in all of the write states. Another setting may be used for the write states being verifying targets associated with the loop counts. Based on a result of the detecting operation, the sequencer 35 may omit the program operation and the verifying operation of the write states for the next and subsequent executions of the program loop.

1.3.3 Details of Writing Operation

Next, the writing operation will be described in detail.

Figure 15:
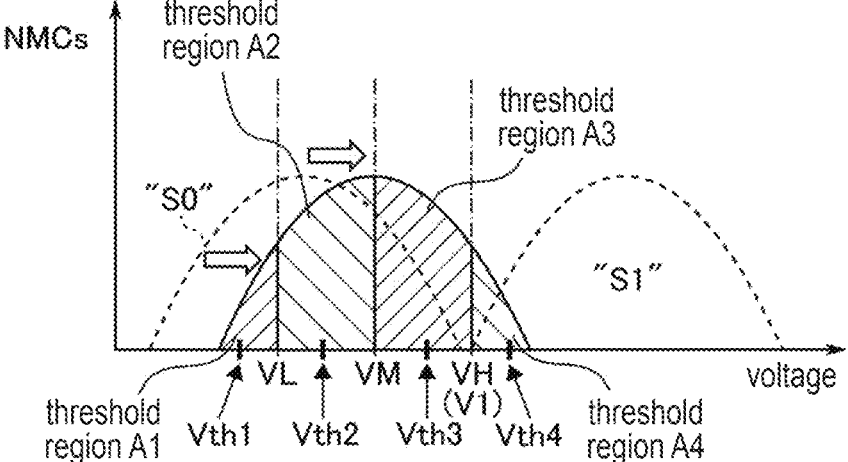
FIG. 15 is a diagram for describing a relation between three verify voltages that can be used for each write state and a threshold voltage distribution in the writing operation by the semiconductor memory device according to the first embodiment.

FIG. 15 is a diagram for describing a relation between three verify voltages that can be used for each write state and a threshold voltage distribution in the writing operation. An example illustrated in FIG. 15 shows a case where all the memory cell transistors MCsel are written from the state "S0" to the state "S1."

As illustrated in FIG. 15, in the present embodiment, verify voltages VL, VM, and VH used in the verifying operation are set for each write state. The verifying operation includes a VL sensing operation, a VM sensing operation, and a VH sensing operation. The VL sensing operation is an operation of determining whether a threshold voltage of each memory cell transistor MCsel is equal to or higher than the verify voltage VL. The VM sensing operation is an operation of determining whether the threshold voltage of each memory cell transistor MCsel is equal to or higher than the verify voltage VM. The VH sensing operation is an operation of determining whether the threshold voltage of each memory cell transistor MCsel is equal to or higher than the verify voltage VH. The verify voltage VH is one of the verify voltages that are described with reference to FIG. 12. In the example illustrated in FIG. 15, VH=V1. The verify voltages VL, VM, and VH have the relationship VL<VM<VH. That is, the VM sensing operation is a sensing operation on a voltage level VM. The VH sensing operation is a sensing operation on a voltage level VH, which is higher than the voltage level VM. The VL sensing operation is a sensing operation on a voltage level VL, which is lower than the voltage level VM.

Hereinafter, in a threshold voltage distribution illustrated in FIG. 15, a region where the threshold voltage is lower than the voltage VL will be referred to as a "threshold region A1," a region where the threshold voltage is equal to or higher than the voltage VL and lower than the voltage VM will be referred to as a "threshold region A2," a region where the threshold voltage is equal to or higher than the voltage VM and lower than the voltage VH will be referred to as a "threshold region A3," and a region where the threshold voltage is equal to or higher than the voltage VH will be referred to as a "threshold region A4." A threshold voltage of a memory cell transistor MCsel included in the threshold region A1 will be referred to as a "threshold voltage Vth1." A threshold voltage of a memory cell transistor MCsel included in the threshold region A2 will be referred to as a "threshold voltage Vth2." A threshold voltage of a memory cell transistor MCsel included in the threshold region A3 will be referred to as a "threshold voltage Vth3." A threshold voltage of a memory cell transistor MCsel included in the threshold region A4 will be referred to as a "threshold voltage Vth4." The threshold voltages Vth1, Vth2, Vth3, and Vth4 have the relationship Vth1<Vth2<Vth3<Vth4.

A threshold voltage of a memory cell transistor MCsel that fails in the VL sensing operation does not reach the verify voltage VH of the write state, and thus the memory cell transistor MCsel is set as a program target cell in the next program loop. In this case, the program operation to which a program condition in which an amount of change in the threshold voltage of the memory cell transistor MC is relatively large (hereinafter, will be referred to as a "first program condition") is applied (hereinafter, will be referred to as a "first program operation") is executed.

A threshold voltage of a memory cell transistor MCsel that passes in the VL sensing operation but fails in the VM sensing operation does not reach the verify voltage VH of the write state, and thus the memory cell transistor MCsel is set as a program target cell in the next program loop. In this case, if the first program operation is executed on the memory cell transistor MCsel, the writing can be excessive. Therefore, the program operation to which a program condition in which the amount of change in the threshold voltage of the memory cell transistor MC is smaller than in the first program condition (hereinafter, will be referred to as a "second program condition") is applied (hereinafter, will be referred to as a "second program operation") is executed.

A threshold voltage of a memory cell transistor MCsel that passes in the VM sensing operation but fails in the VH sensing operation does not reach the verify voltage VH of the write state, and thus the memory cell transistor MCsel is set as a program target cell in the next program loop. In this case, if the first program operation or the second program operation is executed on the memory cell transistor MCsel, the writing can be excessive. Therefore, the program operation to which a program condition in which the amount of change in the threshold voltage of the memory cell transistor MC is smaller than in the second program condition (hereinafter, will be referred to as a "third program condition") is applied (hereinafter, will be referred to as a "third program operation") is executed.

A threshold voltage of a memory cell transistor MCsel that passes in the VH sensing operation reaches the verify voltage VH of the write state, and thus the memory cell transistor MCsel is set as a program inhibited cell in the next program loop. In this case, the program operation of non-writing (hereinafter, will be referred to as a "fourth program operation") is executed.

In this manner, spread of the threshold voltage distribution is made small as compared with a case where the verifying operation is performed using two or fewer verify voltages for each write state.

Figure 16:
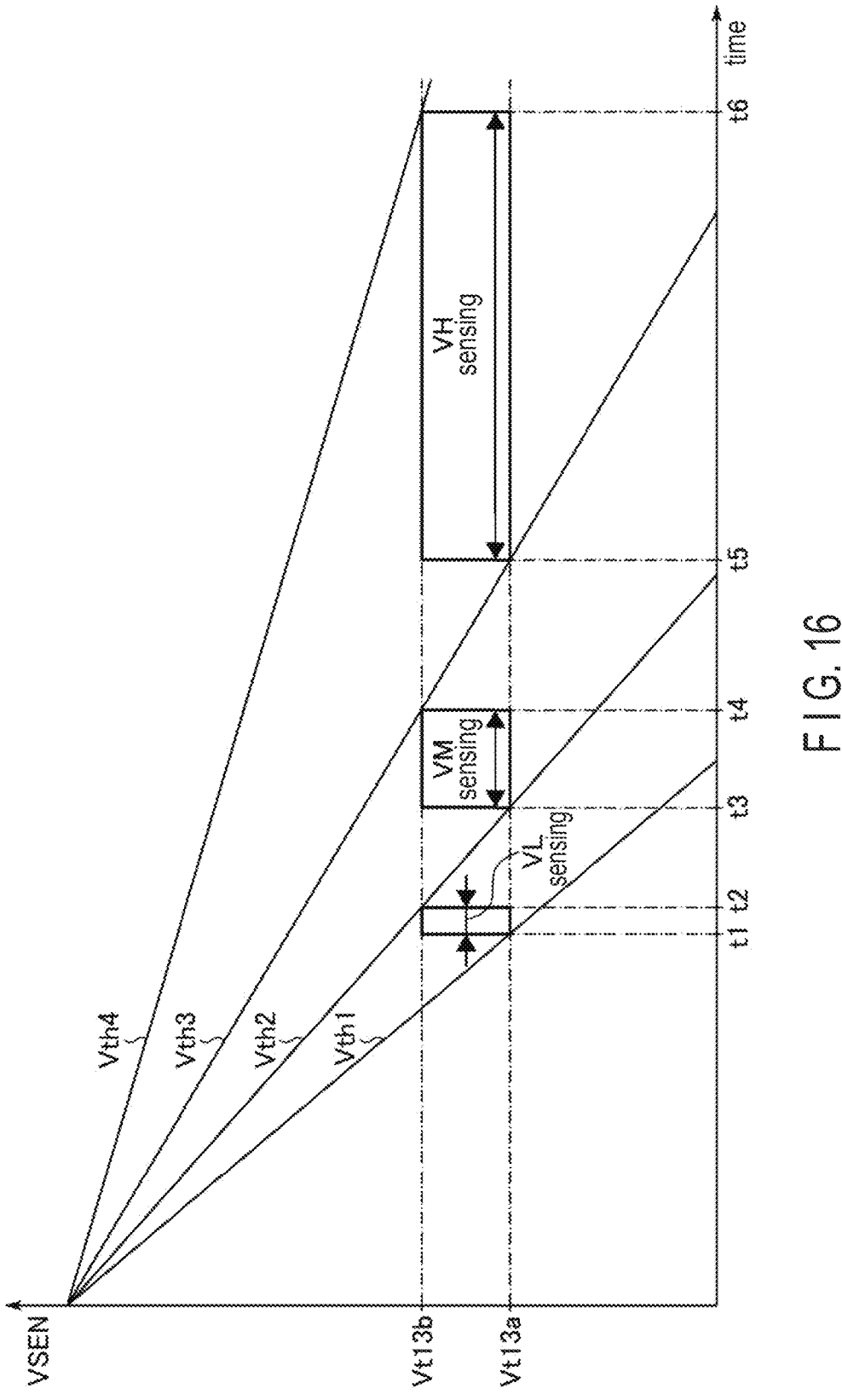
FIG. 16 is a graph illustrating changes in voltage at a sense node when electric charges in the sense node is discharged, with a voltage at a word line being kept constant, in the verifying operation.

FIG. 16 is a graph illustrating changes in a voltage VSEN at a node SEN when electric charges stored in the node SEN are discharged to the bit line BL, with a voltage at a word line WLsel being kept constant (e.g., a verify voltage VH corresponding to a write state), in the verifying operation. FIG. 16 illustrates the changes in the voltage VSEN in cases where a threshold voltage of a memory cell transistor MCsel connected to the node SEN is Vth1 to Vth4. In FIG. 16, its vertical axis represents the voltage VSEN, and its horizontal axis represents an elapsed time from start of the discharging. A capacitance of the node SEN is assumed to be a first capacitance value. It is assumed that a threshold voltage of the transistor TR13 of which the gate is connected to the node SEN can take on a value ranging from a voltage Vt13$a$ to a voltage Vt13$b$.

As illustrated in FIG. 16, the lower the threshold voltage of the memory cell transistor MCsel, the larger an amount of a decrease in the voltage VSEN when a certain period of time elapses from the start of the discharging. Therefore, in the verifying operation, data in the memory cell transistor MCsel can be sensed in the following manner, for example.

From a time point t1 to a time point t2, the data in the memory cell transistor MCsel is sensed. Thus, it is possible to determine whether the threshold voltage of the memory cell transistor MCsel is included in either the threshold region A1 or the threshold regions A2 to A4. That is, the VL sensing operation can be performed. When the threshold voltage of the memory cell transistor MCsel is lower than the voltage VL, the memory cell transistor MCsel is brought to the on-state (hereinafter, will be referred to as an "on cell"), and current flows from a corresponding bit line BL to the source line SL. Therefore, the voltage VSEN at the node SEN decreases relatively rapidly. Thus, the transistor TR13 is turned off. In this case, the threshold voltage of the memory cell transistor MCsel is determined as being included in the threshold region A1. When the threshold voltage of the memory cell transistor MCsel is equal to or higher than the voltage VL, the memory cell transistor MCsel is brought to the off-state (hereinafter, will be referred to as an "off cell"), and little current flows from the corresponding bit line BL to the source line SL. Therefore, the voltage VSEN at the node SEN decreases relatively slowly. Thus, the transistor TR13 is turned on. In this case, the threshold voltage of the memory cell transistor MCsel is determined as being included in the threshold regions A2 to A4.

From a time point t3 to a time point t4, the data in the memory cell transistor MCsel is sensed. Thus, it is possible to determine whether the threshold voltage of the memory cell transistor MCsel is included in either the threshold regions A1 to A2 or the threshold regions A3 to A4. That is, the VM sensing operation can be performed. When the threshold voltage of the memory cell transistor MCsel is lower than the voltage VM, the memory cell transistor MCsel becomes an on cell, and the voltage VSEN at the node SEN decreases relatively rapidly. Thus, the transistor TR13 is turned off. In this case, the threshold voltage of the memory cell transistor MCsel is determined as being included in the threshold regions A1 to A2. When the threshold voltage of the memory cell transistor MCsel is equal to or higher than the voltage VM, the memory cell transistor MCsel becomes an off cell, and the voltage VSEN at the node SEN decreases relatively slowly. Thus, the transistor TR13 is turned on. In this case, the threshold voltage of the memory cell transistor MCsel is determined as being included in the threshold regions A3 to A4.

From a time point t5 to a time point t6, the data in the memory cell transistor MCsel is sensed. Thus, it is possible to determine whether the threshold voltage of the memory cell transistor MCsel is included in either the threshold regions A1 to A3 or the threshold region A4. That is, the VH sensing operation can be performed. When the threshold voltage of the memory cell transistor MCsel is lower than the voltage VH, the memory cell transistor MCsel becomes an on cell, and the voltage VSEN at the node SEN decreases relatively rapidly. Thus, the transistor TR13 is turned off. In this case, the threshold voltage of the memory cell transistor MCsel is determined as being included in the threshold regions A1 to A3. When the threshold voltage of the memory cell transistor MCsel is equal to or higher than the voltage VH, the memory cell transistor MCsel becomes an off cell, and the voltage VSEN at the node SEN decreases relatively slowly. Thus, the transistor TR13 is turned on. In this case, the threshold voltage of the memory cell transistor MCsel is determined as being included in the threshold region A4.

In a case of performing the VL sensing operation from the time point t1 to the time point t2, performing the VM sensing operation from the time point t3 to the time point t4, and performing the VH sensing operation from the time point t5 to the time point t6, with the voltage at the word line WLsel being kept constant, the sensing is performed three times. In this case, the number of executions of the sensing increases as compared with the case where the verifying operation is performed using two or fewer verify voltages for each write state, and a time for the verifying operation increases.

In a case where three verify voltages are used for each write state, sensing margins narrow as compared with the case where the verifying operation is performed using two or fewer verify voltages for each write state.

Hence, in the present embodiment, the following operation is performed in the verifying operation after the voltage at the word line WLsel is set to a verify voltage VH corresponding to a write state. First, the VM sensing operation is performed. Next, based on a result of the VM sensing operation, the VH sensing operation and the VL sensing operation are performed simultaneously.

By performing the VM sensing operation, it is possible to determine whether the threshold voltage of the memory cell transistor MCsel is included in either the threshold regions A1 to A2 or the threshold regions A3 to A4.

To perform the VH sensing operation and the VL sensing operation simultaneously, a duration of discharging a node SEN connected to a memory cell transistor MCsel of which a threshold voltage is determined as being included in the threshold regions A1 to A2 in the VM sensing operation is made to match a duration of discharging a node SEN connected to a memory cell transistor MCsel of which a threshold voltage is determined as being included in the threshold regions A3 to A4 in the VM sensing operation.

For example, consider a case where a capacitance of a node SEN is set to a capacitance value larger than that in the example of FIG. 16 (the first capacitance value). In this case, a duration of discharging electric charges in the node SEN is longer than those in the example in FIG. 16. That is, times taken for the voltage VSEN to decrease to the voltages Vt13$a$ and Vt13$b$ are longer than those in the example in FIG. 16. Therefore, a capacitance of a node SEN connected to a memory cell transistor MCsel of which a threshold voltage is determined as being included in the threshold regions A1 to A2 is made larger than a capacitance of a node SEN connected to a memory cell transistor MCsel of which a threshold voltage is determined as being included in the threshold regions A3 to A4. Thus, the duration of discharging the former node SEN can be made to match the duration of discharging the latter node SEN.

FIG. 43 is a diagram illustrating a memory cell transistor MC and its typical electric properties. In FIG. 43, a diagram on the left illustrates the memory cell transistor MC, and a diagram on the right illustrates the typical electric properties of the memory cell transistor MC. In the right diagram, its vertical axis represents drain current Ids of the memory cell transistor MC, and its horizontal axis represents a gate-source voltage Vgs of the memory cell transistor MC.

As illustrated in the right diagram of FIG. 43, when a voltage is applied to a gate of a memory cell transistor MC, and the gate-source voltage Vgs exceeds a threshold voltage Vth of the memory cell transistor MC, the drain current Ids rapidly increases. Therefore, for example, in a case where a voltage Vgs1, which is higher than the threshold voltage Vth4, is applied as the voltage Vgs, a drain current Ids1 of the memory cell transistor MC of which a threshold voltage is Vth1, a drain current Ids2 of the memory cell transistor MC of which the threshold voltage is Vth2, a drain current Ids3 of the memory cell transistor MC of which the threshold voltage is Vth3, and a drain current Ids4 of the memory cell transistor MC of which the threshold voltage is Vth4 have the following relationship in magnitude: Ids1>Ids2>Ids3>Ids4.

Figure 17:
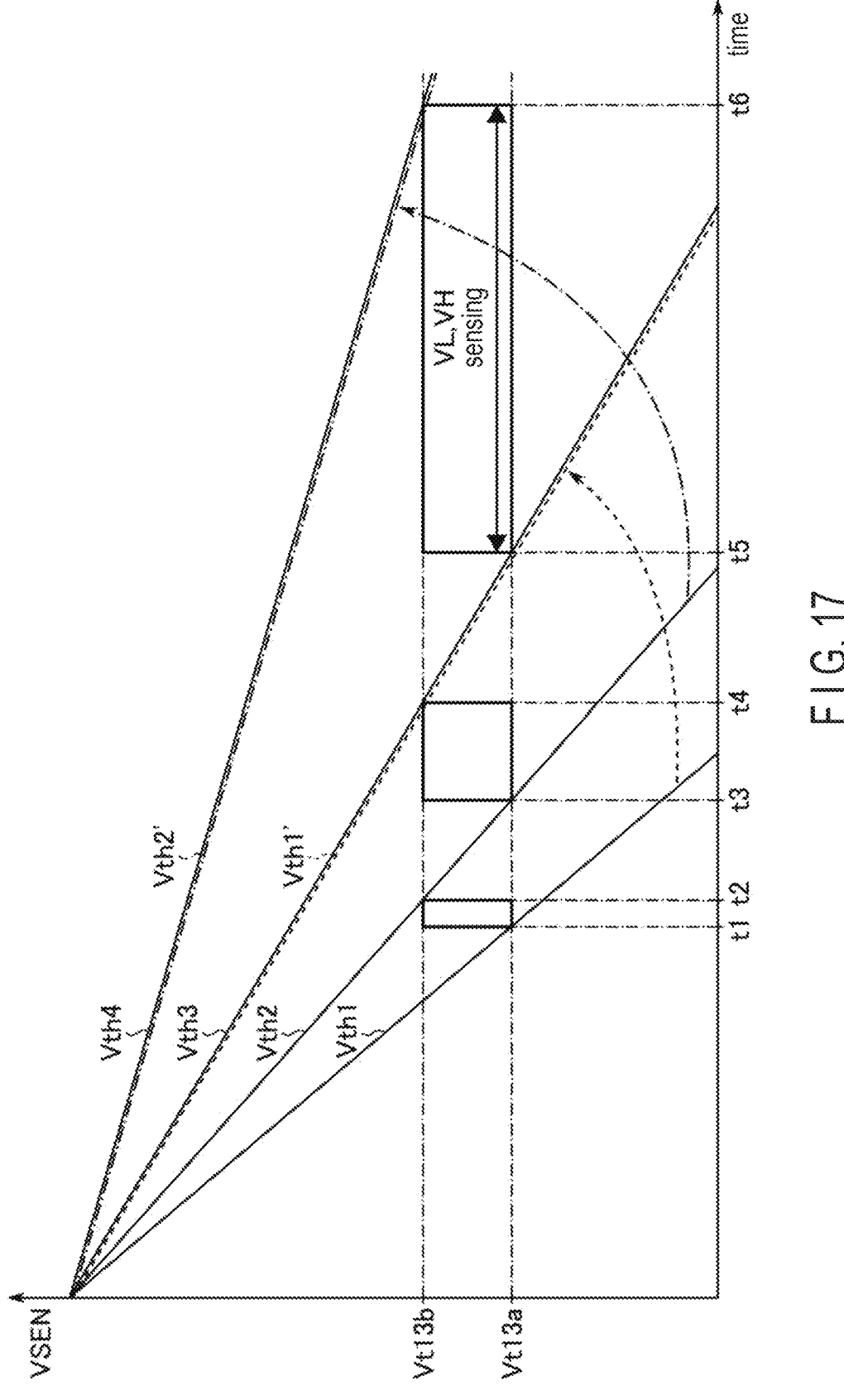
FIG. 17 is a graph illustrating changes in voltage at the sense node when electric charges in the sense node is discharged, with the voltage at the word line being kept constant, in the verifying operation.

FIG. 17 is a graph illustrating changes in a voltage VSEN at a node SEN when electric charges in the node SEN is discharged, with a voltage at a word line WLsel being kept constant, in the verifying operation. FIG. 17 illustrates a case where a duration of discharging a node SEN connected to a memory cell transistor MCsel of which a threshold voltage is included in the threshold regions A1 to A2 is made to match a duration of discharging a node SEN connected to a memory cell transistor MCsel of which a threshold voltage is included in the threshold regions A3 to A4. Solid lines represent changes in a voltage VSEN at a node SEN connected to a memory cell transistor MCsel of which a threshold voltage is included in the threshold regions A1 to A4 in a case where the capacitance of the node SEN is the first capacitance value. A broken line indicated by Vth1' represents a change in a voltage VSEN at a node SEN connected to a memory cell transistor MCsel of which a threshold voltage is included in the threshold region A1 in a case where the capacitance of the node SEN is a second capacitance value, which is larger than the first capacitance value. A chain line indicated by Vth2' represents a change in a voltage VSEN at a node SEN connected to a memory cell transistor MCsel of which a threshold voltage is included in the threshold region A2 in a case where the capacitance of the node SEN is the second capacitance value.

As illustrated in FIG. 17, a duration of discharging the node SEN is identical between a case where a threshold voltage of a memory cell transistor MCsel connected to the node SEN is Vth1' and a case where the threshold voltage of the memory cell transistor MCsel connected to the node SEN is Vth3. A duration of discharging the node SEN is identical between a case where a threshold voltage of a memory cell transistor MCsel connected to the node SEN is Vth2' and a case where the threshold voltage of the memory cell transistor MCsel connected to the node SEN is Vth4. Therefore, for example, it is possible to perform the VH sensing operation and the VL sensing operation from the time point t5 to the time point t6.

When a threshold voltage of a memory cell transistor MCsel is determined as being included in the threshold regions A3 to A4 in the VM sensing operation, a capacitance of the node SEN connected to the memory cell transistor MCsel is set to the first capacitance value. In this case, a sensing operation performed from the time point t5 to the time point t6 is the VH sensing operation. In a case where the memory cell transistor MCsel is an off cell, the VH sensing operation turns on a transistor TR13, and the threshold voltage of the memory cell transistor MCsel is determined as being included in the threshold region A4. In a case where the memory cell transistor MCsel is an on cell, the VH sensing operation turns off a transistor TR13, and the threshold voltage of the memory cell transistor MCsel is determined as being included in the threshold region A3.

On the other hand, when the threshold voltage of the memory cell transistor MCsel is determined as being included in the threshold regions A1 to A2 in the VM sensing operation, the capacitance of the node SEN connected to the memory cell transistor MCsel is set to the second capacitance value. In this case, a sensing operation performed from the time point t5 to the time point t6 is the VL sensing operation. In a case where the memory cell transistor MCsel is an off cell, the VL sensing operation turns on a transistor TR13, and the threshold voltage of the memory cell transistor MCsel is determined as being included in the threshold region A2. In a case where the memory cell transistor MCsel is an on cell, the VL sensing operation turns off a transistor TR13, and the threshold voltage of the memory cell transistor MCsel is determined as being included in the threshold region A1.

As seen from the above, in the present embodiment, the capacitance of the node SEN is changed based on a result of the VM sensing operation in the verifying operation.

For example, in a case where a ratio between the drain current Ids1 of the memory cell transistor MCsel of which the threshold voltage is Vth1 and the drain current Ids2 of the memory cell transistor MCsel of which the threshold voltage is Vth2 is substantially the same as a ratio between the drain current Ids3 of the memory cell transistor MCsel of which the threshold voltage is Vth3 and the drain current Ids4 of the memory cell transistor MCsel of which the threshold voltage is Vth4, capacitance values of the capacitive elements C21 and C22 are adjusted appropriately. Thus, it is possible to make a drain current Ids l' of a memory cell transistor MCsel of which a threshold voltage is Vth l' substantially the same as the drain current Ids3 of the memory cell transistor MCsel of which the threshold voltage is Vth3, and it is possible to make a drain current Ids2' of the memory cell transistor MCsel of which the threshold voltage is Vth2' substantially the same as the drain current Ids4 of the memory cell transistor MCsel of which the threshold voltage is Vth4. In other words, it is possible to make a sensing margin for a memory cell transistor MCsel being a target of the VL sensing operation and a sensing margin for a memory cell transistor MCsel being a target of the VH sensing operation correspond to each other. Thus, it is possible to simultaneously execute the VL sensing operation and the VH sensing operation subsequently to the VM sensing operation.

In the present embodiment, the sensing mentioned above is performed twice for each write state in the program loop. When the verifying operation (performing the sensing twice)

is performed for all the write states, any one of the first to fourth program operations is performed in the next program loop based on the result of the determination in the verifying operation.

1.3.4 Verifying Operation

Next, the verifying operation will be described with a focus on operation of the sense amplifier 39. The following description is about a case where the verify voltage V2 is applied to the word line WLsel in the verifying operation in the second execution of the program loop.

FIG. 18 is a timing chart illustrating an example of voltages at various lines and voltages of various signals in the verifying operation.

First, while the verify voltage V2 is applied to the word line WLsel, the sense amplifier 39 performs the VM sensing operation as the first execution of the sensing. FIG. 19 is a diagram for describing the operation of the sense amplifier 39 in the VM sensing operation.

As illustrated in FIG. 18, at a time point t11, a voltage at the word line WLsel is set to the voltage VSS. The voltage VSEN at the node SEN is set to the voltage VSS. The control signals SPC, XXL, and STB are set to a "Low" level (L level). The clock signal CLKSA is set to the L level. The node INV_D of the latch circuit DDL is set to the L level ("0"). That is, the node LAT_D of the latch circuit DDL is set to a "High" level (H level ("1")). The node INV_E of the latch circuit EDL is set to the L level ("0"). That is, the node LAT_E of the latch circuit EDL is set to the H level ("1"). As illustrated in FIG. 19, setting the node INV_D to the L level brings the transistors TR11 and TR12 to the off-state. That is, the capacitance of the node SEN becomes equal to a capacitance of the capacitive element C21.

As illustrated in FIG. 18, at the time point t11, the row decoder module 38 applies the verify voltage VH (V2) to the word line WLsel. Thus, the voltage at the word line WLsel becomes the voltage V2.

Next, at a time point t12, the control signal SPC is brought to the H level. Thus, as illustrated in FIG. 19, the transistor TR10 is brought to the on-state, and thus the voltage VHLB is applied to the node SEN. That is, as illustrated with an arrow with a solid line in FIG. 19, charging of the node SEN is started.

Next, as illustrated in FIG. 18, at a time point t13, the control signal SPC is brought to the L level. Thus, the charging of the node SEN is finished. At the time point t13, the clock signal CLKSA is brought to the H level. Thus, the capacitive element C21 is charged, and the voltage VSEN at the node SEN becomes higher than the voltage VHLB by an effect of capacitive coupling.

Next, at a time point t14, the control signal XXL is brought to the H level, and the control signals BLS and BLC are also brought to the H level, which are not illustrated. Thus, as illustrated in FIG. 19, the transistors TR9, TR2, and TR1 are brought to the on-state. Therefore, as illustrated with an arrow with a broken line in FIG. 19, discharging of electric charges stored in the node SEN to the bit line BL is started.

As illustrated in FIG. 18, in a case where a memory cell transistor MCsel connected to the bit line BL is an on cell, the voltage VSEN at the node SEN decreases relatively rapidly. On the other hand, in a case where the memory cell transistor MCsel connected to the bit line BL is an off cell, the voltage VSEN at the node SEN decreases relatively slowly.

Next, at a time point t15, the control signal XXL is brought to the L level, and the control signals BLS and BLC are also brought to the L level. Thus, the discharging to the bit line BL is finished. At the time point t15, the clock signal CLKSA is brought to the L level. Thus, in a case where the memory cell transistor MCsel connected to the bit line BL is an on cell, the voltage VSEN at the node SEN becomes VSS. On the other hand, in a case where the memory cell transistor MCsel connected to the bit line BL is an off cell, the voltage VSEN at the node SEN decreases.

Next, at a time point t16, the control signal STB is brought to the H level. The control signal DTI is also brought to the H level, which is not illustrated. Thus, the transistors TR14 and TR31 are brought to the on-state, and thus transfer of the data at the node SEN to the node INV_D is started. In a case where the memory cell transistor MCsel connected to the bit line BL is an on cell, the transistor TR13 is brought to the off-state. Thus, at a time point t17, the node INV_D becomes "1." On the other hand, in a case where the memory cell transistor MCsel connected to the bit line BL is an off cell, the transistor TR13 is brought to the on-state. Thus, at the time point t17, the node INV_D becomes "0."

Next, at a time point t18, the control signal STB is brought to the L level, and the control signal DTI is also brought to the L level. Thus, the transfer of the data at the node SEN to the node INV_D is finished. That is, the sense amplifier 39 stores a result of the first execution of the sensing in the latch circuit DDL.

Next, at a time point t19, the voltage VSEN at the node SEN is set to the voltage VSS. Thus, the VM sensing operation is finished.

Figure 20:
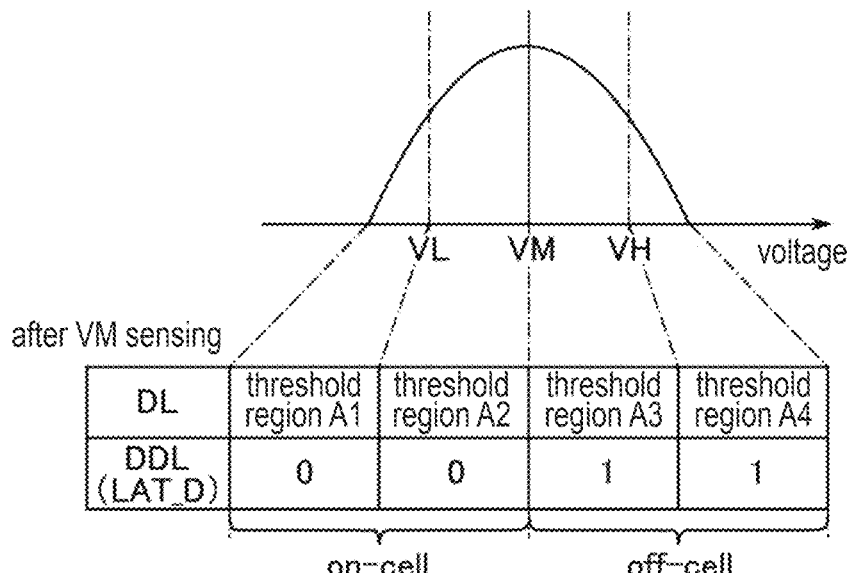
FIG. 20 is a diagram for describing a result of performing the middle voltage sensing operation as a first execution of sensing by the semiconductor memory device according to the first embodiment.

FIG. 20 is a diagram for describing a result of performing the VM sensing operation as the first execution of the sensing. As illustrated in FIG. 20, in a case where the memory cell transistor MCsel connected to the bit line BL is an on cell, the node LAT_D of the latch circuit DDL becomes "0." That is, the threshold voltage of the memory cell transistor MCsel connected to the bit line BL is determined as being included in the threshold regions A1 to A2. On the other hand, in a case where the memory cell transistor MCsel connected to the bit line BL is an off cell, the node LAT_D of the latch circuit DDL becomes "1." That is, the threshold voltage of the memory cell transistor MCsel connected to the bit line BL is determined as being included in the threshold regions A3 to A4.

Figure 21:
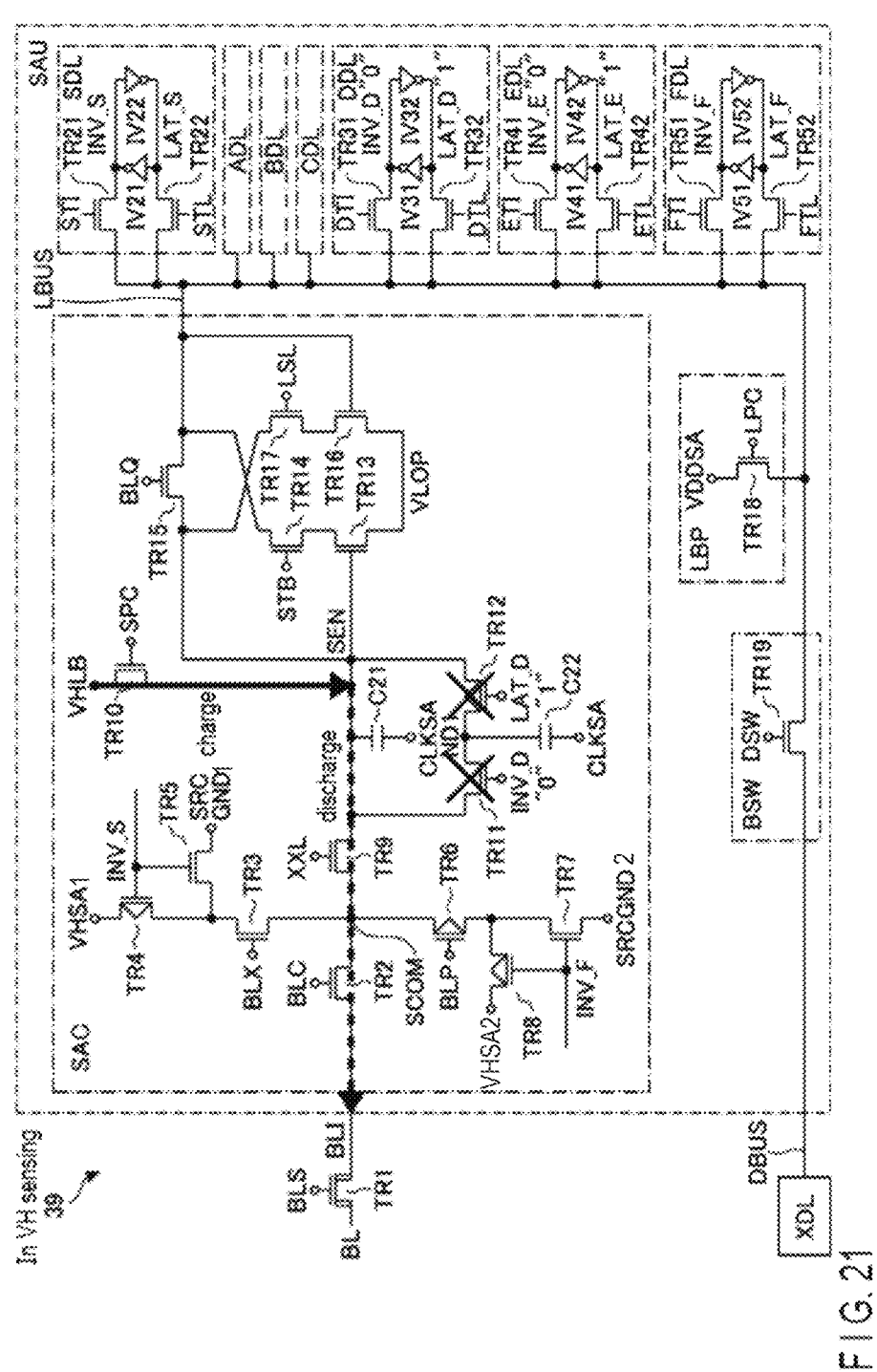
FIG. 21 is a diagram for describing a high voltage sensing operation of the sense amplifier of the semiconductor memory device according to the first embodiment.

Next, while the verify voltage V2 is applied to the word line WLsel, and after the result of the first execution of the sensing is stored in the latch circuit DDL, the sense amplifier 39 performs the VH sensing operation or the VL sensing operation as the second execution of the sensing. FIG. 21 is a diagram for describing the operation of the sense amplifier 39 in the VH sensing operation. FIG. 23 is a diagram for describing the operation of the sense amplifier 39 in the VL sensing operation.

In a case where the result of the VM sensing operation shows that the memory cell transistor MCsel is an off cell, the sense amplifier 39 performs the VH sensing operation as the second execution of the sensing. As illustrated in FIG. 18, at a time point t20, the node INV_D is at the L level ("0"). The node INV_E is at the L level ("0"). As illustrated in FIG. 21, setting the node INV_D to the L level brings the transistors TR11 and 12 to the off-state. That is, the capacitance of the node SEN becomes equal to a capacitance of the capacitive element C21. As illustrated in FIG. 18, at the time point t20, the control signal SPC is brought to the H level. Thus, as illustrated in FIG. 21, the transistor TR10 is brought to the on-state, and thus the voltage VHLB is applied to the node SEN. That is, as illustrated with an arrow with a solid line in FIG. 21, charging of the node SEN is started.

Next, as illustrated in FIG. 18, at a time point t21, the control signal SPC is brought to the L level. Thus, the charging of the node SEN is finished. At the time point t21, the clock signal CLKSA is brought to the H level. Thus, the voltage VSEN at the node SEN becomes higher than the voltage VHLB.

Next, at a time point t22, the control signal XXL is brought to the H level, and the control signals BLS and BLC are also brought to the H level. Thus, as illustrated in FIG. 21, the transistors TR9, TR2, and TR1 are brought to the on-state. Therefore, as illustrated with an arrow with a broken line in FIG. 21, discharging of electric charges stored in the node SEN to the bit line BL is started.

As illustrated in FIG. 18, in a case where a memory cell transistor MCsel connected to the bit line BL is an on cell, the voltage VSEN at the node SEN decreases relatively rapidly as illustrated with a solid line. On the other hand, in a case where the memory cell transistor MCsel connected to the bit line BL is an off cell, the voltage VSEN at the node SEN decreases relatively slowly as illustrated with a solid line.

Next, at a time point t23, the control signal XXL is brought to the L level, and the control signals BLS and BLC are also brought to the L level. Thus, the discharging to the bit line BL is finished. A duration of discharging, that is, a time during which the control signal XXL is at the H level is set to, for example, a time longer than a duration of discharging in the VM sensing operation. At the time point t23, the clock signal CLKSA is brought to the L level. Thus, in a case where the memory cell transistor MCsel connected to the bit line BL is an on cell, the voltage VSEN at the node SEN becomes VSS as illustrated with a solid line. On the other hand, in a case where the memory cell transistor MCsel connected to the bit line BL is an off cell, the voltage VSEN at the node SEN decreases as illustrated with a solid line.

Next, at a time point t24, the control signal STB is brought to the H level. The control signal ETI is also brought to the H level, which is not illustrated. Thus, the transistors TR14 and TR41 are brought to the on-state, and thus transfer of the data at the node SEN to the node INV_E is started. In a case where the memory cell transistor MCsel connected to the bit line BL is an on cell, the transistor TR13 is brought to the off-state. Thus, at a time point t25, the node INV_E becomes "1" as illustrated in a solid line. On the other hand, in a case where the memory cell transistor MCsel connected to the bit line BL is an off cell, the transistor TR13 is brought to the on-state. Thus, at the time point t25, the node INV_E becomes "0" as illustrated in a solid line.

Next, at a time point t26, the control signal STB is brought to the L level, and the control signal ETI is also brought to the L level. Thus, the transfer of the data at the node SEN to the node INV_E is finished. That is, the sense amplifier 39 stores a result of the second execution of the sensing in the latch circuit EDL.

Next, at a time point t27, the voltage VSEN at the node SEN is set to the voltage VSS. At the time point t27, the row decoder module 38 applies the voltage VSS to the word line WLsel. Thus, the voltage at the word line WLsel becomes the voltage VSS. Thus, the VH sensing operation is finished.

Figure 22:
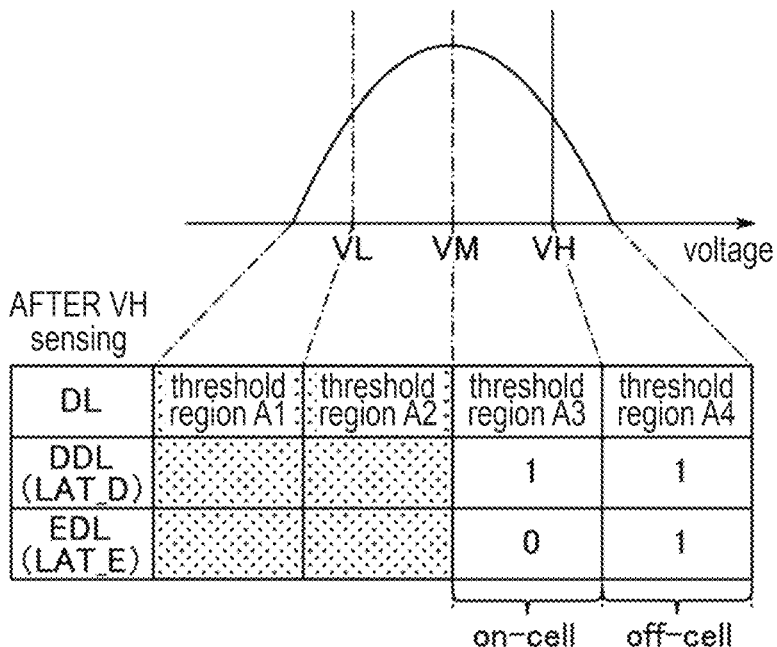
FIG. 22 is a diagram for describing a result of performing the high voltage sensing operation as a second execution of sensing by the semiconductor memory device according to the first embodiment.

FIG. 22 is a diagram for describing a result of performing the VM sensing operation as the first execution of the sensing and performing the VH sensing operation as the second execution of the sensing. As illustrated in FIG. 22, in a case where the memory cell transistor MCsel connected to the bit line BL is an on cell, the node LAT_E of the latch circuit EDL becomes "0." Since the node LAT_D of the latch circuit DDL is "1," the threshold voltage of the memory cell transistor MCsel connected to the bit line BL is determined as being included in the threshold region A3. On the other hand, in a case where the memory cell transistor MCsel connected to the bit line BL is an off cell, the node LAT_E of the latch circuit EDL becomes "1." Since the node LAT_D of the latch circuit DDL is "1," the threshold voltage of the memory cell transistor MCsel connected to the bit line BL is determined as being included in the threshold region A4.

On the other hand, in a case where the result of the VM sensing operation shows that the memory cell transistor MCsel is an on cell, the sense amplifier 39 performs the VL sensing operation as the second execution of the sensing. As illustrated in FIG. 18, at the time point t20, the node INV_D is at the H level ("1"). The node INV_E is at the L level ("0"). As illustrated in FIG. 23, setting the node INV_D to the H level brings the transistors TR11 and 12 to the on-state. That is, the capacitance of the node SEN becomes equal to an equivalent capacitance of the capacitive element C21 and the capacitive element C22. Since the capacitive element C21 and the capacitive element C22 are connected together in parallel, the capacitance of the node SEN is larger than the capacitance of the capacitive element C21 (e.g., twice the capacitance of the capacitive element C21 when the capacitance of the capacitive element C21=the capacitance of the capacitive element C22). As illustrated in FIG. 18, at the time point t20, the control signal SPC is brought to the H level. Thus, as illustrated in FIG. 23, the transistor TR10 is brought to the on-state, and thus the voltage VHLB is applied to the node SEN. That is, as illustrated with an arrow with a solid line in FIG. 23, charging of the node SEN is started.

Next, as illustrated in FIG. 18, at a time point t21, the control signal SPC is brought to the L level. Thus, the charging of the node SEN is finished. At the time point t21, the clock signal CLKSA is brought to the H level. Thus, the capacitive elements C21 and C22 are charged, and the voltage VSEN at the node SEN becomes higher than the voltage VHLB by the effect of capacitive coupling.

Next, at a time point t22, the control signal XXL is brought to the H level, and the control signals BLS and BLC are also brought to the H level. Thus, as illustrated in FIG. 23, the transistors TR9, TR2, and TR1 are brought to the on-state. Therefore, as illustrated with arrows with broken lines in FIG. 23, discharging of electric charges stored in the node SEN to the bit line BL is started.

As illustrated in FIG. 18, in a case where a memory cell transistor MCsel connected to the bit line BL is an on cell, the voltage VSEN at the node SEN decreases relatively rapidly as illustrated with a broken line. On the other hand, in a case where the memory cell transistor MCsel connected to the bit line BL is an off cell, the voltage VSEN at the node SEN decreases relatively slowly as illustrated with a broken line.

Next, at the time point t23, the control signal XXL is brought to the L level, and the control signals BLS and BLC are also brought to the L level. Thus, the discharging to the bit line BL is finished. The duration of discharging, that is, the time during which the control signal XXL is at the H level is set to, for example, the time longer than the duration of discharging in the VM sensing operation. At the time point t23, the clock signal CLKSA is brought to the L level. Thus, in a case where the memory cell transistor MCsel connected to the bit line BL is an on cell, the voltage VSEN at the node SEN becomes VSS as illustrated with a broken line. On the other hand, in a case where the memory cell transistor MCsel connected to the bit line BL is an off cell, the voltage VSEN at the node SEN decreases as illustrated with a broken line.

Next, at the time point t24, the control signal STB is brought to the H level, and the control signal ETI is also brought to the H level. Thus, the transistors TR14 and TR41 are brought to the on-state, and thus transfer of the data at the node SEN to the node INV_E is started. In a case where the memory cell transistor MCsel connected to the bit line BL is an on cell, the transistor TR13 is brought to the off-state. Thus, at the time point t25, the node INV_E becomes "1" as illustrated in a broken line. On the other hand, in a case where the memory cell transistor MCsel connected to the bit line BL is an off cell, the transistor TR13 is brought to the on-state. Thus, at the time point t25, the node INV_E becomes "0" as illustrated in a broken line.

Next, at a time point t26, the control signal STB is brought to the L level, and the control signal ETI is also brought to the L level. Thus, the transfer of the data at the node SEN to the node INV_E is finished. That is, the sense amplifier 39 stores a result of the second execution of the sensing in the latch circuit EDL.

Next, at a time point t27, the voltage VSEN at the node SEN is set to the voltage VSS. At the time point t27, the row decoder module 38 applies the voltage VSS to the word line WLsel. Thus, the voltage at the word line WLsel becomes the voltage VSS. Thus, the VL sensing operation is finished.

FIG. 24 is a diagram for describing a result of performing the VM sensing operation as the first execution of the sensing and performing the VL sensing operation as the second execution of the sensing. As illustrated in FIG. 24, in a case where the memory cell transistor MCsel connected to the bit line BL is an on cell, the node LAT_E of the latch circuit EDL becomes "0." Since the node LAT_D of the latch circuit DDL is "0," the threshold voltage of the memory cell transistor MCsel connected to the bit line BL is determined as being included in the threshold region A1. On the other hand, in a case where the memory cell transistor MCsel connected to the bit line BL is an off cell, the node LAT_E of the latch circuit EDL becomes "1." Since the node LAT_D of the latch circuit DDL is "0," the threshold voltage of the memory cell transistor MCsel connected to the bit line BL is determined as being included in the threshold region A2.

In the verifying operation in the second execution of the program loop, after performing the sensing mentioned above twice is finished, the sensing mentioned above is performed twice in the same manner while the verify voltage V1 is applied to the word line WLsel. Thus, the verifying operation in the second execution of the program loop is finished.

1.3.5 Program Operation

Next, the program operation will be described with a focus on operation of the sense amplifier 39. The following description is about cases where the first to fourth program operations are performed in the (k+1)th execution of the program loop (k is an integer equal to or greater than one).

Fourth Program Operation

In a case of the node INV_D of the latch circuit DDL being at the L level ("0") and the node INV_E of the latch circuit EDL being at the L level ("0") after the verifying operation in the kth execution of the program loop is finished, the fourth program operation is executed in the (k+1)th execution of the program loop. This is equivalent to a case where it is determined that the threshold voltage of the memory cell transistor MCsel is equal to or higher than the voltage level VH as a result of the first execution of the sensing and the second execution of the sensing in the verifying operation in the kth execution of the program loop.

FIG. 25 is a timing chart illustrating an example of voltages at various lines and voltages of various signals in the fourth program operation. FIG. 26 is a diagram for describing the operation of the sense amplifier 39 in the fourth program operation.

As illustrated in FIG. 25, at a time point t31, the voltage at the word line WLsel is set to the voltage VSS. A voltage of the bit line BL ("1") is set to the voltage VSS. The control signals BLS, BLC, and BLX are set to the L level (the voltage VSS). The control signal BLP is set to the H level (the voltage VSS). The sense amplifier 39 stores the value in the latch circuit DDL in the latch circuit FDL. That is, the node INV_F of the latch circuit FDL is set to the value in the node INV_D (the L level ("0")). The sense amplifier 39 also stores the value in the latch circuit DDL in the latch circuit SDL. That is, the node INV_S of the latch circuit SDL is set to the value in the node INV_D (the L level ("0")). Thus, the transistors TR4 and TR8 are brought to the on-state. The transistors TR1 to TR3 and TR5 to TR7 are brought to the off-state.

Next, at a time point t32, the control signal BLS is brought to the H level (a voltage VBLS). The control signal BLC is brought to the H level (a voltage VBLC). The control signal BLX is brought to the H level (a voltage VBLX). The control signal BLP is brought to the L level (a voltage VBLP). Here, VBLX-Vt3<VBLP+Vt6 is established. Vt3 is a threshold voltage of the transistor TR3. Vt6 is a threshold voltage of the transistor TR6. Thus, as illustrated in FIG. 26, the transistors TR1, TR2, and TR6 are brought to the on-state. The transistor TR3 is brought to the off-state. Therefore, the sense amplifier 39 applies the power voltage VCC to the voltage supply line VHSA2, and the voltage Vdd is supplied to the bit line BL ("1") via the transistors TR8, TR6, TR2, and TR1.

Next, as illustrated in FIG. 25, at a time point t33, the row decoder module 38 applies the voltage VPASS to the word line WLsel. The voltage VPASS is a voltage that brings a memory cell transistor MC to the on-state irrespective of the threshold voltage of the memory cell transistor MC. Thus, the voltage at the word line WLsel becomes the voltage VPASS.

Next, at a time point t34, the sense amplifier 39 performs an AND operation between the value in the latch circuit DDL and the value in the latch circuit EDL and stores a result of the AND operation in the latch circuit FDL. That is, the node INV_F of the latch circuit FDL is set to the L level ("0"). The sense amplifier 39 also performs an OR operation between the value in the latch circuit DDL and the value in the latch circuit EDL and stores a result of the OR operation in the latch circuit SDL. That is, the node INV_S of the latch circuit SDL is set to the L level ("0"). Thus, the transistors TR1, TR2, TR4, TR6, and TR8 are maintained at the on-state. The transistors TR3, TR5, and TR7 are maintained at the off-state. Therefore, the application of the power voltage VCC to the bit lines BL ("1") is maintained.

In this manner, the sense amplifier 39 adjusts the voltage applied to the bit line ("1") based on a value in the latch circuit FDL and a value in the latch circuit SDL.

Next, at a time point t35, the row decoder module 38 applies the voltage VPGM to the word line WLsel. While the voltage at the word line WLsel becomes the voltage VPGM, since the power voltage VCC as the high voltage is applied to each bit line BL ("1"), the corresponding select transistors ST1 is turned off to electrically disconnect the channel of the memory cell transistor MCsel from the bit line BL ("1") and to thereby allow the channel of the memory cell transistor MCsel to be boosted. As a result, the threshold voltage of the memory cell transistor MCsel connected to the bit line BL ("1") is prevented from being raised as mentioned above.

Next, at a time point t36, the row decoder module 38 applies the voltage VSS to the word line WLsel. Thus, the voltage at the word line WLsel becomes the voltage VSS. The control signals BLS, BLC, and BLX are set to the L level. The control signal BLP is set to the H level. Thus, the fourth program operation is finished.

First Program Operation

In a case of the node INV_D of the latch circuit DDL being at the H level ("1") and the node INV_E of the latch circuit EDL being at the H level ("1") after the verifying operation in the kth execution of the program loop is finished, the first program operation is executed in the (k+1)th execution of the program loop. This is equivalent to a case where it is determined that the threshold voltage of the memory cell transistor MCsel is lower than the voltage level VL as the result of the first execution of the sensing and the second execution of the sensing in the verifying operation in the kth execution of the program loop.

FIG. 27 is a timing chart illustrating an example of voltages at various lines and voltages of various signals in the first program operation. FIG. 28 is a diagram for describing the operation of the sense amplifier 39 in the first program operation.

As illustrated in FIG. 27, at the time point t31, the voltage at the word line WLsel is set to the voltage VSS. A voltage of the bit line BL ("0") is set to the voltage VSS. The control signals BLS, BLC, and BLX are set to the L level. The control signal BLP is set to the H level. The sense amplifier 39 sets the value in the latch circuit DDL to the latch circuit FDL. That is, the node INV_F of the latch circuit FDL is set to the value in the node INV_D (the H level ("1")). The sense amplifier 39 also sets the value in the latch circuit DDL to the latch circuit SDL. That is, the node INV_S of the latch circuit SDL is set to the value in the node INV_D (the H level ("1")). Thus, the transistors TR5 and TR7 are brought to the on-state. The transistors TR1 to TR4, TR6, and TR8 are brought to the off-state.

Next, at the time point t32, the control signals BLS, BLC, and BLX are brought to the H level. The control signal BLP is brought to the L level. Thus, as illustrated in FIG. 28, the transistors TR1 to TR3 are brought to the on-state. The transistor TR6 is brought to the off-state. Therefore, the sense amplifier 39 applies the voltage VSS to the voltage supply line SRCGND1, and the voltage VSS is supplied to the bit line BL ("0") via the transistors TR5, TR3, TR2, and TR1.

Next, as illustrated in FIG. 27, at the time point t33, the row decoder module 38 applies the voltage VPASS to the word line WLsel.

Next, at the time point t34, the sense amplifier 39 sets a result of the AND operation between the value in the latch circuit DDL and the value in the latch circuit EDL to the latch circuit FDL. That is, the node INV_F of the latch circuit FDL is set to the H level ("1"). The sense amplifier 39 also sets a result of an OR operation between the value in the latch circuit DDL and the value in the latch circuit EDL to the latch circuit SDL. That is, the node INV_S of the latch circuit SDL is set to the H level ("1"). Thus, the transistors TR1 to TR3, TR5, and TR7 are maintained at the on-state. The transistors TR4, TR6, and TR8 are maintained at the off-state. Therefore, the application of the voltage VSS to the bit lines BL ("0") is maintained.

In this manner, the sense amplifier 39 adjusts the voltage applied to the bit line ("0") based on the value in the latch circuit FDL and the value in the latch circuit SDL.

Next, at the time point t35, the row decoder module 38 applies the voltage VPGM to the word line WLsel. Since the voltage VSS as the low voltage is applied to each bit line ("0"), the corresponding select transistor ST1 is turned on to electrically connect the channel of the memory cell transistor MCsel with the bit line ("0"). As a result, in response to increase of the voltage at the word line WLsel to the voltage VPGM, the threshold voltage of the memory cell transistor MCsel is raised. In the first program condition, the bit line ("0") is supplied with the voltage VSS. Since the first program condition is applied, the amount of change in the threshold voltage of the memory cell transistor MC is relatively large.

Next, at the time point t36, the row decoder module 38 applies the voltage VSS to the word line WLsel. The control signals BLS, BLC, and BLX are set to the L level. The control signal BLP is set to the H level. Thus, the first program operation is finished.

Second Program Operation

In a case of the node INV_D of the latch circuit DDL being at the H level ("1") and the node INV_E of the latch circuit EDL being at the L level ("0") after the verifying operation in the kth execution of the program loop is finished, the second program operation is executed in the (k+1)th execution of the program loop. This is equivalent to a case where it is determined that the threshold voltage of the memory cell transistor MCsel is equal to or higher than the voltage level VL and lower than the voltage level VM as the result of the first execution of the sensing and the second execution of the sensing in the verifying operation in the kth execution of the program loop.

Figure 29:
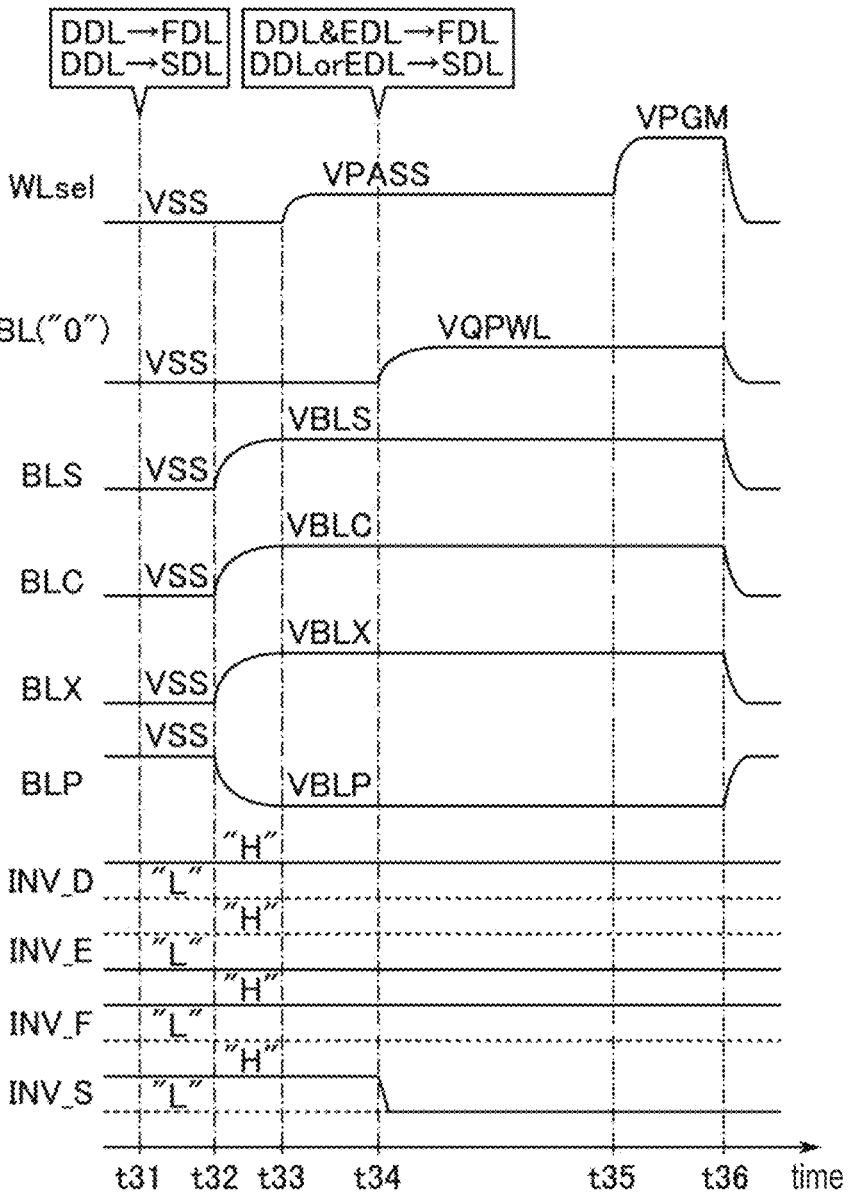
FIG. 29 is a timing chart illustrating an example of voltages at various lines and voltages of various signals in a second program operation by the semiconductor memory device according to the first embodiment.

FIG. 29 is a timing chart illustrating an example of voltages at various lines and voltages of various signals in the second program operation. FIG. 30 is a diagram for describing the operation of the sense amplifier 39 in the second program operation.

As illustrated in FIG. 29, at the time point t31, the voltage at the word line WLsel is set to the voltage VSS. A voltage of the bit line BL ("0") is set to the voltage VSS. The control signals BLS, BLC, and BLX are set to the L level. The control signal BLP is set to the H level. The sense amplifier 39 sets the value in the latch circuit DDL to the latch circuit FDL. That is, the node INV_F of the latch circuit FDL is set to the value in the node INV_D (the H level ("1")). The sense amplifier 39 also sets the value in the latch circuit DDL to the latch circuit SDL. That is, the node INV_S of the latch circuit SDL is set to the value in the node INV_D (the H level ("1")). Thus, as in the first program operation, the transistors TR5 and TR7 are brought to the on-state, and the transistors TR1 to TR4, TR6, and TR8 are brought to the off-state.

Next, at the time point t32, the control signals BLS, BLC, and BLX are brought to the H level. The control signal BLP is brought to the L level. Thus, as in the first program operation, the transistors TR1 to TR3 are brought to the on-state, and the transistor TR6 is brought to the off-state. Therefore, the sense amplifier 39 applies the voltage VSS to the bit line BL ("0") from the voltage supply line SRCGND1.

Next, as illustrated in FIG. 29, at the time point t33, the row decoder module 38 applies the voltage VPASS to the word line WLsel.

Next, at the time point t34, the sense amplifier 39 sets a result of the AND operation between the value in the latch circuit DDL and the value in the latch circuit EDL to the latch circuit FDL. That is, the node INV_F of the latch circuit FDL is set to the H level ("1"). The sense amplifier 39 also sets a result of an OR operation between the value in the latch circuit DDL and the value in the latch circuit EDL to the latch circuit SDL. That is, the node INV_S of the latch circuit SDL is set to the L level ("0"). Thus, the transistor TR4 is brought to the on-state. The transistor TR5 is brought to the off-state. The transistors TR1 to TR3 and TR7 are maintained at the on-state. The transistors TR6 and TR8 are maintained at the off-state. The sense amplifier 39 controls the voltage of the voltage supply line VHSA1 from the voltage VSS to a voltage VQPWL, and the voltage VQPWL is supplied to the bit line BL ("0") from the voltage supply line VHSA1. The voltage VQPWL is a voltage that is higher than the voltage VSS and lower than the power voltage VCC.

In this manner, the sense amplifier 39 adjusts the voltage applied to the bit line ("0") based on the value in the latch circuit FDL and the value in the latch circuit SDL.

Next, at the time point t35, the row decoder module 38 applies the voltage VPGM to the word line WLsel. As a result, the threshold voltage of the memory cell transistor MCsel is raised as mentioned above. In the second program condition, the bit line ("0") is supplied with the voltage VQPWL that is higher than the voltage VSS. Since the second program condition is applied, the amount of change in the threshold voltage of the memory cell transistor MC is smaller than when the first program condition is applied.

Next, at the time point t36, the row decoder module 38 applies the voltage VSS to the word line WLsel. The control signals BLS, BLC, and BLX are set to the L level. The control signal BLP is set to the H level. Thus, the second program operation is finished.

Third Program Operation

In a case of the node INV_D of the latch circuit DDL being at the L level ("0") and the node INV_E of the latch circuit EDL being at the H level ("1") after the verifying operation in the kth execution of the program loop is finished, the third program operation is executed in the (k+1)th execution of the program loop. This is equivalent to a case where it is determined that the threshold voltage of the memory cell transistor MCsel is equal to or higher than the voltage level VM and lower than the voltage level VH as the result of the first execution of the sensing and the second execution of the sensing in the verifying operation in the kth execution of the program loop.

FIG. 31 is a timing chart illustrating an example of voltages at various lines and voltages of various signals in the third program operation. FIG. 32 is a diagram for describing the operation of the sense amplifier 39 in the third program operation.

As illustrated in FIG. 31, at the time point t31, the voltage at the word line WLsel is set to the voltage VSS. A voltage of the bit line BL ("0") is set to the voltage VSS. The control signals BLS, BLC, and BLX are set to the L level. The control signal BLP is set to the H level. The sense amplifier 39 sets the value in the latch circuit DDL to the latch circuit FDL. That is, the node INV_F of the latch circuit FDL is set to the value in the node INV_D (the L level ("0")). The sense amplifier 39 also sets the value in the latch circuit DDL to the latch circuit SDL. That is, the node INV_S of the latch circuit SDL is set to the value in the node INV_D (the L level ("0")). Thus, as in the fourth program operation, the transistors TR4 and TR8 are brought to the on-state, and the transistors TR1 to TR3 and TR5 to TR7 are brought to the off-state.

Next, at the time point t32, the control signals BLS, BLC, and BLX are brought to the H level. The control signal BLP is brought to the L level. Thus, as in the fourth program operation, the transistors TR1, TR2, and TR6 are brought to the on-state, and the transistor TR3 is brought to the off-state. Therefore, the sense amplifier 39 applies the power voltage VCC from the voltage supply line SRCGND2 to the bit line BL ("0").

Next, as illustrated in FIG. 31, at the time point t33, the row decoder module 38 applies the voltage VPASS to the word line WLsel.

Next, at the time point t34, the sense amplifier 39 sets a result of the AND operation between the value in the latch circuit DDL and the value in the latch circuit EDL to the latch circuit FDL. That is, the node INV_F of the latch circuit FDL is set to the H level ("1"). The sense amplifier 39 also sets a result of an OR operation between the value in the latch circuit DDL and the value in the latch circuit EDL to the latch circuit SDL. That is, the node INV_S of the latch circuit SDL is set to the L level ("0"). Thus, the transistor TR7 is brought to the on-state. The transistor TR8 is brought to the off-state. The transistors TR1, TR2, and TR4 are maintained at the on-state. The transistor TR5 is maintained at the off-state. Since VBLX−Vt3<VBLP+Vt6 is established, the transistor TR6 is brought to the on-state, and the transistor TR3 is brought to the off-state. The sense amplifier 39 controls the voltage of the voltage supply line SRCGND2 from the power voltage VCC to a voltage VQPWH, and the voltage VQPWH is supplied to the bit line BL ("0") from the voltage supply line SRCGND2. The voltage VQPWH is a voltage that is higher than the voltage VQPWL and lower than the power voltage VCC.

In this manner, the sense amplifier 39 adjusts the voltage applied to the bit line ("0") based on the value in the latch circuit FDL and the value in the latch circuit SDL.

Next, at the time point t35, the row decoder module 38 applies the voltage VPGM to the word line WLsel. As a result, the threshold voltage of the memory cell transistor MCsel is raised as mentioned above. In the third program condition, the bit lien ("0") is supplied with the voltage VQPWH that is higher than the voltage VQPWL. Since the third program condition is applied, the amount of change in the threshold voltage of the memory cell transistor MC is smaller than when the second program condition is applied.

Next, at the time point t36, the row decoder module 38 applies the voltage VSS to the word line WLsel. The control signals BLS, BLC, and BLX are set to the L level. The control signal BLP is set to the H level. Thus, the third program operation is finished.

Note that in a case where a memory cell transistor MCsel is set as a program target cell in the first execution of the program loop, the sense amplifier 39 sets the H level ("1") to the node INV_D of the latch circuit DDL and sets the H level ("1") to the node INV_E of the latch circuit EDL, and then the first program operation is executed as mentioned above. On the other hand, in a case where the memory cell transistor MCsel is set as a program inhibited cell, the sense amplifier 39 sets the L level ("0") to the node INV_D of the latch circuit DDL and sets the L level ("0") to the node INV_E of the latch circuit EDL, and then the fourth program operation is executed as mentioned above.

1.4 Advantageous Effect According to Present Embodiment

In the present embodiment, in the verifying operation, the sense amplifier 39 performs the VM sensing operation as the first execution of the sensing and performs the VH sensing operation or the VL sensing operation as the second execution of the sensing based on the result of the first execution of the sensing while the verify voltage VH corresponding to a write state is applied to the word line WLsel.

Specifically, the sense amplifier 39 changes the capacitance value of the node SEN based on the result of the VM sensing operation. For example, the sense amplifier 39 sets the capacitance value of the node SEN to the first capacitance value or the second capacitance value, which is greater than the first capacitance value. In a case where the result of the first execution of the sensing shows that the threshold voltage of the memory cell transistor MCsel is equal to or higher than the voltage level VM, the sense amplifier 39 sets the capacitance value of the node SEN to the first capacitance value. In a case where the result of the first execution of the sensing shows that the threshold voltage of the memory cell transistor MCsel is lower than the voltage level VM, the sense amplifier 39 sets the capacitance value of the node SEN to the second capacitance value.

By changing the capacitance of the node SEN, it is possible to make the duration of discharging the node SEN connected to the memory cell transistor MCsel of which the threshold voltage is included in the threshold regions A1 to A2 match the duration of discharging the node SEN connected to the memory cell transistor MCsel of which the threshold voltage is included in the threshold regions A3 to A4. That is, it is possible to make the duration of discharging electric charges in the node SEN in the VH sensing operation the same as the duration of discharging electric charges in the node SEN in the VL sensing operation.

Thus, it is possible to perform, as the second execution of the sensing performed after the VM sensing operation, a sensing (the VH sensing operation or the VL sensing operation) based on the result of the VM sensing operation. That is, it is possible to perform the VH sensing operation and the VL sensing operation simultaneously after the VM sensing operation. Therefore, performing the sensing twice can determine whether the threshold voltage of the memory cell transistor MCsel is included in any one of the four threshold regions A1 to A4. As a result, according to the present embodiment, the number of executions of the sensing can be reduced as compared with a case where the sensing is performed three times using the verify voltages VL, VM, and VL. Therefore, it is possible to prevent a duration of the verifying operation from increasing. In addition, it is possible to prevent the sensing margins from narrowing.

2. Second Embodiment

A NAND flash memory according to a second embodiment will be described. In a NAND flash memory 30A according to the second embodiment, a circuit configuration of a sense amplifier 39A differs from the first embodiment. The following description will be given of differences from the first embodiment.

2.1 Circuit Configuration of Sense Amplifier

With reference to FIG. 33, the circuit configuration of the sense amplifier 39A will be described. FIG. 33 is a circuit diagram illustrating an example of the circuit configuration of the sense amplifier 39A.

As illustrated in FIG. 33, in the sense amplifier 39A, the capacitive elements C21 and C22, the n-channel MOS transistor TR11, and the p-channel MOS transistor TR12 are omitted from the sensing circuit SAC in FIG. 11 described in the first embodiment. In the sense amplifier 39A, capacitive elements C61 and C62, an n-channel MOS transistor TR61 and a p-channel MOS transistor TR62 are added to the sensing circuit SAC.

One electrode of the capacitive element C61 is connected to a node SEN. The other electrode of the capacitive element C61 is connected to a node ND2.

One end of the transistor TR61 is connected to the node ND2. The other end of the transistor TR61 is connected to a node ND3. A gate of the transistor TR61 is connected to a node LAT_D.

One end of the transistor TR62 is connected to the node ND2. To the other end of the transistor TR62, a clock signal CLKSA is input. A gate of the transistor TR62 is connected to the node LAT_D.

One electrode of the capacitive element C62 is connected to the node ND3. To the other electrode of the capacitive element C62, the clock signal CLKSA is input.

The transistors TR61 and TR62 can connect the capacitive element C61 and the capacitive element C62 together in series and function as a circuit that switches the connection/disconnection state of the capacitive element C61 and the capacitive element C62.

2.2 Verifying Operation

A verifying operation will be described with a focus on operation of the sense amplifier 39A. The following description is about a case where a verify voltage V2 is applied to a word line WLsel in a verifying operation in a second execution of a program loop.

A timing chart of the verifying operation in the present embodiment is the same as the timing chart in FIG. 18 described in the first embodiment.

First, while the verify voltage V2 is applied to the word line WLsel, the sense amplifier 39A performs a VM sensing operation as a first execution of the sensing. FIG. 34 is a diagram for describing the operation of the sense amplifier 39A in the VM sensing operation.

As illustrated in FIG. 18, at a time point t11, a voltage at the word line WLsel is set to a voltage VSS. A voltage VSEN at the node SEN is set to the voltage VSS. Control signals SPC, XXL, and STB are set to a L level. The clock signal CLKSA is set to the L level. A node INV_D of a latch circuit DDL is set to the L level ("0"). A node INV_E of a latch circuit EDL is set to the L level ("0"). As illustrated in FIG. 34, setting the node INV_D to the L level brings the transistor TR61 to an on-state. The transistor TR62 is brought to an off-state. That is, a capacitance of the node SEN becomes equal to an equivalent capacitance of the capacitive element C61 and the capacitive element C62. Since the capacitive element C61 and the capacitive element C62 are connected together in series, the capacitance of the node SEN is smaller than a capacitance of the capacitive element C61 (e.g., half the capacitance of the capacitive element C61 when the capacitance of the capacitive element C61=the capacitance of the capacitive element C62).

As illustrated in FIG. 18, at a time point t12, the control signal SPC is brought to a H level. Thus, as illustrated in FIG. 34, a transistor TR10 is brought to the on-state, and thus a voltage VHLB is applied to the node SEN. That is, as illustrated with an arrow with a solid line in FIG. 34, charging of the node SEN is performed.

As illustrated in FIG. 18, at a time point t14, the control signal XXL is brought to the H level, and control signals BLS and BLC are also brought to the H level. Thus, as illustrated in FIG. 34, transistors TR9, TR2, and TR1 are brought to the on-state. Therefore, as illustrated with an arrow with a broken line in FIG. 34, discharging of electric charges stored in the node SEN to a bit line BL is performed.

After the VM sensing operation is finished, while the verify voltage V2 is applied to the word line WLsel, and after the result of the first execution of the sensing is stored in the latch circuit DDL, the sense amplifier 39A performs a VH sensing operation or a VL sensing operation as a second execution of the sensing. FIG. 35 is a diagram for describing the operation of the sense amplifier 39A in the VH sensing operation. FIG. 36 is a diagram for describing the operation of the sense amplifier 39A in the VL sensing operation.

In a case where a result of the VM sensing operation shows that a memory cell transistor MCsel is an off cell, the sense amplifier 39A performs the VH sensing operation as the second execution of the sensing. As illustrated in FIG. 18, at a time point t20, the node INV_D is at the L level ("0"). The node INV_E is at the L level ("0"). As illustrated in FIG. 35, setting the node INV_D to the L level brings the transistor TR61 to the on-state. The transistor TR62 is brought to an off-state. That is, the capacitance of the node SEN becomes equal to an equivalent capacitance of the capacitive element C61 and the capacitive element C62. As illustrated in FIG. 18, at the time point t20, the control signal SPC is brought to the H level. Thus, as illustrated in FIG. 35, the transistor TR10 is brought to the on-state, and thus the voltage VHLB is applied to the node SEN. That is, as illustrated with an arrow with a solid line in FIG. 35, charging of the node SEN is performed.

As illustrated in FIG. 18, at a time point t22, the control signal XXL is brought to the H level, and the control signals BLS and BLC are also brought to the H level. Thus, as illustrated in FIG. 35, transistors TR9, TR2, and TR1 are brought to the on-state. Therefore, as illustrated with an arrow with a broken line in FIG. 35, discharging of electric charges stored in the node SEN to the bit line BL is performed.

On the other hand, in a case where the result of the VM sensing operation shows that the memory cell transistor MCsel is an on cell, the sense amplifier 39A performs the VL sensing operation as the second execution of the sensing. As illustrated in FIG. 18, at the time point t20, the node INV_D is at the H level ("1"). The node INV_E is at the L level ("0"). As illustrated in FIG. 36, setting the node INV_D to the H level brings the transistor TR61 to the off-state. The transistor TR62 is brought to the on-state. That is, the capacitance of the node SEN becomes equal to the capacitance of the capacitive element C61. As illustrated in FIG. 18, at the time point t20, the control signal SPC is brought to the H level. Thus, as illustrated in FIG. 36, the transistor TR10 is brought to the on-state, and thus the voltage VHLB is applied to the node SEN. That is, as illustrated with an arrow with a solid line in FIG. 36, charging of the node SEN is performed.

As illustrated in FIG. 18, at the time point t22, the control signal XXL is brought to the H level, and the control signals BLS and BLC are also brought to the H level. Thus, as illustrated in FIG. 36, the transistors TR9, TR2, and TR1 are brought to the on-state. Therefore, as illustrated with an arrow with a broken line in FIG. 36, discharging of electric charges stored in the node SEN to the bit line BL is performed.

2.3 Advantageous Effect According to Present Embodiment

The second embodiment provides the same advantageous effects as the first embodiment.

3. Third Embodiment

A NAND flash memory according to a third embodiment will be described. In a NAND flash memory 30B according to the third embodiment, a circuit configuration of a sense amplifier 39B differs from the first embodiment. The following description will be given of differences from the first embodiment.

3.1 Circuit Configuration of Sense Amplifier

Figure 37:
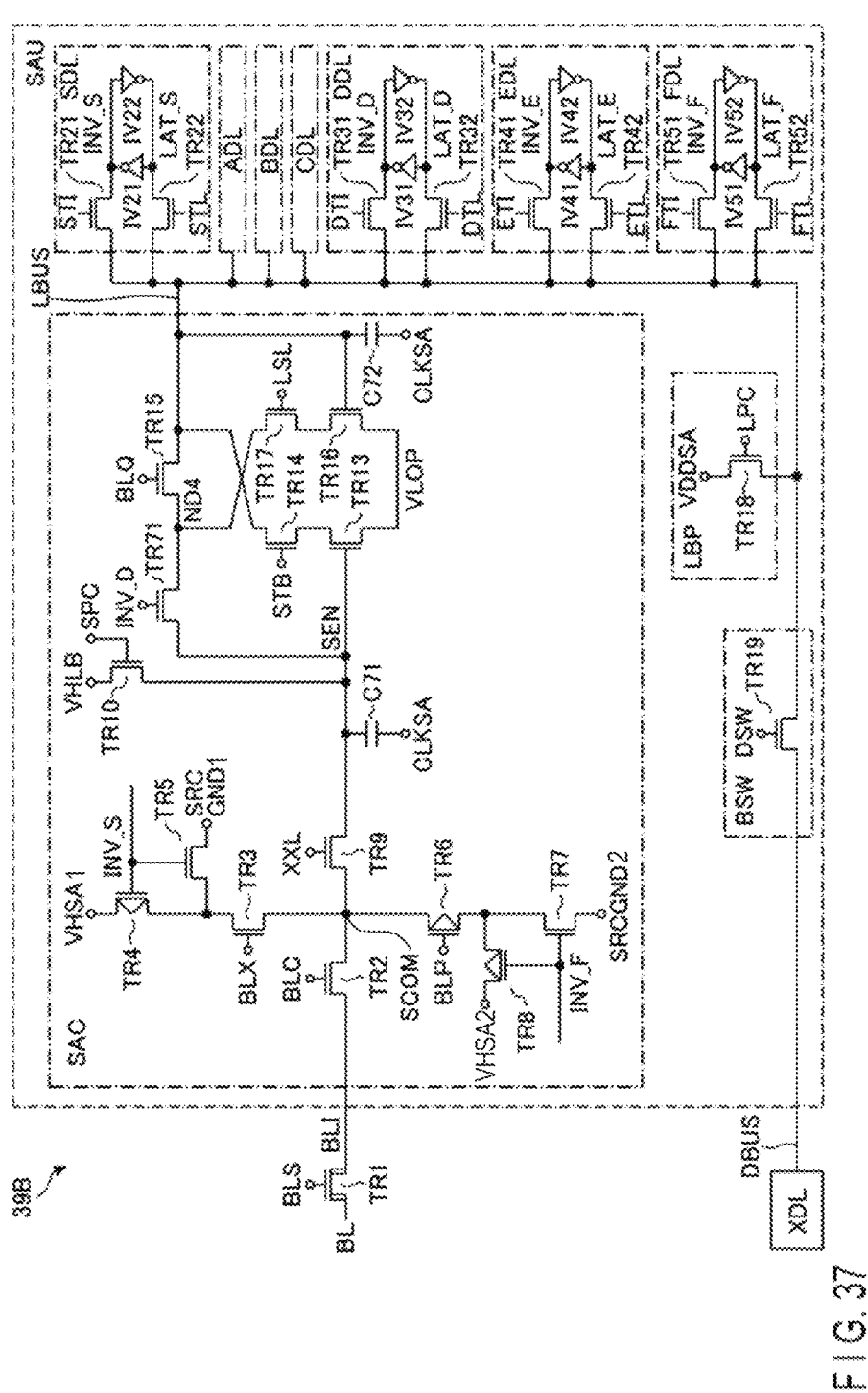
FIG. 37 is a circuit diagram illustrating an example of a circuit configuration of a sense amplifier included in a semiconductor memory device according to a third embodiment.

With reference to FIG. 37, the circuit configuration of the sense amplifier 39B will be described. FIG. 37 is a circuit diagram illustrating an example of the circuit configuration of the sense amplifier 39B.

As illustrated in FIG. 37, in the sense amplifier 39B, the capacitive elements C21 and C22, the n-channel MOS transistor TR11, and the p-channel MOS transistor TR12 are omitted from the sensing circuit SAC in FIG. 11 described in the first embodiment. In the sense amplifier 39B, capacitive elements C71 and C72 and an n-channel MOS transistor TR71 are added to the sensing circuit SAC.

One electrode of the capacitive element C71 is connected to a node SEN. To the other electrode of the capacitive element C71, a clock signal CLKSA is input.

One end of the transistor TR71 is connected to the node SEN. The other end of the transistor TR71 is connected to a node ND4. A gate of the transistor TR71 is connected to a node INV_D.

The capacitive element C72 is, for example, a parasitic capacitance of a bus LBUS. One electrode of the capacitive element C72 is connected to the bus LBUS. To the other electrode of the capacitive element C72, the clock signal CLKSA is input.

The transistor TR71 and a transistor TR15 can connect the capacitive element C71 and the capacitive element C72 together in parallel and function as a circuit that switches the connection/disconnection state of the capacitive element C71 and the capacitive element C72.

3.2 Verifying Operation

A verifying operation will be described with a focus on operation of the sense amplifier 39B. The following description is about a case where a verify voltage V2 is applied to a word line WLsel in the verifying operation in a second execution of a program loop.

FIG. 38 is a timing chart illustrating an example of voltages at various lines and voltages of various signals in the verifying operation.

First, while the verify voltage V2 is applied to the word line WLsel, the sense amplifier 39B performs a VM sensing operation as a first execution of the sensing. FIG. 39 is a diagram for describing the operation of the sense amplifier 39B in the VM sensing operation.

As illustrated in FIG. 38, at a time point t11, a voltage at the word line WLsel is set to a voltage VSS. A voltage VSEN at the node SEN is set to the voltage VSS. Control signals SPC, XXL, STB, LPC, and BLQ are set to a L level. The clock signal CLKSA is set to the L level. The node INV_D of the latch circuit DDL is set to the L level ("0"). A node INV_E of a latch circuit EDL is set to the L level ("0"). As illustrated in FIG. 39, setting the node INV_D to the L level brings the transistor TR71 to an off-state. That is, a capacitance of the node SEN becomes equal to a capacitance of the capacitive element C71.

As illustrated in FIG. 38, at a time point t12, the control signal SPC is brought to a H level. Thus, as illustrated in FIG. 39, a transistor TR10 is brought to an on-state, and thus a voltage VHLB is applied to the node SEN. That is, as illustrated with an arrow with a solid line in FIG. 39, charging of the node SEN is performed.

As illustrated in FIG. 38, at a time point t14, the control signal XXL is brought to the H level, and control signals BLS and BLC are also brought to the H level. Thus, as illustrated in FIG. 39, transistors TR9, TR2, and TR1 are brought to the on-state. Therefore, as illustrated with an arrow with a broken line in FIG. 39, discharging of electric charges stored in the node SEN to a bit line BL is performed.

After the VM sensing operation is finished, while the verify voltage V2 is applied to the word line WLsel, and after the result of the first execution of the sensing is stored in the latch circuit DDL, the sense amplifier 39B performs a VH sensing operation or a VL sensing operation as a second execution of the sensing. FIG. 40 is a diagram for describing the operation of the sense amplifier 39B in the VH sensing operation. FIG. 41 is a diagram for describing the operation of the sense amplifier 39B in the VL sensing operation.

In a case where a result of the VM sensing operation shows that a memory cell transistor MCsel is an off cell, the sense amplifier 39B performs the VH sensing operation as the second execution of the sensing. As illustrated in FIG. 38, at a time point t19*a*, the node INV_D is at the L level ("0"). The node INV_E is at the L level ("0"). As illustrated in FIG. 40, setting the node INV_D to the L level brings the transistor TR71 to an off-state. That is, the capacitance of the node SEN becomes equal to the capacitance of the capacitive element C71. As illustrated in FIG. 38, at the time point t19*a*, the control signal LPC is brought to the L level. At a time point t20, the control signal SPC is brought to the H level. Thus, as illustrated in FIG. 40, the transistor TR10 is brought to the on-state, and thus the voltage VHLB is applied to the node SEN. That is, as illustrated with an arrow with a solid line in FIG. 40, charging of the node SEN is performed.

As illustrated in FIG. 38, at a time point t22, the control signal XXL is brought to the H level, the control signals BLS and BLC are also brought to the H level, and the control signal BLQ is brought to the L level. Thus, as illustrated in FIG. 40, the transistors TR9, TR2, and TR1 are brought to the on-state. Therefore, as illustrated with an arrow with a broken line in FIG. 40, discharging of electric charges stored in the node SEN to the bit line BL is performed.

On the other hand, in a case where the result of the VM sensing operation shows that the memory cell transistor MCsel is an on cell, the sense amplifier 39B performs the VL sensing operation as the second execution of the sensing. As illustrated in FIG. 38, at the time point t19*a*, the node INV_D is at the H level ("1"). The node INV_E is at the L level ("0"). As illustrated in FIG. 41, setting the node INV_D to the H level brings the transistor TR71 to the on-state. As illustrated in FIG. 38, at the time point t19*a*, the control signal LPC is brought to the H level. Thus, as illustrated in FIG. 41, a transistor TR18 is brought to the on-state, and thus a voltage VDDSA is applied to the bus LBUS. That is, as illustrated with an arrow with a solid line in FIG. 41, charging of the bus LBUS is started.

As illustrated in FIG. 38, at a time point t19*b*, the control signal LPC is brought to the L level. Thus, the charging of the bus LBUS is finished.

At the time point t20, the control signal SPC is brought to the H level. Thus, as illustrated in FIG. 41, the transistor TR10 is brought to the on-state, and thus the voltage VHLB is applied to the node SEN. That is, as illustrated with an arrow with a solid line in FIG. 41, charging of the node SEN is performed.

As illustrated in FIG. 38, at the time point t22, the control signals XXL and BLQ are brought to the H level, and the control signals BLS and BLC are also brought to the H level. Thus, as illustrated in FIG. 41, the transistors TR15, TR9, TR2, and TR1 are brought to the on-state. At this time, the capacitance of the node SEN becomes equal to an equivalent capacitance of the capacitive element C71 and the capacitive element C72. Since the capacitive element C71 and the capacitive element C72 are connected together in parallel, the capacitance of the node SEN is larger than the capacitance of the capacitive element C71 (e.g., twice the capacitance of the capacitive element C71 when the capacitance of the capacitive element C71=the capacitance of the capacitive element C72). Therefore, as illustrated with an arrow with a broken line in FIG. 41, discharging of electric charges stored in the node SEN and the bus LBUS to the bit line BL is started.

As illustrated in FIG. 38, at a time point t23, the control signals XXL and BLQ are brought to the L level, and the control signals BLS and BLC are also brought to the L level. Thus, the discharging to the bit line BL is finished.

Operation of the sense amplifier 39 other than the operation mentioned above is the same as in the timing chart in FIG. 18 described in the first embodiment.

3.3 Advantageous Effect According to Present Embodiment

The third embodiment provides the same advantageous effects as the first embodiment. In addition, in the present embodiment, the parasitic capacitance of the bus LBUS (the capacitive element C72) is used as a capacitive element for the VL sensing operation. As a result, according to the present embodiment, there is no need to add a new capacitive element in the sensing circuit SAC as a capacitive element for the sensing operation, and thus the number of components can be reduced.

3.4. Modification

A NAND flash memory according to a modification of the third embodiment will be described. In a NAND flash memory 30C according to the modification of the third embodiment, a circuit configuration of a sense amplifier 39C differs from the third embodiment. The following description will be given of differences from the third embodiment.

3.4.1 Circuit Configuration of Sense Amplifier

With reference to FIG. 42, the circuit configuration of the sense amplifier 39C will be described. FIG. 42 is a circuit diagram illustrating an example of the circuit configuration of the sense amplifier 39C.

As illustrated in FIG. 42, in the sense amplifier 39C, an n-channel MOS transistor TR72 is added to the sensing circuit SAC in FIG. 37 described in the third embodiment.

One end of the transistor TR72 is connected to the node SEN. The other end of the transistor TR72 is connected to the node ND4. To a gate of the transistor TR72, a control signal/QPW is input. The control signal/QPW is generated by, for example, the sequencer 35. The transistor TR72 is brought to the off-state in the writing operation in which the sensing mentioned above is performed twice in the verifying operation, and the transistor TR72 is brought to the on-state in the other operations. That is, when one of the transistor TR71 and the transistor TR72 is brought to the on-state, the other is brought to the off-state.

3.4.2 Advantageous Effect According to Present Modification

The present modification provides the same advantageous effects as the third embodiment. In the present modification, the transistor TR72 is provided in the sensing circuit SAC for the operations other than the writing operation in which the sensing mentioned above is performed twice in the verifying operation. As a result, according to the present modification, it is possible to choose between the writing operation in which the sensing mentioned above is performed twice in the verifying operation and the other operations.

4. Modification, Etc

As described above, the semiconductor memory device (30) according to the embodiment includes the memory cells that store data, the word lines (WLsel) that are connected to the memory cells, the bit lines that are connectable to the memory cells, and the sense amplifier (39) that includes first nodes (SEN), is connectable to the bit lines, and senses a first voltage (VSEN) at each first node when electric charges stored in the first node is discharged to the bit line. A writing operation on the memory cell includes the program operation and the verifying operation. In the verifying operation, the sense amplifier (39) executes, as the first execution of the sensing, a first sensing operation at a first voltage level (VM) and executes, based on the result of the first execution of the sensing, as the second execution of the sensing, a second sensing operation at a second voltage level (VH), which is higher in voltage than the first voltage level, or a third sensing operation at a third voltage level (VL), which is lower in voltage than the first voltage level, while the verify voltage (VH) is applied to the word line (WLsel).

Note that the embodiments are not limited to the embodiments described above and can be subjected to various modifications.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
a first memory cell;
a second memory cell;
a word line that is connected to the first memory cell and the second memory cell;
a first bit line that is connected to the first memory cell;
a second bit line that is connected to the second memory cell;
a first sense amplifier that includes a first node and that is connectable to the first bit line; and
a second sense amplifier that includes a second node and that is connectable to the second bit line, wherein
the semiconductor memory device is configured to execute a writing operation on the first memory cell and the second memory cell, the writing operation including a program operation and a verifying operation,
in a first period of the verifying operation,
the first sense amplifier executes a first sensing operation for determining whether a threshold voltage of the first memory cell is equal to or higher than a first voltage level, and
the second sense amplifier executes a second sensing operation for determining whether a threshold voltage of the second memory cell is equal to or higher than the first voltage level, and
in a second period of the verifying operation following the first period, the first and second sense amplifiers concurrently execute third and fourth sensing operations, respectively,
the third sensing operation being executed to determine whether the threshold voltage of the first memory cell is equal to or higher than a second voltage level that is higher than the first voltage level, and
the fourth sensing operation being executed to determine whether the threshold voltage of the second memory cell is equal to or higher than a third voltage level that is lower than the first voltage level.

2. The semiconductor memory device of claim 1, wherein
the first sense amplifier executes the third sensing operation in response to determining, by the first sensing operation, that the threshold voltage of the first memory cell is equal to or higher than the first voltage level, and
the second sense amplifier executes the fourth sensing operation in response to determining, by the second sensing operation, that the threshold voltage of the second memory cell is lower than the first voltage level.

3. The semiconductor memory device of claim 1, wherein a duration of discharging electric charges in the first node during the third sensing operation is identical to a duration of discharging electric charges in the second node during the fourth sensing operation.

4. The semiconductor memory device of claim 3, wherein
in the first sensing operation and the third sensing operation, the first sense amplifier charges the first node to a first capacitance value,
in the second sensing operation, the second sense amplifier charges the second node to the first capacitance value, and
in the fourth sensing operation, the second sense amplifier charges the second node to a second capacitance value that is larger than the first capacitance value.

5. The semiconductor memory device of claim 4, wherein
in response to determining that the threshold voltage of the first memory cell is equal to or higher than the first voltage level, the first sense amplifier charges the first node in the third sensing operation to the first capacitance value, and
in response to determining that the threshold voltage of the second memory cell is lower than the first voltage level, the second sense amplifier charges the second node in the fourth sensing operation to the second capacitance value.

6. The semiconductor memory device of claim 1, wherein
in the program operation subsequent to the verifying operation,
in response to determining that the threshold voltage of the first memory cell is lower than the third voltage level, the first sense amplifier applies a second voltage to the first bit line,
in response to determining that the threshold voltage of the first memory cell is equal to or higher than the third voltage level and lower than the first voltage level, the first sense amplifier applies a third voltage that is higher than the second voltage to the first bit line,
in response to determining that the threshold voltage of the second memory cell is equal to or higher than the first voltage level and lower than the second voltage level, the second sense amplifier applies a fourth voltage that is higher than the third voltage to the second bit line, and
in response to determining that the threshold voltage of the second memory cell is equal to or higher than the second voltage level, the second sense amplifier applies a fifth voltage that is higher than the fourth voltage to the second bit line.

7. A method of performing a write operation in a semiconductor memory device that includes:
a memory cell;

a bit line that is connected to the memory cell; and a sense amplifier including a sense node that is connectable to the bit line and a latch circuit, wherein the writing operation includes a program operation and a verifying operation and said method comprises:

in a first period of the verifying operation performed after executing a program operation on the memory cell, executing a first sensing operation by the sense amplifier to determine whether a threshold voltage of the memory cell is equal to or higher than a first voltage level, and storing a result of the first sensing operation in the latch circuit; and in a second period of the verifying operation following the first period, executing by the sense amplifier a second sensing operation to determine whether the threshold voltage of the memory cell is equal to or higher than a second voltage level that is higher than the first voltage level or a third sensing operation for determining whether the threshold voltage of the memory cell is equal to or higher than a third voltage level that is lower than the first voltage level, wherein the sense amplifier executes the second sensing operation when the result of the first sensing operation stored in the latch circuit indicates that the threshold voltage of the memory cell is equal to or higher than the first voltage level, and the sense amplifier executes the third sensing operation when the result of the first sensing operation stored in the latch circuit indicates that the threshold voltage of the memory cell is lower than the first voltage level.

8. The method of claim 7, wherein the sense amplifier further includes a first capacitive element that is connected to the sense node and a second capacitive element, and said method further comprises connecting the second capacitive element to the sense node based on the result of the first sensing operation stored in the latch circuit.

9. The method of claim 8, wherein the second capacitive element is not connected to the sense node during the first and second sensing operations and is connected to the sense node during the third sensing operation.

10. The method of claim 8, wherein after connecting the second capacitive element to the sense node, the first capacitive element and the second capacitive element are connected to the sense node in parallel.

11. The method of claim 8, wherein after connecting the second capacitive element to the sense node, the first capacitive element and the second capacitive element are connected to the sense node in series.

* * * * *